(12) United States Patent
Roberts, Jr.

(10) Patent No.: US 9,551,740 B2
(45) Date of Patent: Jan. 24, 2017

(54) PARALLEL CONCURRENT TEST SYSTEM AND METHOD

(75) Inventor: Howard H. Roberts, Jr., Austin, TX (US)

(73) Assignee: CELERINT, LLC., New York, NY (US)

(*) Notice: Subject to any disclaimer, the term of this patent is extended or adjusted under 35 U.S.C. 154(b) by 346 days.

(21) Appl. No.: 14/117,730

(22) PCT Filed: May 18, 2012

(86) PCT No.: PCT/US2012/038514
§ 371 (c)(1),
(2), (4) Date: Nov. 14, 2013

(87) PCT Pub. No.: WO2012/159003
PCT Pub. Date: Nov. 22, 2012

(65) Prior Publication Data
US 2014/0218063 A1    Aug. 7, 2014

Related U.S. Application Data

(60) Provisional application No. 61/487,993, filed on May 19, 2011.

(51) Int. Cl.
*G01R 31/00* (2006.01)
*G01R 31/26* (2014.01)
*G01R 31/28* (2006.01)

(52) U.S. Cl.
CPC ....... *G01R 31/2601* (2013.01); *G01R 31/2893* (2013.01); *G01R 31/2834* (2013.01); *G01R 31/2865* (2013.01)

(58) Field of Classification Search
CPC . G01R 31/2893; G01R 31/2889; G01R 31/01; G01R 31/2834; G01R 31/2886; G01R 31/31905; G01R 31/2865; G01R 31/2868; G01R 31/2887; G01R 31/2601; G01R 31/28347; H01L 22/20; H05K 1/0268; G06F 11/2733
(Continued)

(56) References Cited

U.S. PATENT DOCUMENTS

| | | | | |
|---|---|---|---|---|
| 5,705,932 A | * | 1/1998 | Fredrickson | G01R 1/07307 324/754.08 |
| 6,118,286 A | * | 9/2000 | Fredrickson | G01R 1/07307 324/756.02 |

(Continued)

FOREIGN PATENT DOCUMENTS

| | | |
|---|---|---|
| CN | 101025432 | 8/2007 |
| CN | 101303391 | 11/2008 |

(Continued)

OTHER PUBLICATIONS

Kolitz, Kathleen, Oct. 24, 2001, Improving Test Efficiency with Concurrent Test, EE Times.*

(Continued)

*Primary Examiner* — Tung X Nguyen
*Assistant Examiner* — Sean Curtis
(74) *Attorney, Agent, or Firm* — Greenblum & Bernstein, P.L.C.

(57) ABSTRACT

A parallel concurrent test (PCT) system is provided for performing the parallel concurrent testing of semiconductor devices. The PCT system includes a pick and place (PnP) handler for engaging and transporting the semiconductor devices along a testing plane, the PnP handler including at least one manipulator. The PCT system also includes a device under test interface board (DIB), the DIB including a broadside test socket for broadside (BS) testing of the semiconductor devices, the broadside testing using at least half of a total number of a semiconductor device pins, and a plurality of design-for-test (DFT) test sockets for DFT (Continued)

testing, the DFT testing using less than half of the total number of the semiconductor device pins, and a tester in electrical contact with the DIB for testing the semiconductor devices in accordance with a stepping pattern test protocol.

20 Claims, 49 Drawing Sheets

(58) Field of Classification Search
USPC ............... 324/750.13, 750.16, 759.03, 324/756.01–756.07, 757.01–757.05, 324/762.01–762.09; 414/222.01, 749.1; 438/14; 702/117, 121
See application file for complete search history.

(56) References Cited

U.S. PATENT DOCUMENTS

| | | | |
|---|---|---|---|
| 6,184,675 B1* | 2/2001 | Bannai | G01R 31/01 324/750.03 |
| 6,225,798 B1* | 5/2001 | Onishi | G01R 31/2834 209/537 |
| 6,429,029 B1* | 8/2002 | Eldridge | G01R 31/2884 257/E23.021 |
| 6,734,688 B1* | 5/2004 | Castellano | G01R 1/0408 324/756.03 |
| 6,988,232 B2* | 1/2006 | Ricchetti | G11C 29/56 714/736 |
| 6,996,757 B2* | 2/2006 | Evans | G01R 31/3171 714/704 |
| 7,039,545 B2* | 5/2006 | Bundy | G01R 31/31919 702/119 |
| 7,174,490 B2* | 2/2007 | Evans | G01R 31/31903 324/756.07 |
| 7,183,785 B2* | 2/2007 | Roberts | G01R 1/0466 324/756.02 |
| 7,275,188 B1* | 9/2007 | Sobaiti | G11C 29/06 714/42 |
| 7,278,079 B2* | 10/2007 | Evans | G01R 31/31926 324/754.09 |
| 7,363,557 B2* | 4/2008 | Evans | G01R 31/31903 324/756.01 |
| 7,420,385 B2* | 9/2008 | Hubscher | G01R 31/2886 324/750.14 |
| 7,428,679 B2* | 9/2008 | Evans | G01R 31/3171 714/733 |
| 7,502,326 B2* | 3/2009 | Evans | G01R 31/31903 324/537 |
| 7,508,191 B2* | 3/2009 | Roberts | G01R 1/0466 324/756.04 |
| 7,528,622 B2* | 5/2009 | Balog | G01R 31/3172 324/762.02 |
| 7,535,244 B2* | 5/2009 | Kim | G01R 31/2889 324/762.01 |
| 7,552,370 B2* | 6/2009 | Pochowski | G06F 11/263 324/750.01 |
| 7,557,596 B2* | 7/2009 | Eldridge | G01R 1/07307 324/750.3 |
| 7,619,432 B2* | 11/2009 | Roberts | G01R 31/2893 324/750.3 |
| 7,712,000 B2* | 5/2010 | Khoche | G01R 31/319 714/725 |
| 7,823,128 B2* | 10/2010 | Bundy | G06F 11/263 717/124 |
| 7,872,469 B2* | 1/2011 | Lui | G01R 31/2889 324/750.3 |
| 7,888,928 B2* | 2/2011 | Shiozawa | G01R 31/2893 324/756.02 |
| 8,255,183 B1* | 8/2012 | Husted | H04B 17/0085 702/117 |
| 8,400,180 B2* | 3/2013 | Roberts | G01R 31/2893 324/756.02 |
| 8,762,095 B2* | 6/2014 | Van Wagenen | G01R 31/31907 438/5 |
| 2003/0009715 A1* | 1/2003 | Ricchetti | G11C 29/56 714/727 |
| 2003/0141877 A1 | 7/2003 | Williams et al. | |
| 2003/0193897 A1* | 10/2003 | Evans | G01R 31/31903 370/250 |
| 2003/0196139 A1* | 10/2003 | Evans | G01R 31/31903 714/25 |
| 2003/0196151 A1* | 10/2003 | Evans | G01R 31/31903 714/724 |
| 2003/0196153 A1* | 10/2003 | Evans | G01R 31/31926 714/742 |
| 2003/0208713 A1* | 11/2003 | Evans | G01R 31/3171 714/742 |
| 2005/0156165 A1* | 7/2005 | Eldridge | G01R 1/07307 257/48 |
| 2005/0168233 A1* | 8/2005 | Roberts | G01R 1/0466 324/756.02 |
| 2006/0020867 A1* | 1/2006 | Evans | G01R 31/3171 714/742 |
| 2006/0085715 A1* | 4/2006 | Kim | G01R 31/31723 714/742 |
| 2006/0107160 A1* | 5/2006 | Ricchetti | G11C 29/56 714/742 |
| 2007/0126440 A1* | 6/2007 | Hobbs | G01R 31/2893 324/754.03 |
| 2007/0126448 A1* | 6/2007 | Hubscher | G01R 31/2886 324/756.01 |
| 2007/0132477 A1* | 6/2007 | Balog | G01R 31/2894 324/762.01 |
| 2007/0245199 A1* | 10/2007 | Pochowski | G06F 11/263 714/742 |
| 2008/0042667 A1* | 2/2008 | Yamashita | G01R 31/31718 324/750.03 |
| 2008/0104461 A1* | 5/2008 | Khoche | G01R 31/319 714/724 |
| 2008/0278186 A1* | 11/2008 | Jung | G01R 31/01 324/756.02 |
| 2009/0201040 A1* | 8/2009 | Shiozawa | G01R 31/2893 324/756.01 |
| 2011/0006794 A1* | 1/2011 | Sellathamby | G01R 31/3025 324/754.03 |
| 2011/0204914 A1* | 8/2011 | Roberts | G01R 31/2889 324/756.02 |
| 2012/0033208 A1* | 2/2012 | Hara | G02B 6/4292 356/244 |
| 2012/0074976 A1* | 3/2012 | Durbin | G01R 1/07378 324/754.11 |
| 2012/0146678 A1* | 6/2012 | Lanowitz | H01L 21/67333 324/756.02 |
| 2012/0286818 A1* | 11/2012 | Bhatt | G01R 31/2884 324/756.02 |
| 2014/0145743 A1* | 5/2014 | Kanev | G01R 31/2868 324/757.01 |
| 2014/0218063 A1* | 8/2014 | Roberts, Jr. | G01R 31/2893 324/756.02 |

FOREIGN PATENT DOCUMENTS

| | | | | |
|---|---|---|---|---|
| CN | 101509953 | | 8/2009 | |
| CN | 201327500 | | 10/2009 | |
| KR | CN 101303391 A | * | 11/2008 | ............. G01R 31/01 |

OTHER PUBLICATIONS

International Search Report and Written Opinion of the International Searching Authority, mailed Jul. 23, 2012, in the corresponding International Application No. PCT/US2012/038514.
Written Opinion, mailed Jun. 26, 2015, by the Intellectual Property Office of Singapore for the corresponding Singapore Patent Application No. 20133076757.

(56) References Cited

OTHER PUBLICATIONS

Office Action, mailed Apr. 17, 2015, by the State Intellectual Property Office of China for the corresponding Chinese Patent Application No. 201280024249.5.

\* cited by examiner

FIG. 2A

SEMICONDUCTOR DEVICE 1

| TEST 1 | TEST 2 | TEST 4 |
|---|---|---|
|  | TEST 3 | TEST 5 |

· · ·

| TEST N-3 | TEST N-1 | TEST N |
|---|---|---|
|  | TEST N-2 |  |

FIG. 2B

SEMICONDUCTOR DEVICE 1

| TEST 1 | TEST 2 | TEST 4 |
|---|---|---|
|  | TEST 3 | TEST 5 |

· · ·

| TEST N-3 | TEST N-1 | TEST N |
|---|---|---|
|  | TEST N-2 |  |

SEMICONDUCTOR DEVICE 2

| TEST 1 | TEST 2 | TEST 4 |
|---|---|---|
|  | TEST 3 | TEST 5 |

· · ·

| TEST N-3 | TEST N-1 | TEST N |
|---|---|---|
|  | TEST N-2 |  |

SEMICONDUCTOR DEVICE 1

SEMICONDUCTOR DEVICE 2

SEMICONDUCTOR DEVICE 1 (BS)

SEMICONDUCTOR DEVICE 2 (BS)

SEMICONDUCTOR DEVICE 1 (DFT)

SEMICONDUCTOR DEVICE 2 (DFT)

STANDARD TEST

CONCURRENT TEST

STANDARD TEST

CONCURRENT TEST

STANDARD TEST

CONCURRENT TEST

PCT (DM Handler with two manipulators)

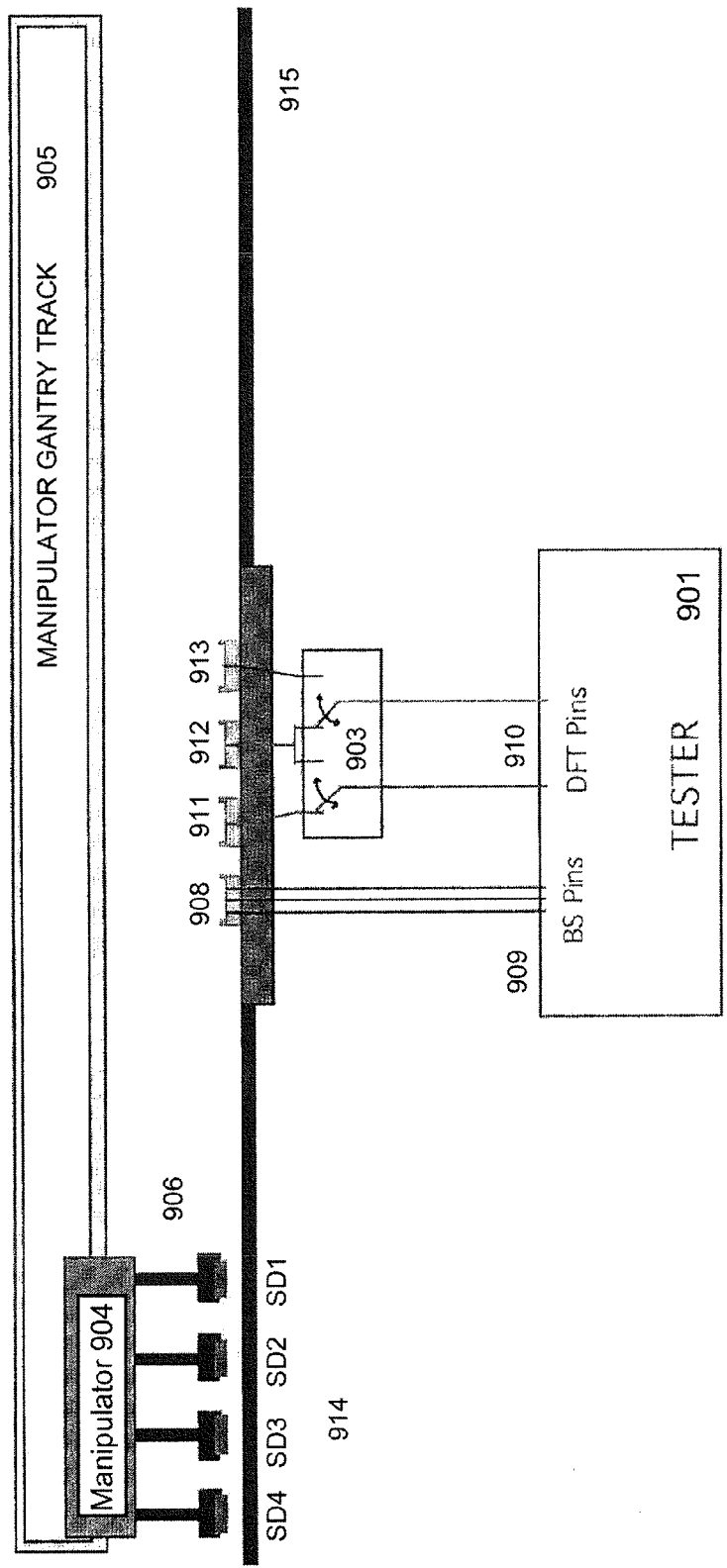

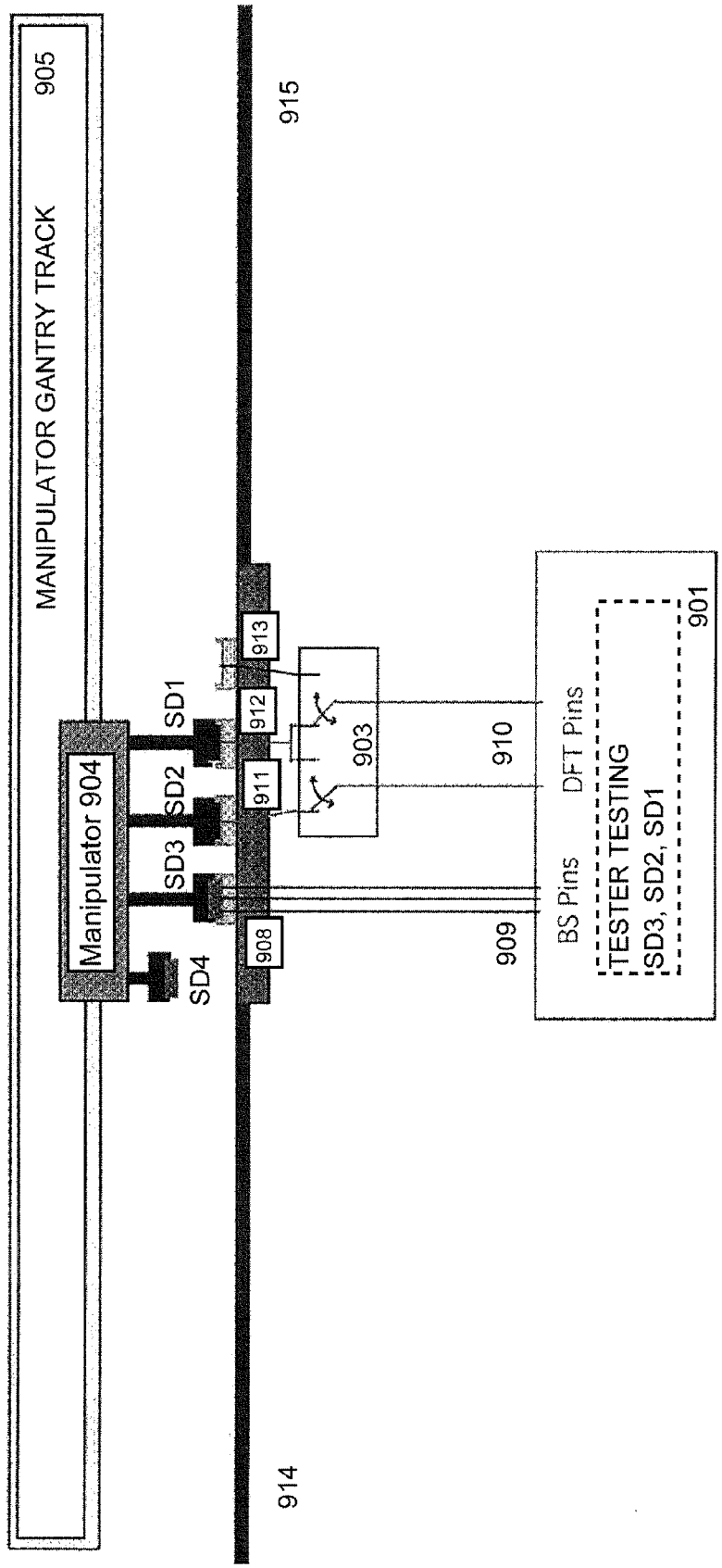

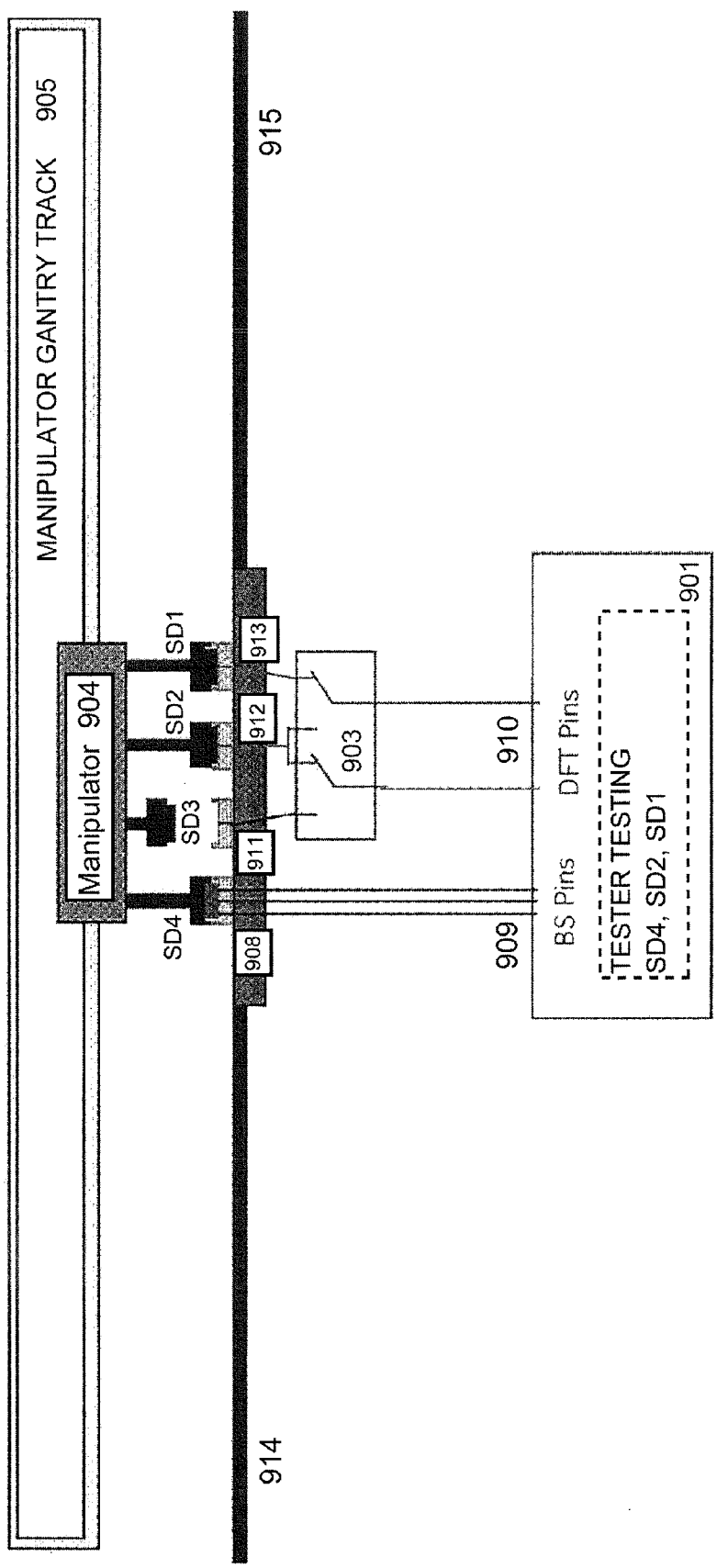

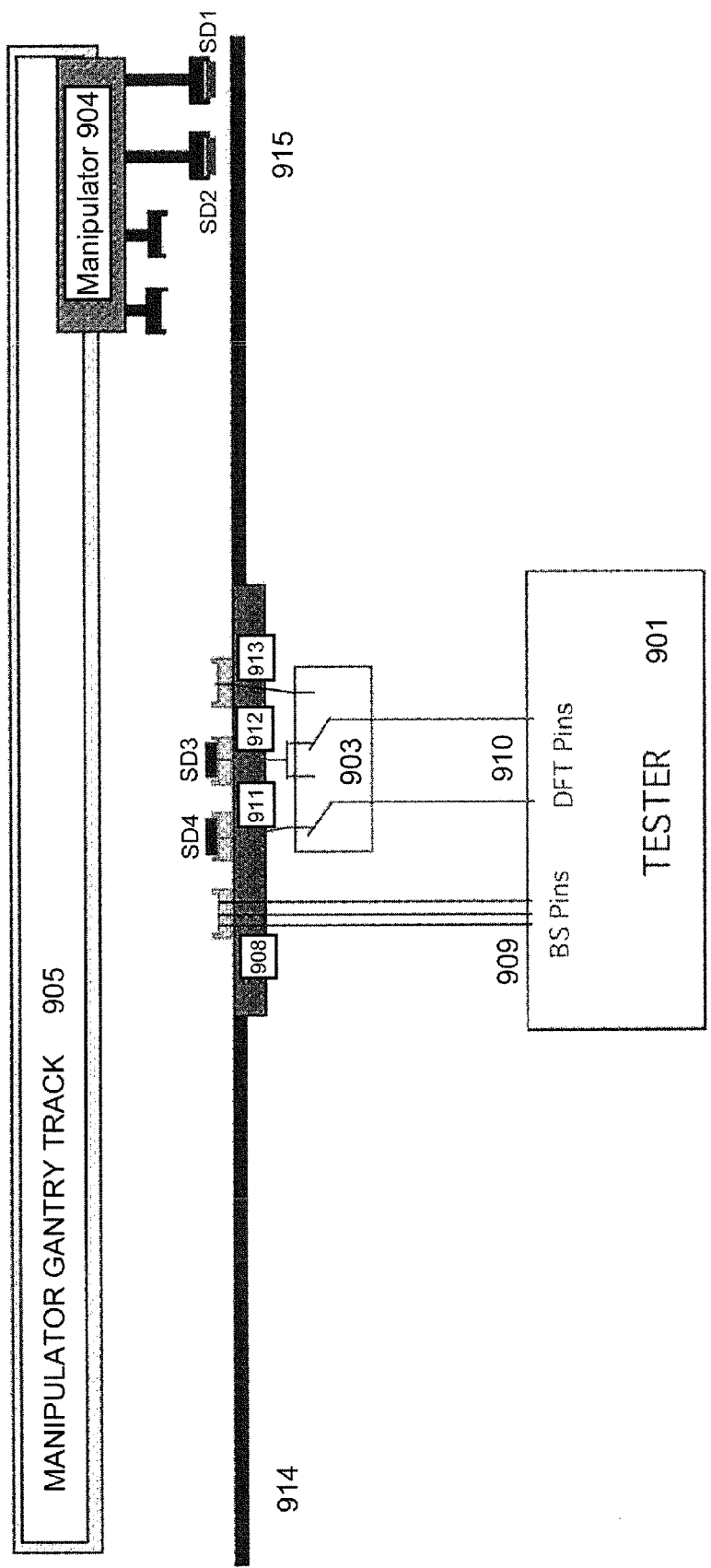

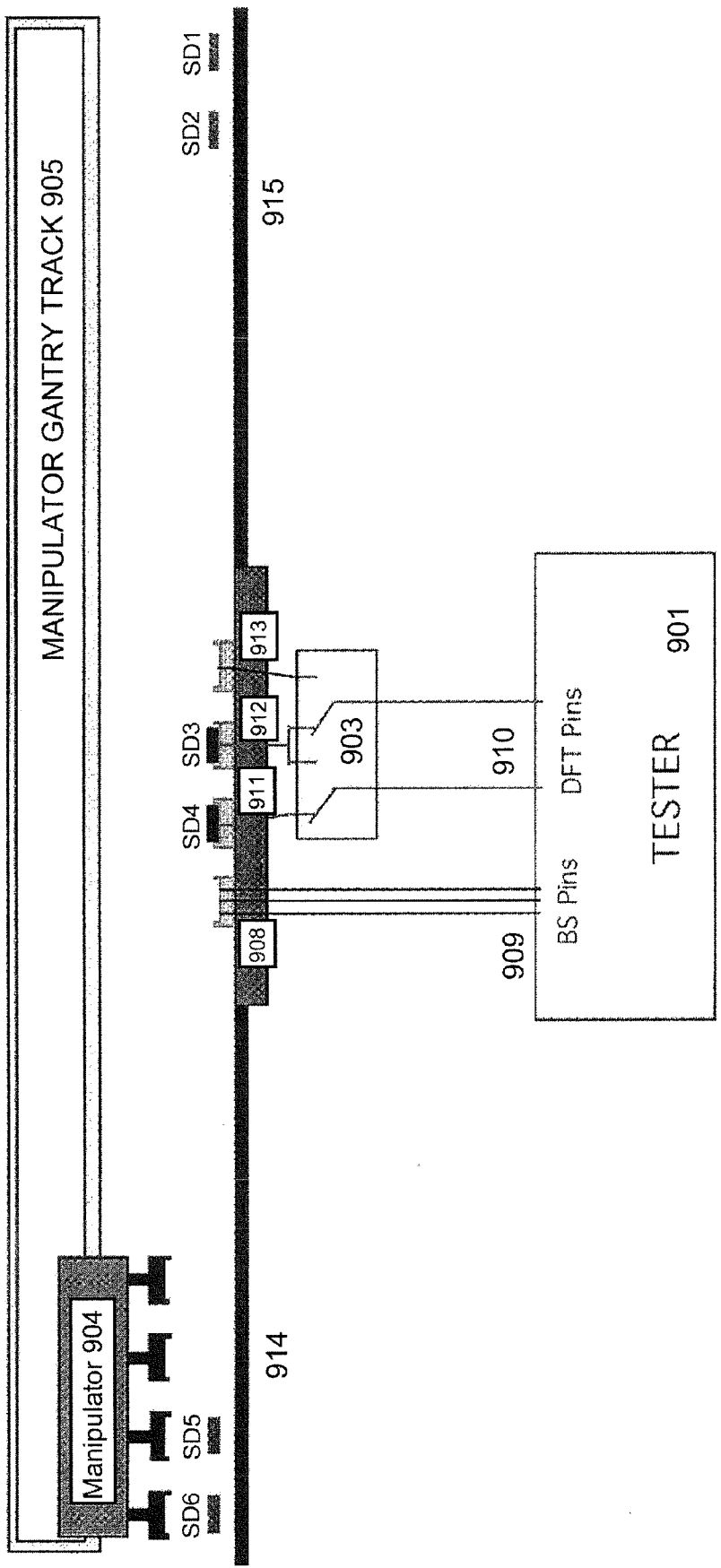

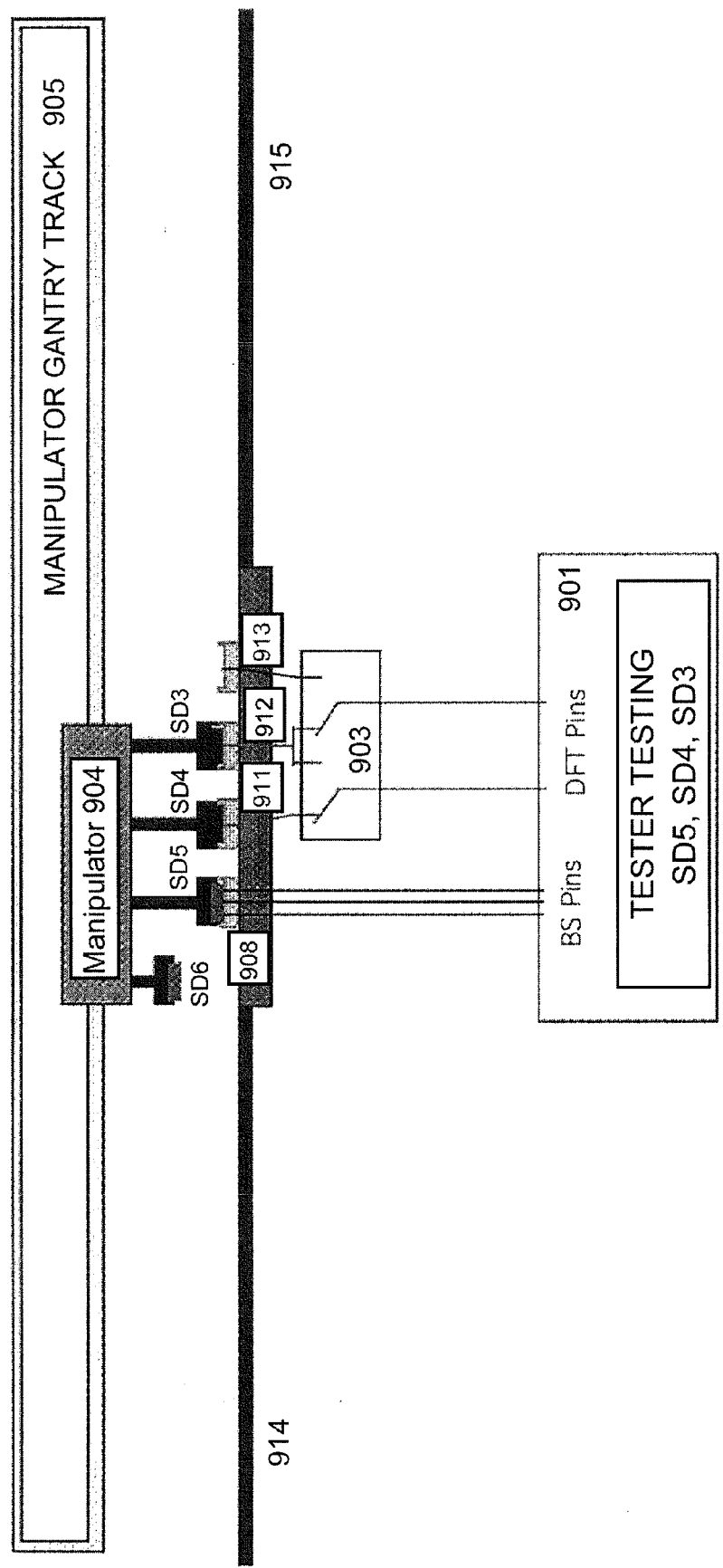

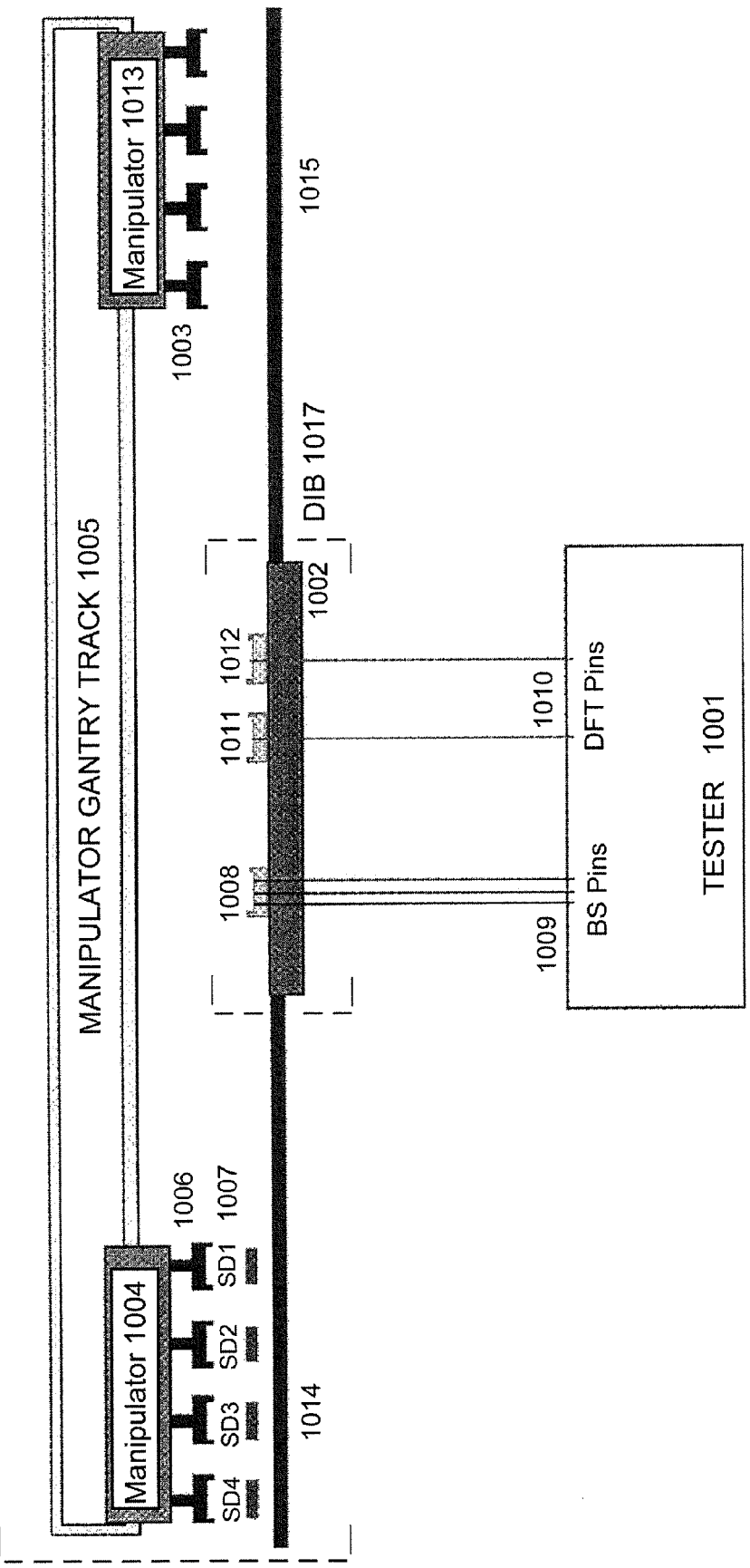

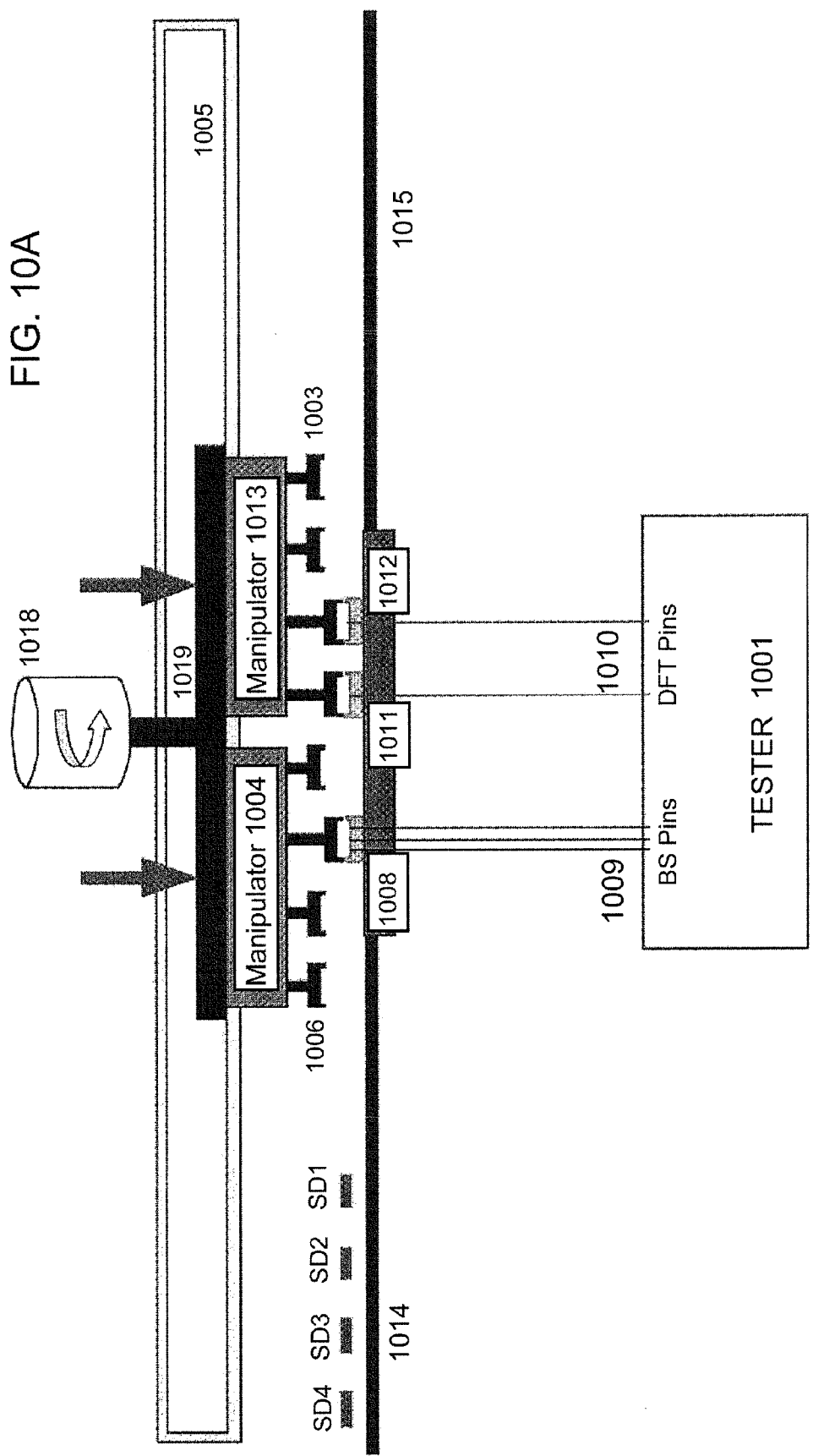

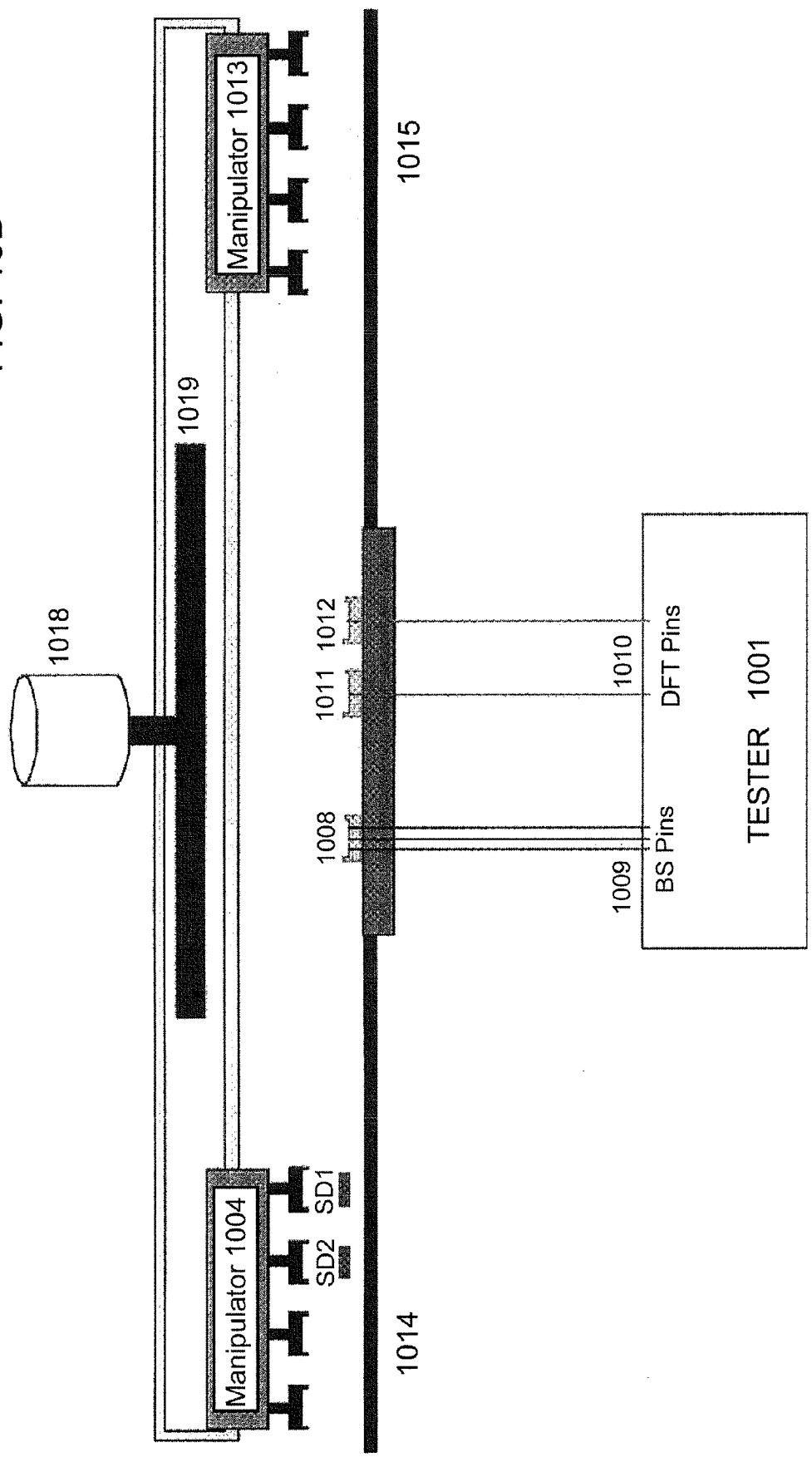

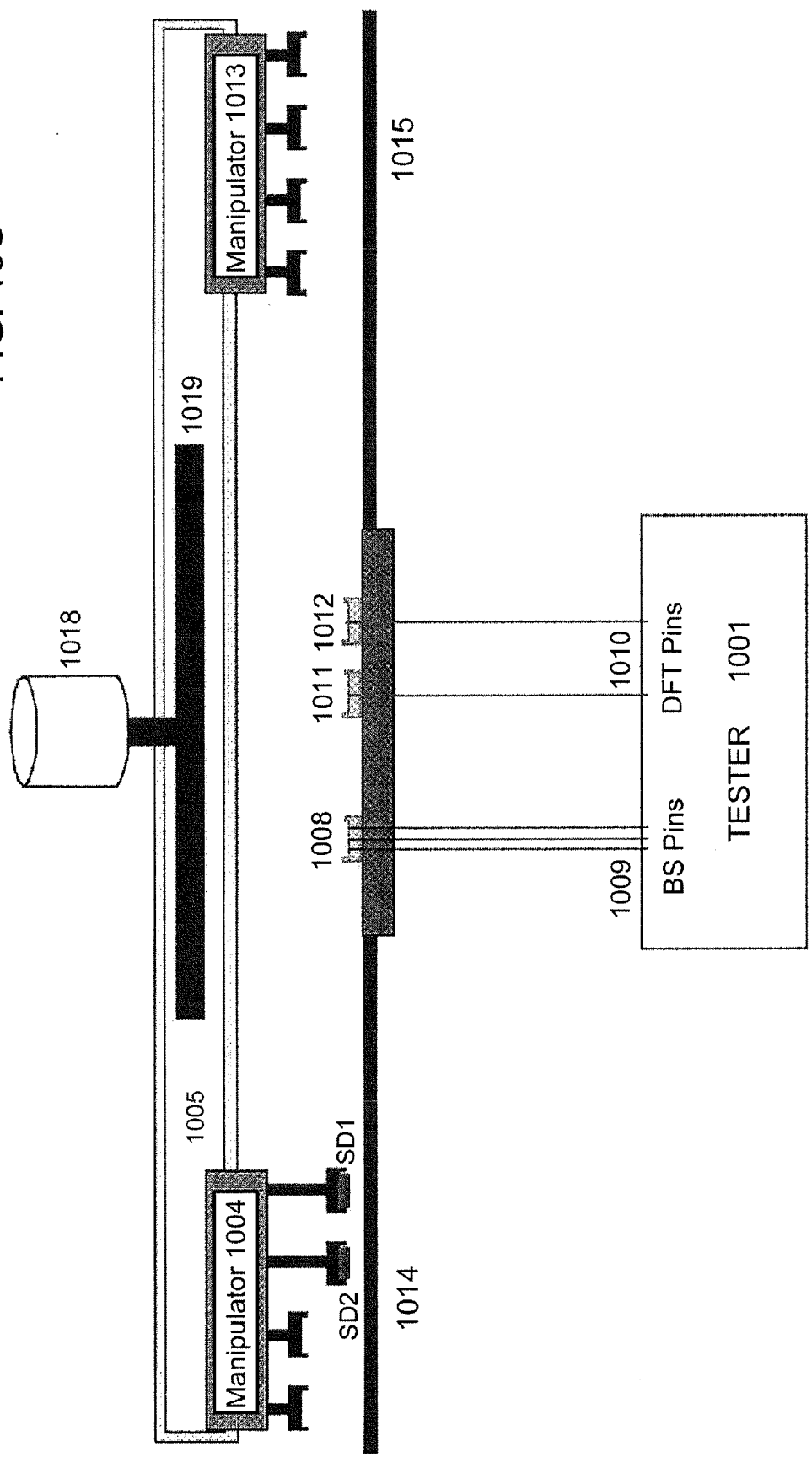

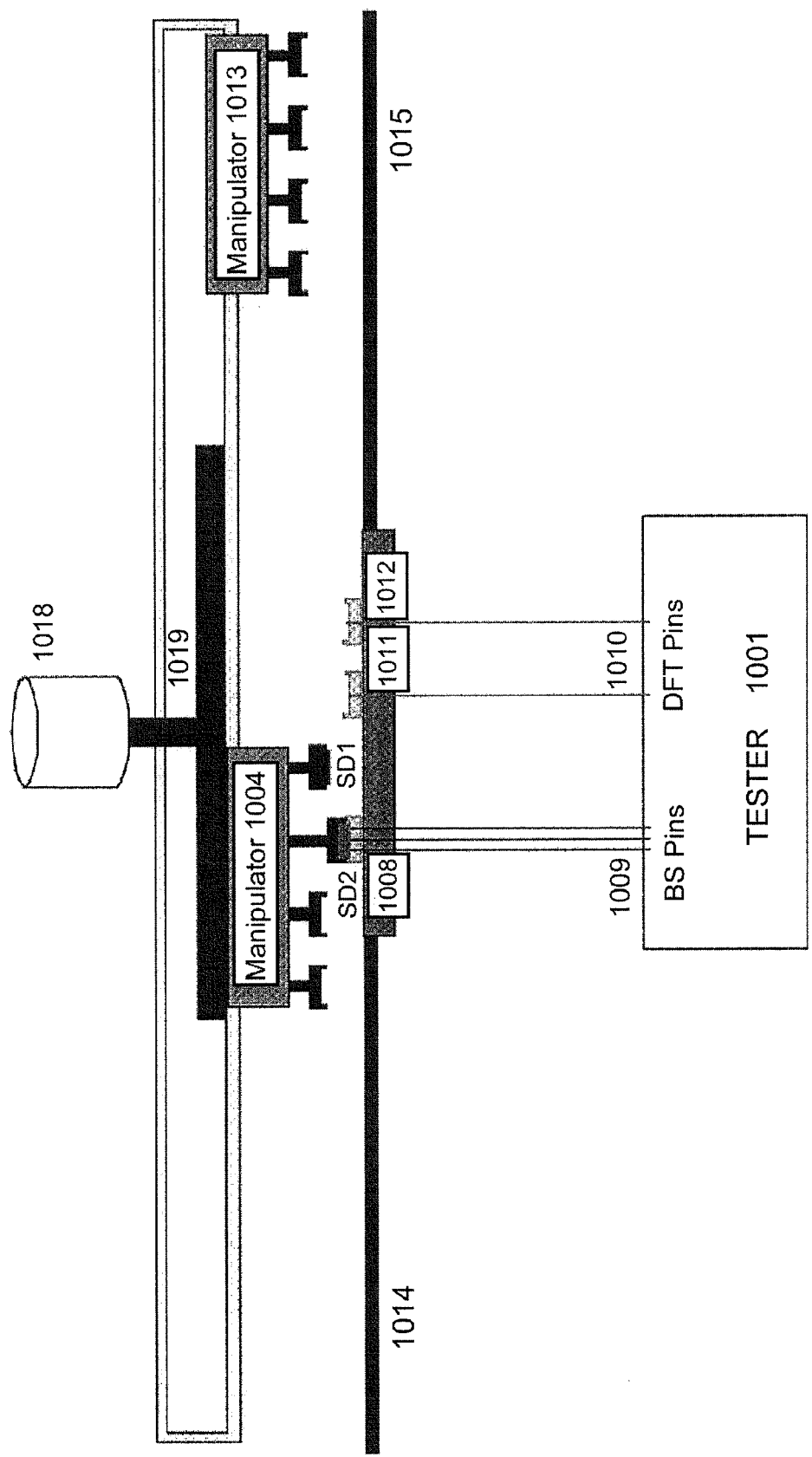

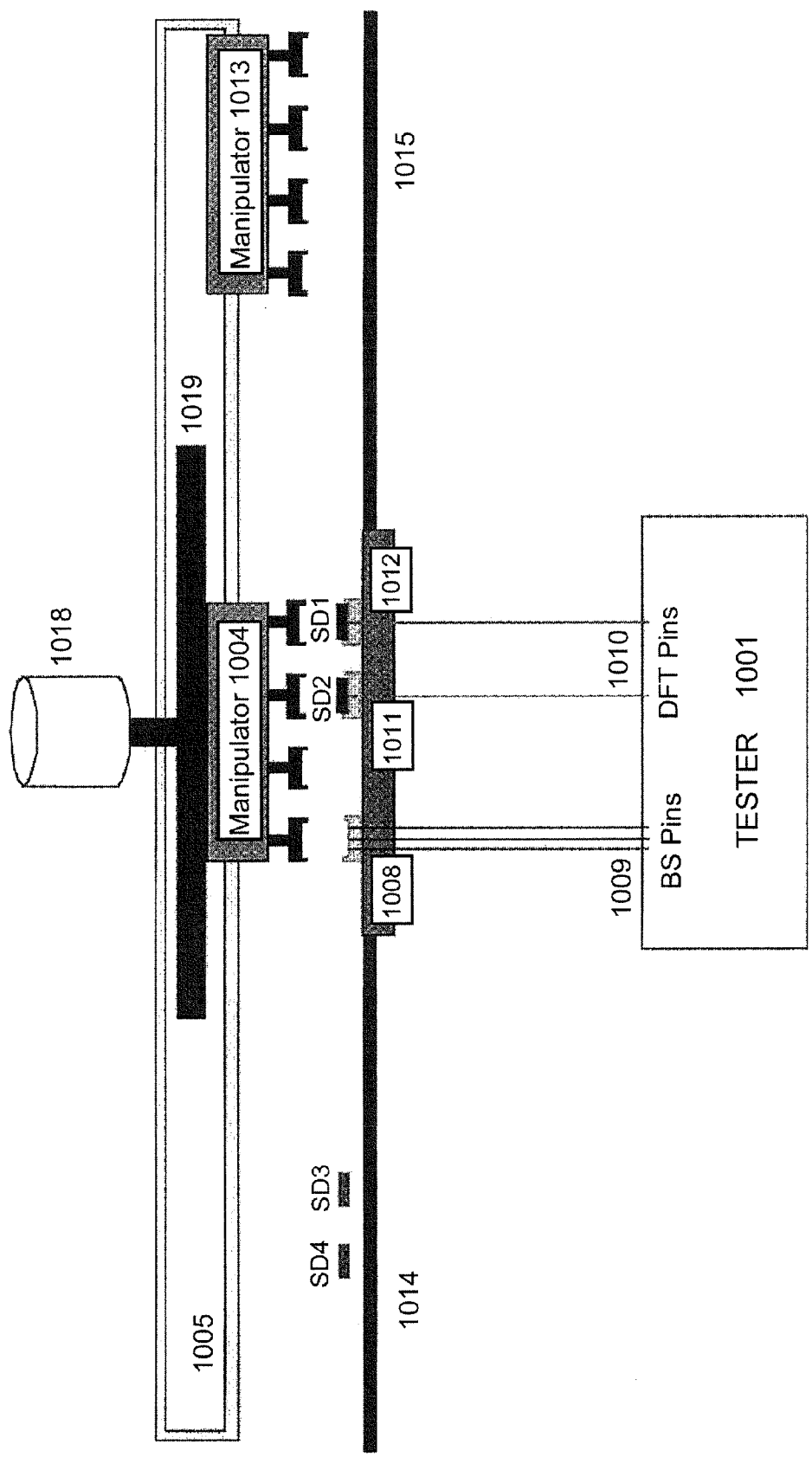

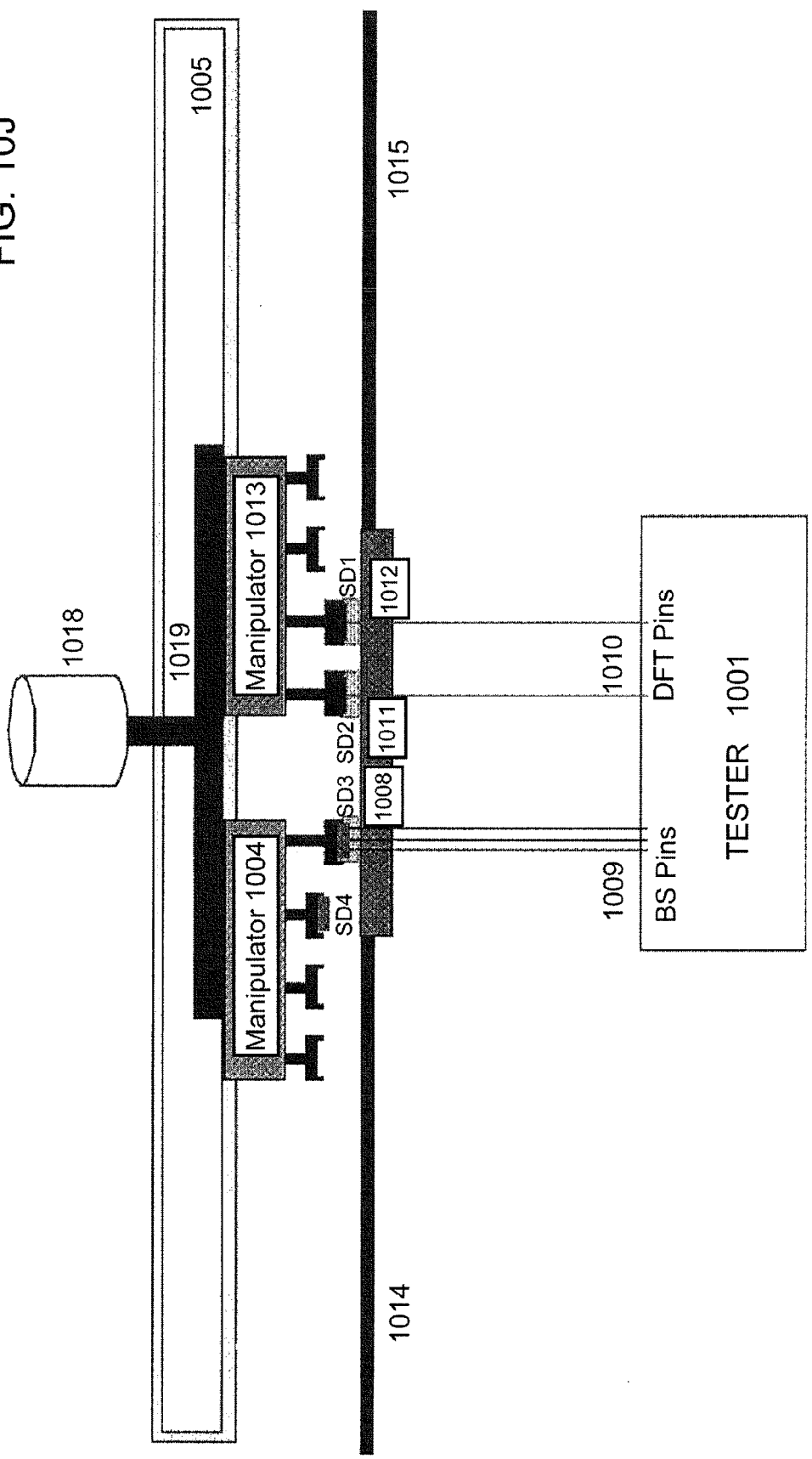

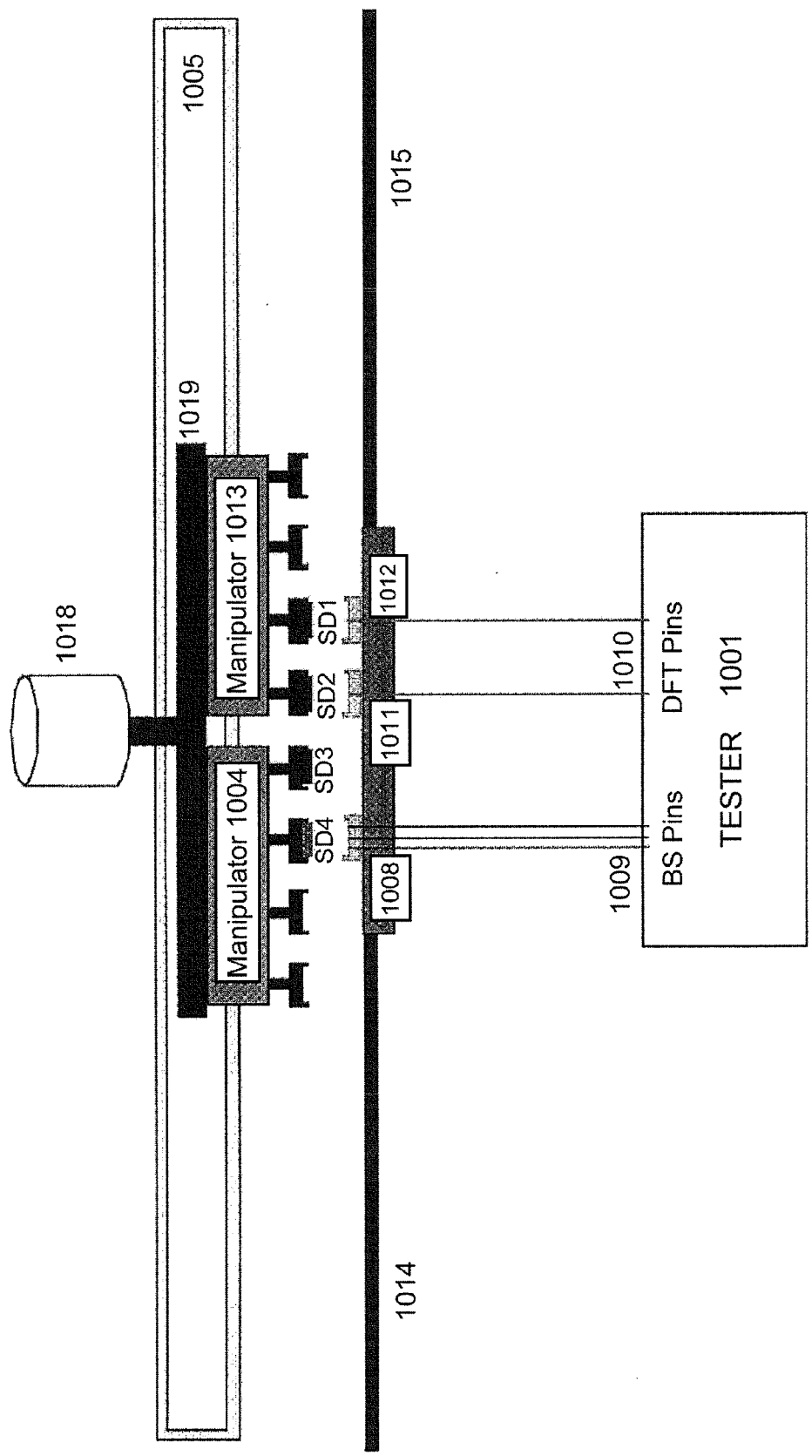

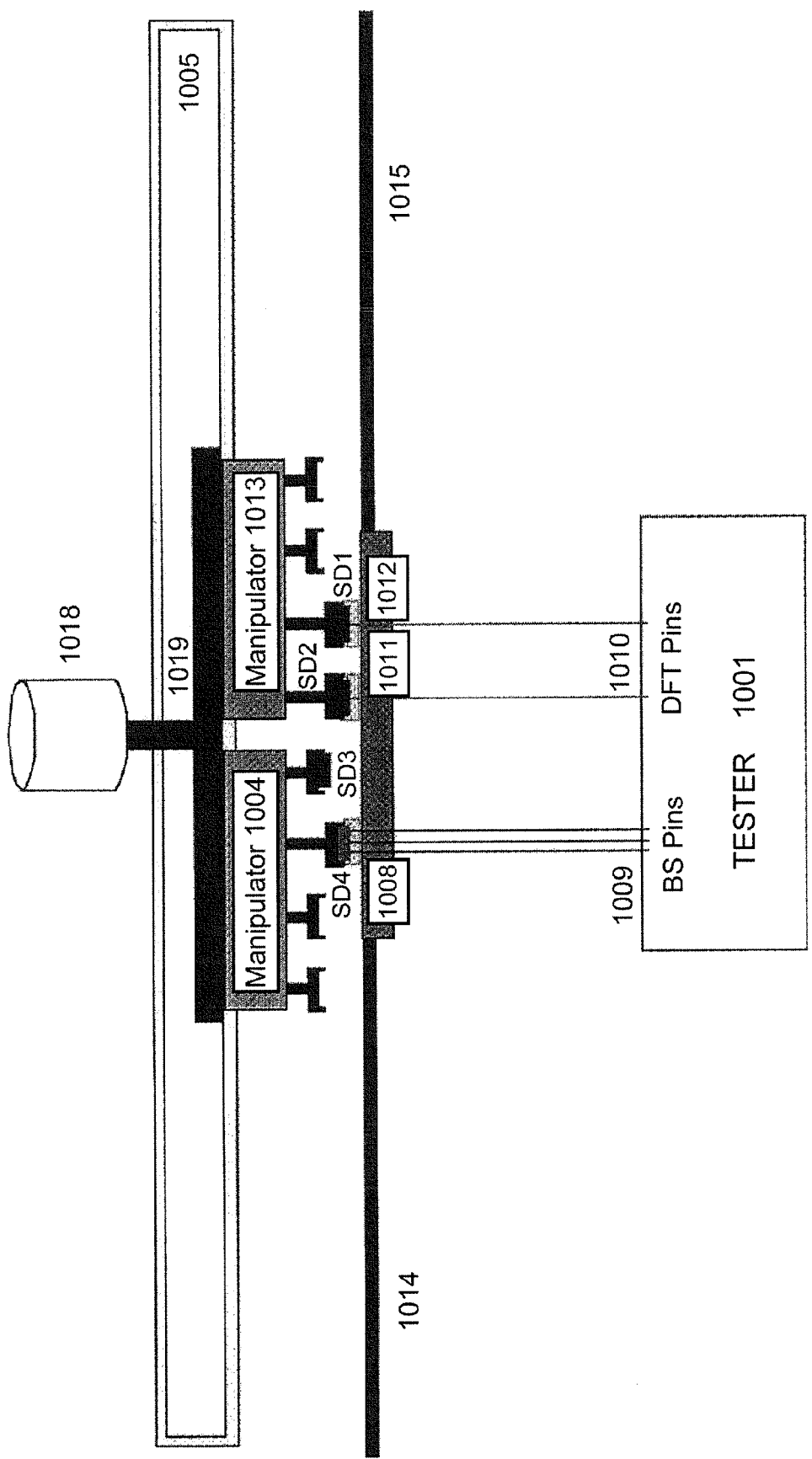

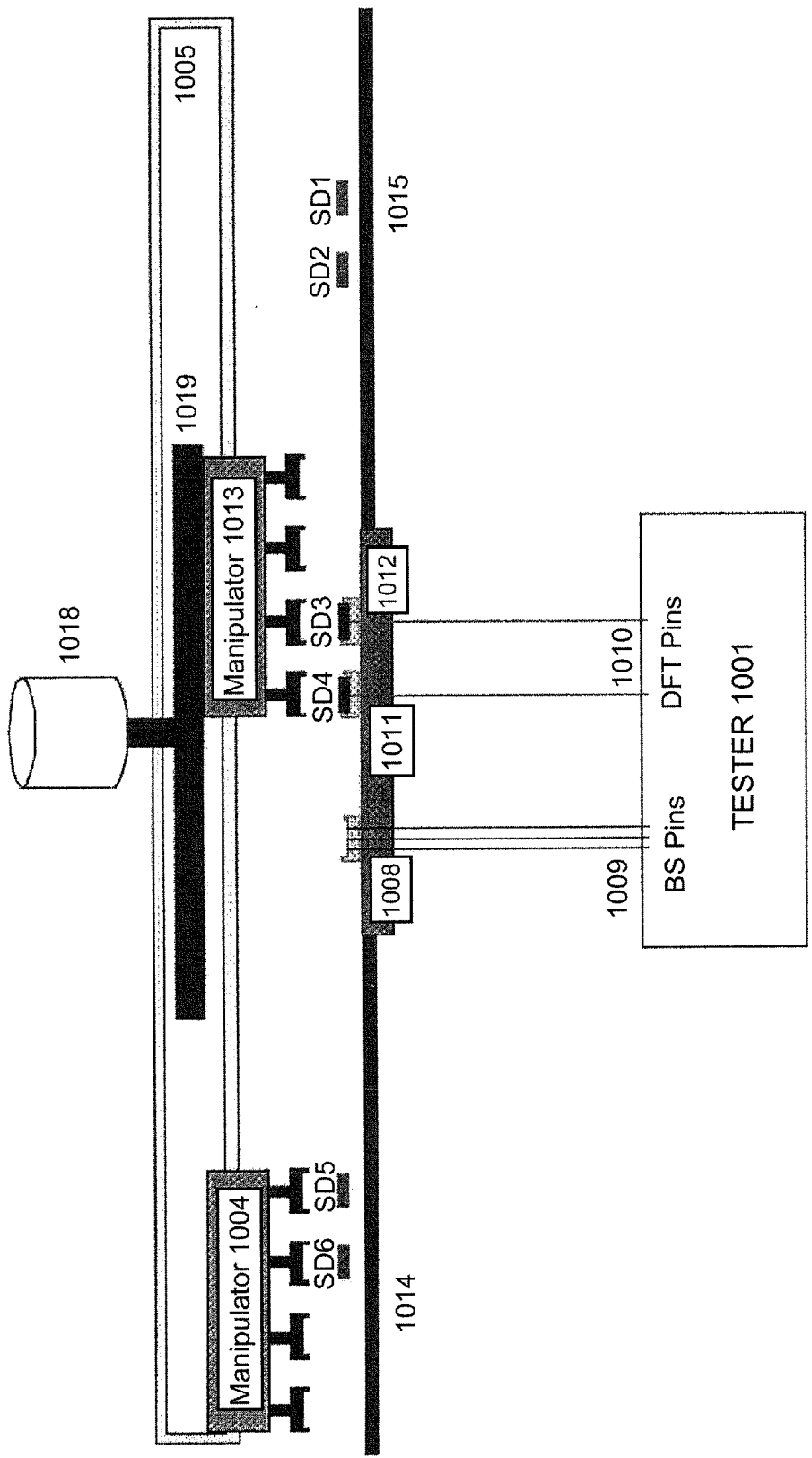

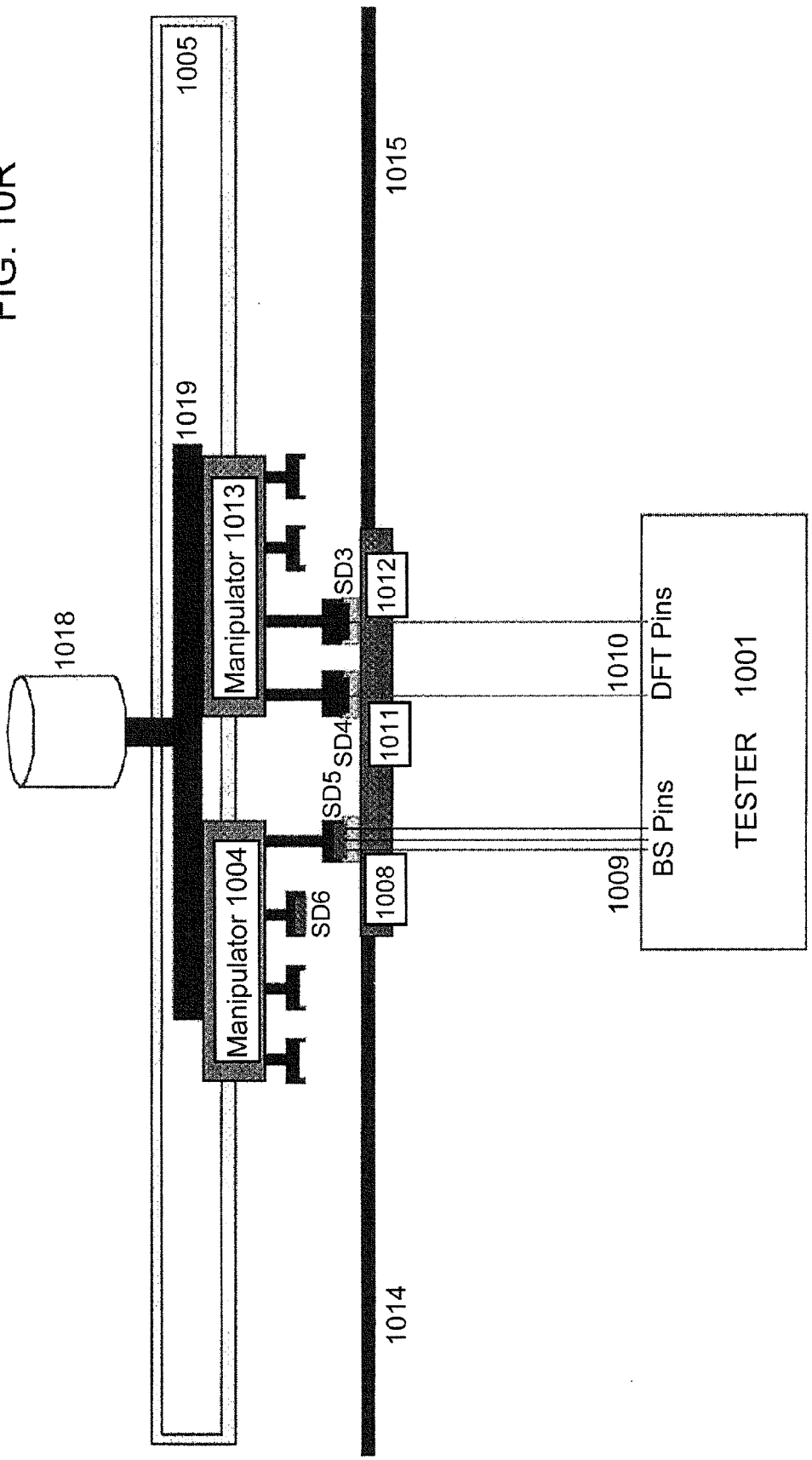

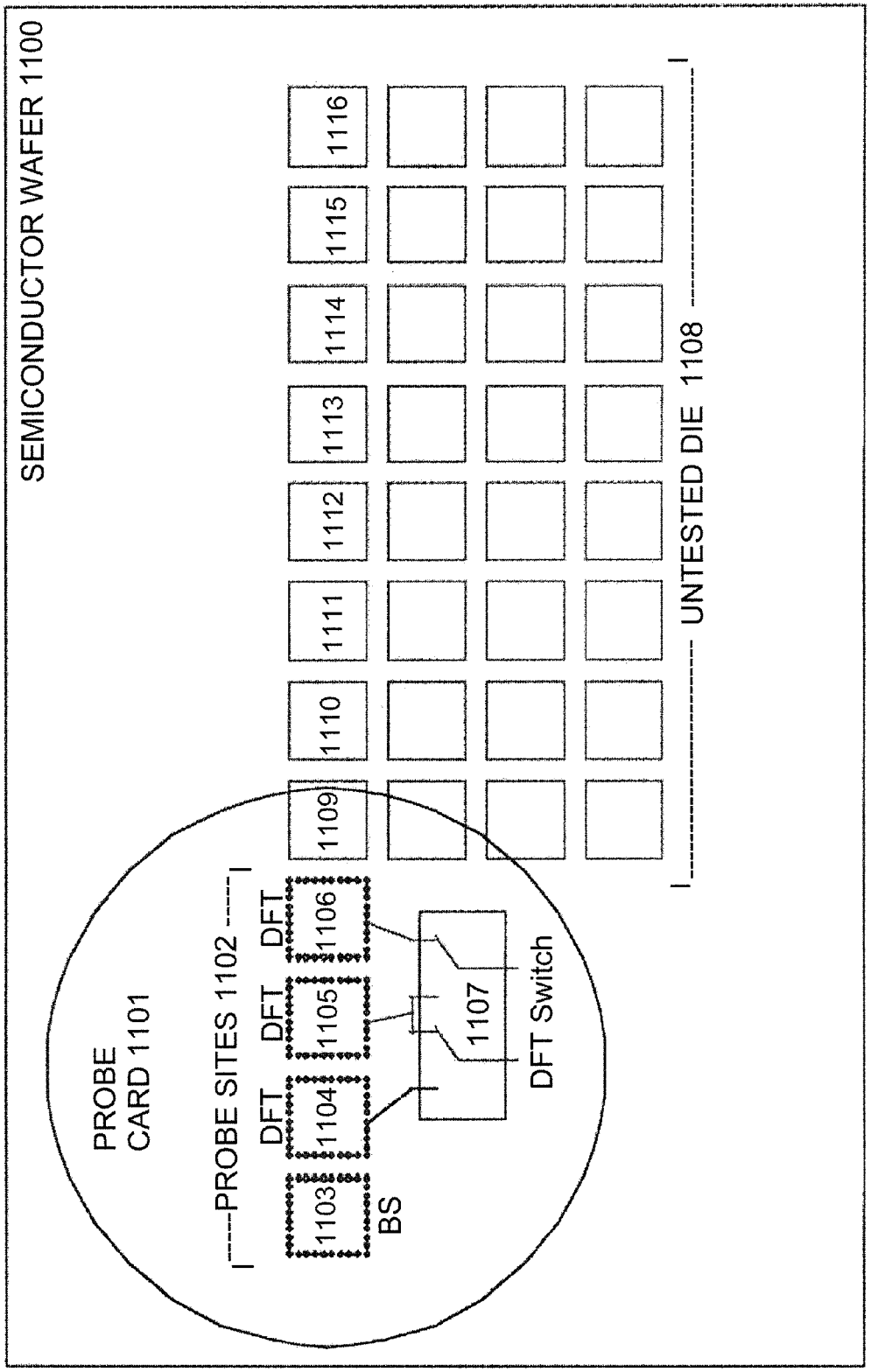

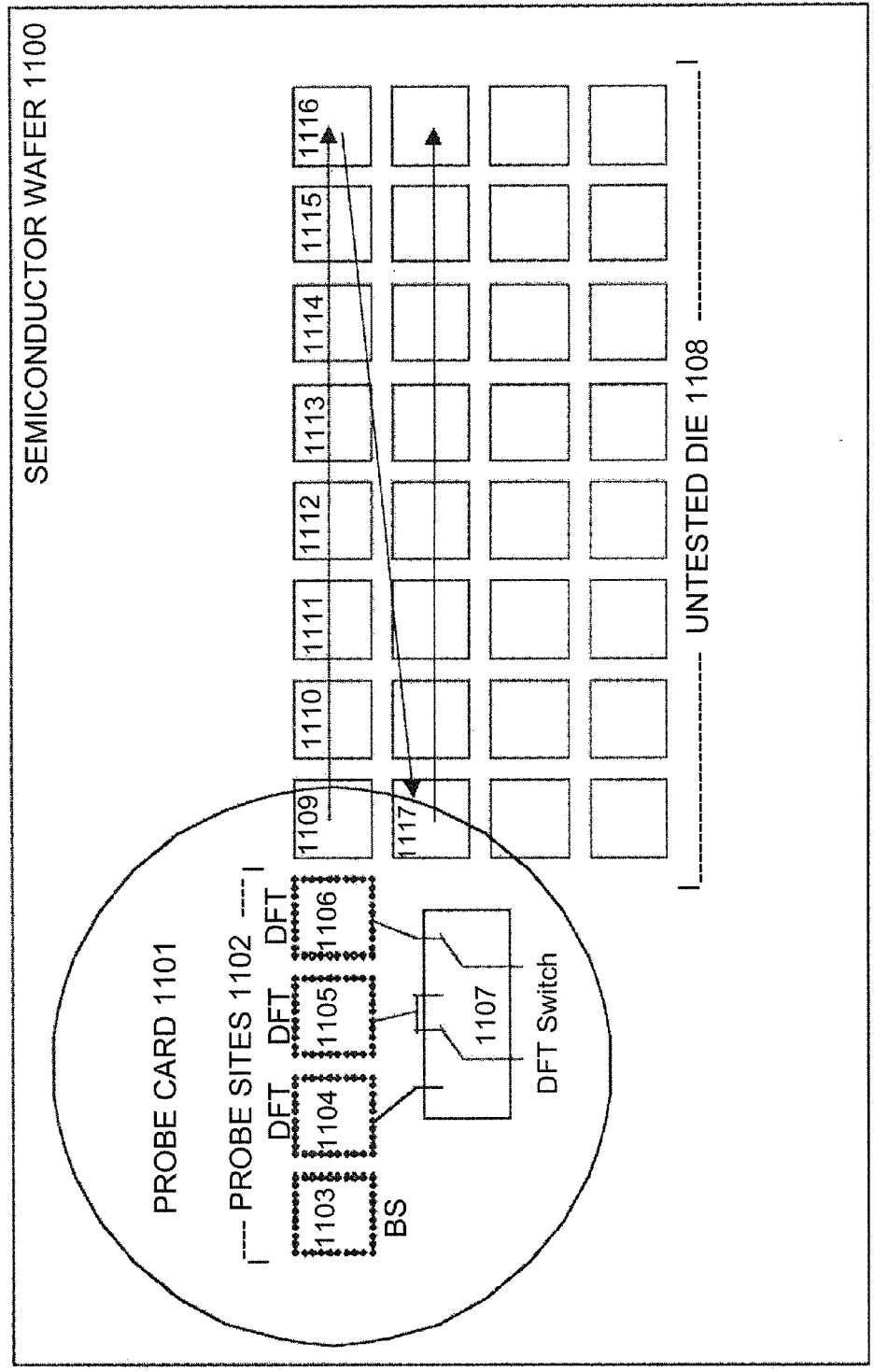

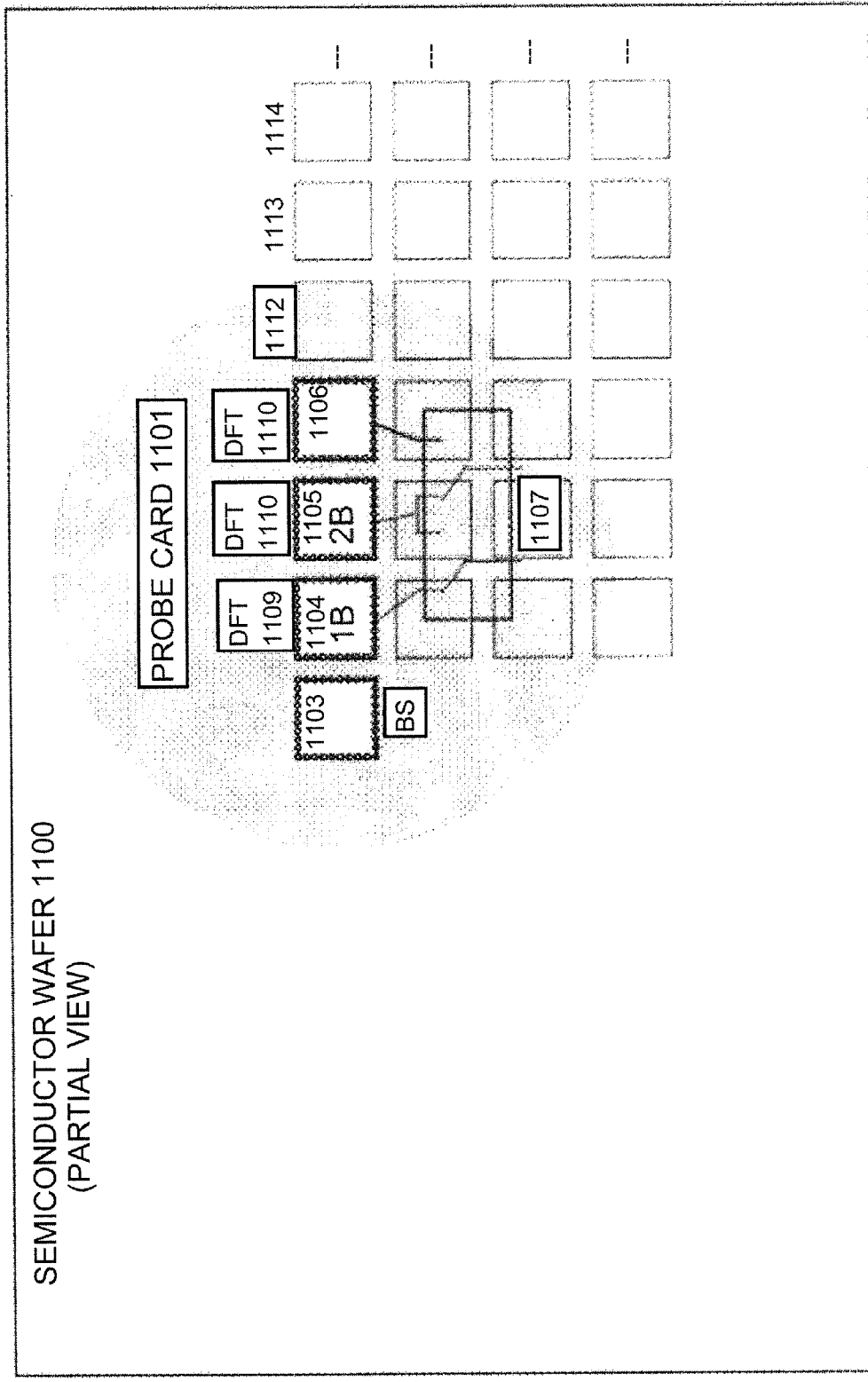

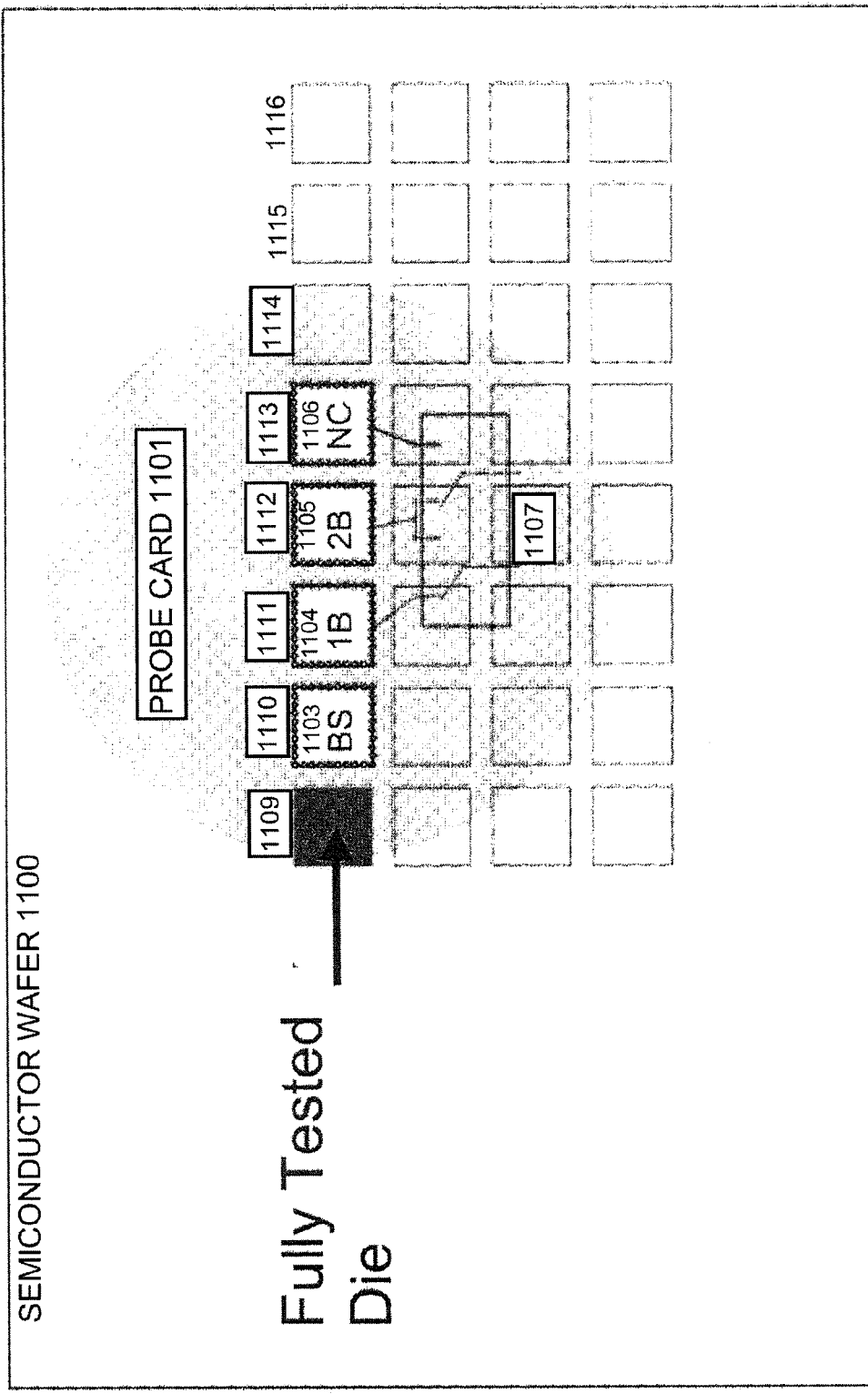

PARALLEL CONCURRENT TEST SYSTEM AND METHOD

CROSS-REFERENCE TO RELATED APPLICATION

This application claims priority for U.S. Provisional Patent Application No. 61/487,993, entitled Parallel Concurrent Test System and Method, filed on May 19, 2011, which is incorporated herein in its entirety.

TECHNICAL FIELD

The present disclosure relates to automated manufacture systems and methods, particularly automated and robotic semiconductor equipment systems and methods, for testing and manufacture quality control of semiconductors, wherein index timing delays and the overall testing time are reduced.

BACKGROUND

Automated manufacturing equipment has streamlined the manufacturing process in many industries. Moreover, such automation has increased reliability and results. A downside of automation has been timing delays in equipment operations. Particularly, where expensive manufacturing equipment is involved, delays in operations of the equipment, such as during mechanical movements in transferring devices under test, limits returns on the costs of such equipment because of idle or non-testing use periods during mechanical manipulations, resets, and the like. An impetus in manufacturing technology and operation has, therefore, been to limit times in which costly test equipment is idle and not performing the applicable test function.

In semiconductor manufacture, semiconductor device test equipment is a costly capital requirement. Conventionally, such test equipment has included a robotic manipulator for handling the devices being tested. This robotic manipulator is commonly referred to as a "handler" and is typically configured with one or more robotic arms referred to as "manipulators." The manipulator mechanically picks up a device for testing, inserts the device into an interface test board and issues a start-of-test signal to the tester. The tester then conducts a test on the device and returns a test result and an end-of-test signal to the handler that causes the handler to disposition the device to a post-test tray or receptacle for holding tested devices. This process is repeated as long as the handler senses that there are additional devices available for test. This system as a whole is sometimes referred to as a "test cell."

During the time required for the handler to disposition a device(s) just tested and replace the device(s) with the next device(s) to be tested, the tester remains substantially idle. This idle time sometimes referred to as "index time" for the particular tester and system, involves mechanical manipulations of the devices awaiting test and having been tested. These mechanical manipulations are limited in speed of operations by various factors, including, for example, physical and speed constraints to ensure that devices to be tested are not damaged, contaminated, dropped, and the like.

The time required to test a device is sometimes referred to as "test time" for a particular device, test, tester, and system. When the system is operational in a manufacturing capacity, it is either indexing during the index time or otherwise testing during the test time.

Previously, test equipment manufacturers have focused efforts to reduce index time on design of manufacturing equipment to increase speed of mechanical operations. Although speeds of mechanical operations in handling the test devices have increased significantly over time, there nonetheless remains significant mechanical index time required to manipulate test devices between tests, by the robotic handlers. Moreover, with increased speeds of mechanical manipulation equipment operations, costs increase for the equipment, including calibration, replacement frequency, maintenance, parts, and others. Given the constraints and precautions that must be addressed in speeding mechanical manipulations of many types of test devices and handlers, further speeding of mechanical operations is subject to economic and physical barriers.

In any event, reducing index time can provide greater returns on investments in test equipment, particularly where the test equipment is costly. It would therefore be a significant improvement in the art and the technology to further reduce index time involved in test operations in manufacturing environments. Particularly in semiconductor manufacture, economic and other gains and advantages are possible if index times are reduced in the testing of semiconductor equipment. It would also be an improvement to provide new and improved systems and methods for achieving reduced index times, without requiring substantial changes or new developments in existing mechanical operations of device handlers and similar robotic or automated components for the testing. Examples of recent advancements made by the present inventor in reducing index time for automated and robotic semiconductor testing are disclosed in other patents by the present inventor, including U.S. Pat. No. 7,183,785 B2, U.S. Pat. No. 7,508,191 B2, and U.S. Pat. No. 7,619,432 B2.

In addition to the advantages of reducing index times discussed above, it would also be an improvement to provide new and improved systems and methods for setting up and configuring the control systems for automated and robotic semiconductor test equipment, which further reduces the cost, complexity, index time, and downtime of testing operations associated with the automated and robotic semiconductor test equipment. For instance, conventional automated semiconductor test equipment is commonly serialized where each individual test is performed sequentially. The primary reasons for serialized testing include thermal issues that restrict the number and complexity of tests that can be conducted at one time, and the complexity of implementation for non-serialized testing. Additionally, conventional Design for Test (DFT) testing normally requires exclusive control of the testing device when running, thus preventing any other non-DFT test from being executed at the same time.

An illustration of a conventional standard flow test cell 100 is illustrated in FIG. 1A. The conventional standard flow test cell 100 traditionally includes an Automatic Test Equipment (ATE) Test System 101, which operates at a high speed and is characterized as having a high pin count. The conventional standard flow test cell 100 also traditionally includes a single socket Device Under Test (DUT) Board 102 that interfaces with a conventional handler 103. In the conventional standard flow test cell 100, untested semiconductor devices 104 are sequentially input into the conventional standard flow test cell 100, sequentially tested, and then sequentially output as tested semiconductor devices 105. An illustration of the sequential testing arrangement of a conventional standard flow test cell 100 is illustrated in FIG. 1B. FIG. 1B shows the sequential ordering of tests that are serially executed in a conventional standard flow test cell. As illustrated therein, the tests are sequentially ordered from the first test, Test 1, through the last test, Test N.

In the conventional standard flow test cell 100 described above, all semiconductor tests are serialized, with each successive test being performed in a set sequence. While the conventional standard flow test cell 100 provides certain advantages, it also has significant drawbacks. The advantages include being relatively simple to implement and having a short development time. It is also easy to maintain, debug, and modify, and runs on essentially all semiconductor test systems. However, the significant drawbacks include requiring a long test time due to the relatively poor utilization of the test cell's Automatic Test Equipment System 101. As a result, the conventional standard test cell 100 provides a low throughput resulting in high semiconductor test costs.

SUMMARY

A system and method is provided for conducting a Parallel Concurrent Test (PCT) using automated and robotic semiconductor test equipment. As used herein, PCT testing generally refers to a process of re-configuring a typical sequential test flow for complex semiconductor devices, which have a high pin count and a correspondingly long test time, into a more efficient test flow that utilizes parallel concurrent testing resulting in a significantly shorter test time. PCT testing encompasses a two-pass test flow that is efficiently executed by running the testing on a single, integrated handler. The integrated handler can be configured as a Standard Test Data (STD) handler. Even greater operational efficiencies can be attained by configuring the handler as a Dual Manipulator (DM) handler. These configurations permits a PCT test cell to achieve substantial benefits, including reduced testing time, increased testing device utilization, and increased throughput of the test cell.

In view of the foregoing, various embodiments are envisioned. According to one embodiment of the present disclosure, a parallel concurrent test system is provided for testing semiconductor devices. The parallel concurrent test system includes a pick and place (PnP) handler for engaging and transporting the semiconductor devices along a testing plane, the PnP handler including at least one manipulator that moves along a track located parallel to the testing plane, the manipulator having a plurality of manipulator chucks for selectively picking up, holding, and dropping off designated semiconductor devices at specified locations on the testing plane. The parallel concurrent test system also includes a device under test interface board (DIB), the DIB including a broadside test socket for broadside (BS) testing of the semiconductor devices, the broadside testing using at least half of a total number of semiconductor device pins, and a plurality of design-for-test (DFT) test sockets for DFT testing, the DFT testing using less than half of the total number of the semiconductor device pins. The parallel concurrent test system further includes a tester in electrical contact with the DIB for testing the semiconductor devices in accordance with a stepping pattern test protocol, wherein each semiconductor device is subjected to broadside testing after being placed in the broadside test socket and to DFT testing after being placed in at least one of the plurality of DFT test sockets.

In another embodiment of the parallel concurrent test system, the stepping pattern test protocol is configured to selectively cause the tester to execute parallel concurrent broadside testing of a semiconductor device placed into the broadside test socket and DFT testing of a semiconductor device placed into one of the plurality of DFT test sockets.

In a further embodiment of the parallel concurrent test system, the stepping pattern test protocol is configured to selectively cause the tester to execute parallel concurrent broadside testing of a semiconductor device placed into the broadside test socket and DFT testing of a semiconductor device placed into at least one of the plurality of DFT test sockets and of a semiconductor device placed into another one of the plurality of DFT test sockets.

In an embodiment of the parallel concurrent test system, the stepping pattern test protocol is configured to selectively cause the tester to execute the DFT testing in at least two different DFT tests, with the tester executing a first DFT test on a designated semiconductor device when a designated semiconductor device is placed into one of the plurality of DFT test sockets and performing a second DFT test on the designated semiconductor device when the designated semiconductor device is placed into another one of the plurality of DFT test sockets.

In another embodiment of the parallel concurrent test system, the PnP handler is configured as a Standard Test Data (STD) handler with a single manipulator.

In a further embodiment of the parallel concurrent test system, the device under test interface board (DIB) comprises the broadside test socket and three DFT test sockets.

An embodiment of the system includes a switch located between the tester and the DIB, wherein the tester controls the switch such that only two of the three DFT test sockets are in electrical contact with the tester at any time during execution of the stepping pattern test protocol.

In another embodiment of the parallel concurrent test system, the STD handler manipulator picks up untested semiconductor devices at a designated first location on the testing plane, transports the untested semiconductor devices to the DIB for testing by the tester, and drops off semiconductor devices that have completed the parallel concurrent broadside testing and DFT testing at a designated second location on the testing plane.

In a further embodiment of the parallel concurrent test system, the PnP handler is configured as a Dual Manipulator (DM) handler having two manipulators with the tester enabled to operate the two manipulators.

In an embodiment of the parallel concurrent test system, the device under test interface board (DIB) comprises the broadside test socket and two DFT test sockets.

In another embodiment of the parallel concurrent test system, a first DM handler manipulator picks up untested semiconductor devices at a designated first location on the testing plane and transports the untested semiconductor devices to the DIB for testing by the tester, and a second DM handler manipulator transports the semiconductor devices that have completed the parallel concurrent broadside testing and DFT testing to a designated second location on the testing plane where they are dropped off.

A further embodiment of the parallel concurrent test system includes a test management control system that tracks a location and testing status for each semiconductor device moving through the parallel concurrent test system, correlates all of the broadside testing results and DFT testing results for each semiconductor device, and stores composite test results in a composite test results database.

In an embodiment of the parallel concurrent test system, the stored composite test results database is accessible locally at a location of the parallel concurrent test system, and is accessible remotely through a network from a location other than the location of the parallel concurrent test system.

Another embodiment provides a method of conducting parallel concurrent testing on semiconductor devices using a test cell that includes a handler, a device under test interface board (DIB), and a tester. The method includes picking up an untested semiconductor device at a designated pick-up location by a manipulator of the handler, and transporting the untested semiconductor device along a test plane to the DIB. The method also includes performing, by the tester, concurrent parallel testing of the untested semiconductor device and at least one other semiconductor device based on a stepping pattern test protocol, the concurrent parallel testing including broadside testing using at least half of a total number of semiconductor device pins of the untested semiconductor device, and design-for-test (DFT) testing of the at least one other semiconductor device using less than half of a total number of semiconductor pins of the at least one other semiconductor device. The method further includes transporting a semiconductor device that has completed both broadside testing and DFT testing to a designated drop-off location along the test plane.

In a further embodiment of the method, the performing of concurrent parallel testing includes the broadside testing of the untested semiconductor device, a first partial DFT testing of a first other semiconductor device, and a second partial DFT testing of a second other semiconductor device, the first partial DFT testing and the second partial DFT testing comprising different tests.

In an embodiment of the method, the performing of concurrent parallel testing includes performing all of the broadside testing using a single broadside test socket provided on the DIB, and performing the first partial DFT testing and the second partial DFT testing using only two of three DFT test sockets provided on the DIB at any time during the concurrent parallel testing.

In another embodiment of the method, the performing of concurrent parallel testing includes performing all of the broadside testing using a single broadside test socket provided on the DIB, and performing the first partial DFT testing and the second partial DFT testing using both of only two DFT test sockets provided on the DIB at any time during the concurrent parallel testing.

In another embodiment, a method of conducting parallel concurrent testing of semiconductor dies located on a semiconductor wafer using a stationary probe is provided. The method includes positioning the semiconductor wafer relative to the stationary probe card, such that a first die is in contact with a broadside probe site provided on the probe card, a second die is in contact with one of three design-for-test (DFT) probe sites provided on the probe card, and a third die is in contact with another one of the three DFT probe sites provided on the probe card. The method also includes switching a switch on the probe card so that a semiconductor tester is connected to two of the three DFT probe sites that are in contact with the second die and the third die, and performing concurrent parallel testing of the first die, the second die, and the third die in accordance with a stepping pattern protocol being executed by a tester, the concurrent parallel testing including performing broadside testing on the first die, the broadside testing using at least half of a total number of first die pins, performing a first DFT testing on the second die, and performing a second DFT testing on the third die, each of the first DFT testing and the second DFT testing using less than half of a total number of semiconductor pins of the second die and the third die. The method further includes repositioning the semiconductor wafer relative to the stationary probe card upon completion of the concurrent parallel testing.

In a further embodiment of the method, the first DFT testing and the second DFT testing comprise different tests.

An embodiment of the method further includes testing of all the semiconductor dies located on a semiconductor wafer by the probe card in a predetermined order until all of the semiconductor dies located on the semiconductor wafer have been subjected to the broadside testing, the first DFT testing, and the second DFT testing.

Additional embodiments include methods and non-transitory computer readable mediums that include features similar to the features recited in the system and method embodiments described above.

BRIEF DESCRIPTION OF THE DRAWINGS

FIG. 2A shows an exemplary illustration of a concurrent testing process for semiconductor devices;

FIG. 2B shows an exemplary illustration of concurrent and serial testing process for semiconductor devices;

FIG. 9A through FIG. 9K progressively illustrate a semiconductor test cell PCT stepping pattern utilizing a STD gantry handler with a single manipulator;

FIG. 11 provides an exemplary illustration of a semiconductor wafer and corresponding probe card having multiple probes sites;

FIG. 11A through FIG. 11G progressively illustrate a probe card stepping pattern for a semiconductor wafer.

DETAILED DESCRIPTION

In view of the foregoing, the present disclosure, through one or more of its various aspects, embodiments and/or specific features or sub-components, is thus intended to bring out one or more of the advantages as specifically noted below. The present disclosure provides a description of a control system and related methodology for conducting efficient Parallel Concurrent Test (PCT) semiconductor testing using automated and robotic semiconductor test equipment.

In general, the exemplary embodiments disclosed herein involve semiconductor devices being tested that are generally characterized as having a high complexity and a high pin count. Such semiconductor devices conventionally require a long test time. Additionally, the handler(s) referred to herein generally refer to Pick-and-Place (PnP) handlers, and not to gravity feed handlers.

An exemplary non-limiting illustration of a concurrent testing process is illustrated in FIG. 2A. In this figure, Test 2 and Test 3 are executed concurrently, as are Test 4 and Test 5. Additionally, on the right side of FIG. 2A the single execution of Test N–3 would be an example of a test that needed to be performed prior to the execution of Test N–2. In other words, Test N–3 and Test N–2 could not be performed concurrently because Test N–2 required the completion of Test N–3 prior to being executed. Concurrent testing of semiconductor devices in this manner provides a better utilization of ATE and thus shortens the overall test time, when compared to the previously described conventional standard flow test cell that executes each test sequentially. However, this form of concurrent testing cannot be performed on all test systems and creates thermal management issues due to the increased heat caused by the concurrent testing. Instead, this type of concurrent testing would need a more complex and expensive ATE system and require higher maintenance than the previously described conventional standard flow test cell.

FIG. 2B provides an exemplary illustration of a concurrent and serial testing process for semiconductor devices. In this form of simultaneous concurrent testing, the same tests are executed concurrently on each semiconductor device and across multiple devices on the same test cell in parallel. In this form of testing, concurrent testing of a semiconductor device (similar to that illustrated in FIG. 2A) is performed simultaneously on two different semiconductor devices. In other words, the same tests are performed in the same order on identical semiconductor devices. While simultaneous concurrent testing better utilizes the ATE system, it is characterized by many of the same drawbacks as the previously described concurrent testing of semiconductor devices. Additionally, high pin count semiconductor devices are limited in how many can be tested concurrently. Typically, no more than two semiconductor devices can be concurrently tested simultaneously on an ATE.

Figure 3:
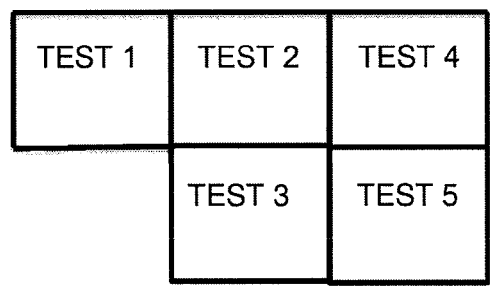
FIG. 3 illustrates the concept of performing a Parallel Concurrent Test (PCT) using a Standard Test Data (STD) handler.
Figure 3:
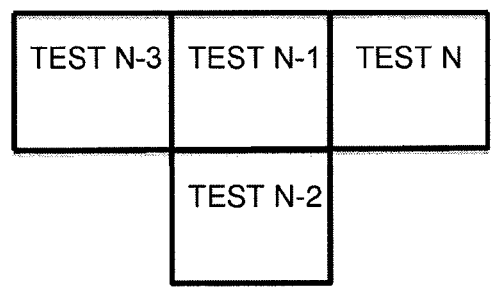

An illustration of the concept of performing a Parallel Concurrent Test (PCT) using a Standard Test Data (STD) handler is provided in FIG. 3. In this form of concurrent testing, different tests on two or more semiconductor devices are executed in parallel on the same test cell ATE system, with at least some different tests being executed at the same time. An exemplary illustration of parallel concurrent testing utilizing a STD handler is illustrated in FIG. 3. In this figure, two different semiconductor devices, i.e., Semiconductor Device 1 and Semiconductor Device 2, are being tested at the same time. However, each of the two different semiconductor devices is being subjected to different tests. For instance, in FIG. 3, Test 1 is being executed on Device 1, whereas Test N–3 is being simultaneously executed on Semiconductor Device 2. Similarly, Tests 4 and 5 are being concurrently executed on Semiconductor Device 1 at the same time that Test N is being executed on Semiconductor Device 2.

Such parallel concurrent testing utilizing an STD handler provides better utilization of the ATE system compared to the previously described forms of concurrent testing and mitigates thermal management issues during the test, since different tests are being performed on the different semiconductor devices. This form of concurrent testing also allows for Design for Test (DFT) tests to be executed concurrently with broadside tests. Thus, this form of testing reduces the overall test time per semiconductor device compared to the previously described forms of concurrent testing.

DFT refers to a category of tests that is based on using only a few pins to test large segments of the semiconductor device. These tests rely on internal circuits that are designed into the device that support testing. The data streams into and out of the semiconductor device are typically low speed and serial in format. DFT pins are typically multiplexed with application pins, so frequently DFT tests cannot be executed in parallel with broadside tests. Additionally, DFT tests typically consume high levels of power. As a result, DFT testing generates a lot of heat and requires thermal management to prevent thermal runaway and overheating during the DFT testing. Further, DFT test frequencies are different than application test frequencies. Thus, it takes a special kind of tester to run both DFT tests and broadside tests at the same time. Multiple clock domains are required for the simultaneous execution of both DFT tests and broadside tests.

Examples of broadside tests include: connectivity (open circuits and short circuits); high impedance input leakage; voltage thresholds (VIH, VIL, VOH, VOL); current drain, at speed functional tests and speed sort functional tests; brute-force functional tests (full command set); application mimicking functional tests, parallel memory interface (DDR) tests; RX-TX Data Integrity Checks (CRC Check), and parametric and analog testing.

An operational disadvantage of parallel concurrent testing utilizing an STD handler is that the test time for each test equals the longest test time for each test of the semiconductors being concurrently tested. This characteristic is because the STD handler cannot independently deposition DUTs. In other words, all semiconductor devices concurrently under test must wait for the longest test time before binning the group of tested semiconductor devices. An example of this characteristic is also illustrated in FIG. 3 wherein the tests being performed concurrently on the two different semiconductor devices start and stop at the same time. For instance, Test 2, Test 3, Test N–1, and Test N–2 all start and stop at the same time, which is the longest time of execution for the four tests being executed.

Figure 4:
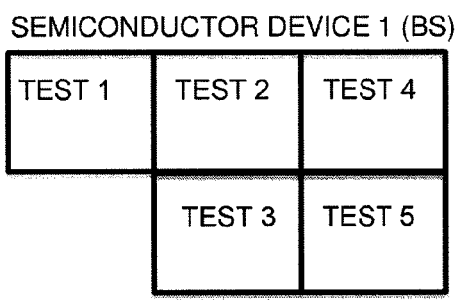
FIG. 4 shows an exemplary illustration of PCT testing utilizing a DIM handler.
Figure 4:
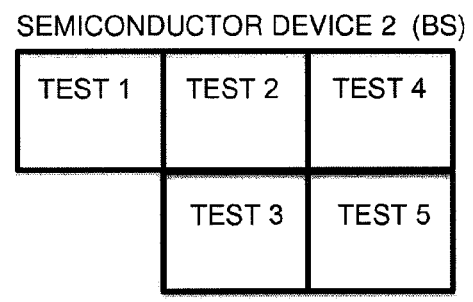
Figure 4:
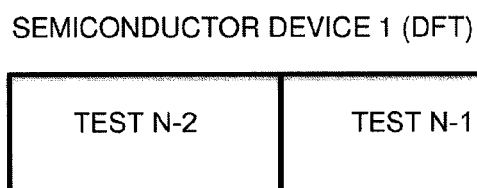
Figure 4:
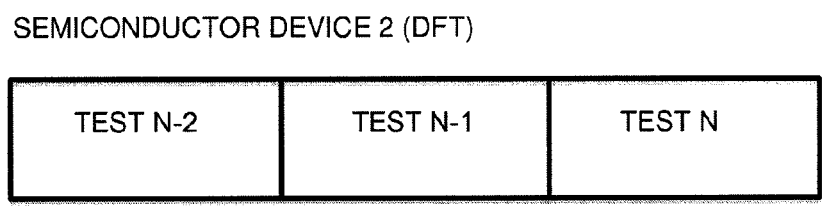

Another form of parallel concurrent testing utilizes a dual manipulator (DM) handler, instead of an STD hander. This configuration utilizing a DM handler also permits DFT tests to be executed concurrently with a broadside test, but potentially with greater efficiency An exemplary illustration of parallel concurrent testing utilizing a DM handler is illustrated in FIG. 4. In this figure, concurrent testing includes concurrently performing broadside (BS) testing on semiconductor device 1, DFT testing on semiconductor device 1, and DFT testing on semiconductor device 2. Upon the completion of the BS testing on semiconductor device 1, but prior to the completion of the concurrent DFT testing on semiconductor device 1 and semiconductor device 2, BS testing of semiconductor device 2 is initiated. At a later point in time, the concurrent DFT testing of semiconductor device 1 and semiconductor device 2 arrives at completion, prior to the completion of the BS testing on semiconductor device 2, which continues until completion.

The characteristics of a DIM handler that is used in conjunction with parallel concurrent testing include having a PnP design, thermal management for high power broadside testing, and change kits for large outline, high pin count packages. Additionally, the DIM handler includes asynchronous start-of-tests for each manipulator, and asynchronous end-of-test signals and binning for each manipulator. The PCT system would also include two or more fully asynchronous PnP manipulators. A transport system is included in the PCT system where the output queue of the first manipulator places its output devices, and the second manipulator plunges and tests its input devices. The transport system also includes a location where semiconductor devices held by any manipulator can be picked up and placed at any socket site on the DIB. Furthermore, the PCT system includes a control system that tracks each semiconductor device moving through the handler and dispositions each semiconductor device based on the binning across both manipulators. This configuration includes a counter, a First-In-First-Out (FIFO) queue containing semiconductor numbers and binning status at each manipulator, and a logical AND operation on the FIFO queue binning data for each semiconductor device. The control system makes that final bin results able to be correlated with the first pass result and the second pass result.

One type of PCT system is an integrated system that includes two fully independent handlers, two fully independent testers, and a transfer process by which the output from one handler is provided to the input of the second handler. This transfer process may be automated or performed manually by a human operator. The integrated system also includes a process for tracking the binning across the two handlers. Additionally, the integrated system include one DIB for broadside (BS) testing, and one DIB for DFT testing, the corresponding testing being extracted from a standard design. Thus, the BS test program can extract related testing from the standard test program, and the DFT test program can extract related testing from the standard test program. Further, asynchronous start-of-test signals are given with two independent handlers, and asynchronous end-of-test signals and binning, are given with two independent testers. The integrated system also includes a process for composing a composite log of results, wherein each of these two fully integrated testers writes it own STDF file, which is subsequently merged into a composite log of results. The composite log of results is then stored in a storage and is selectively retrievable for analysis and reporting purposes. Retrieving and analyzing the composite log of results may be performed locally or remotely by accessing the composite log by a computer system over a network.

Figure 1A:
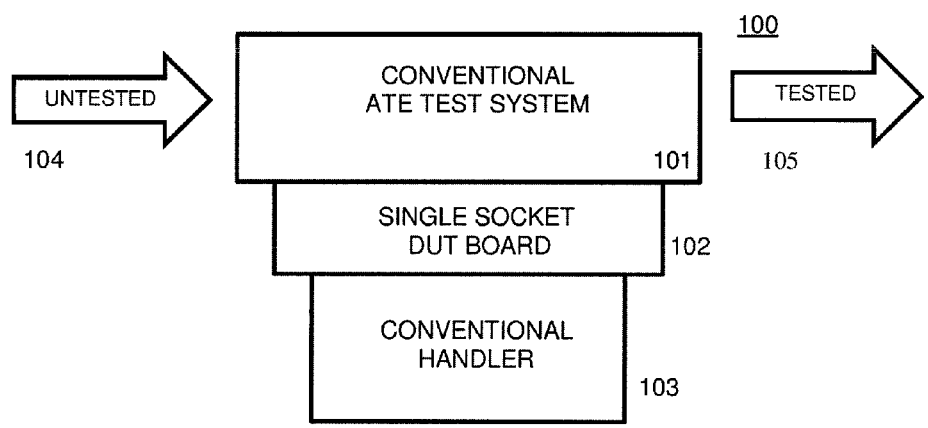
FIG. 1A illustrates a conventional standard flow test cell for semiconductor devices.
Figure 1B:
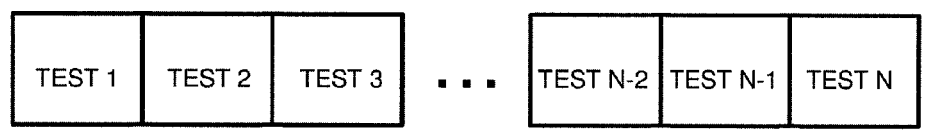
FIG. 1B illustrates the sequential testing arrangement of a conventional standard flow test cell for semiconductor devices.
Figure 5A:
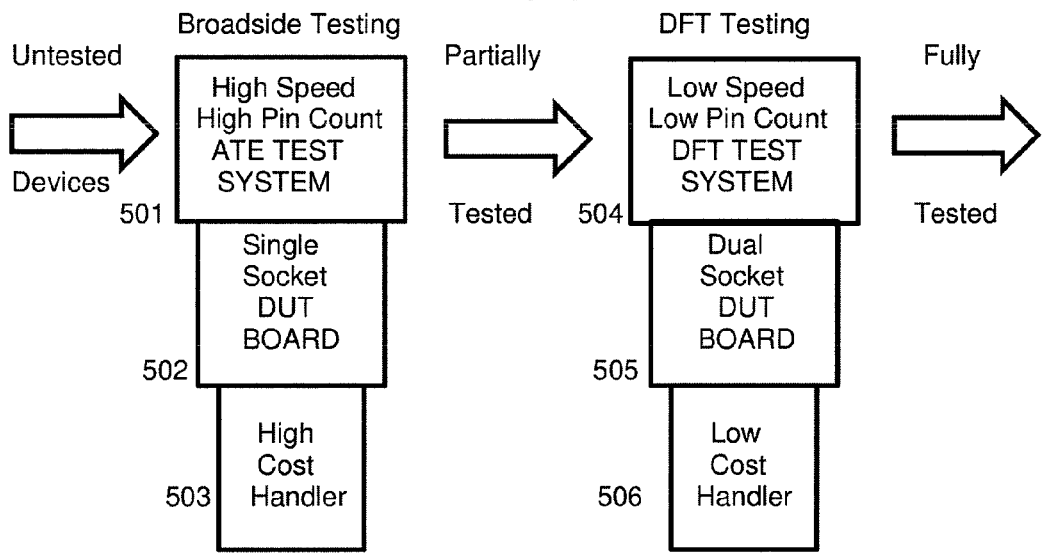
FIG. 5A illustrates a system of PCT testing utilizing two independent handlers and two independent testers.
Figure 5B:
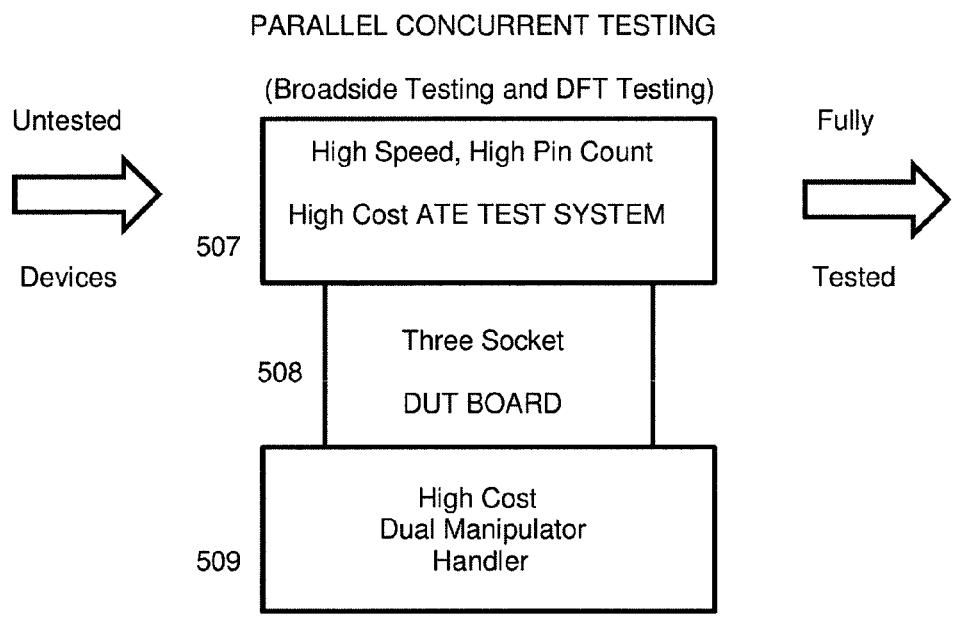
FIG. 5B illustrates an integrated system of PCT testing that utilizes a single handler and a single tester.

In contrast to the standard flow test cell previously discussed with regard to FIG. 1A and FIG. 1B, two forms of PCT test systems are illustrated in FIG. 5A and FIG. 5B. In FIG. 5A, a system for PCT testing utilizing two independent handlers and two independent testers is illustrated, which includes both concurrent and parallel testing. FIG. 5A illustrates untested semiconductor devices being input into an ATE test system for broadside (BS) testing. The ATE test system is generally characterized by operating at high speed, utilizing a high pin count, and having a high cost. The ATE test system generally includes a single socket DUT board, and a high cost, tri-temperature handler with thermal control. The ATE test system outputs partially tested semiconductor devices.

At this point, the partially tested semiconductor devices are transferred to a DFT test system for DFT testing. The transfer between the ATE test system and the DFT test system can be performed manually or in an automated manner. The DFT test system is generally characterized as operating at low speed, utilizing a low pin count, and having a relatively low cost. The DFT test system also generally includes a dual socket DUT board, and a low cost handler. Upon completion of DFT testing, the DFT test system outputs the fully tested semiconductor devices.

FIG. 5B illustrated an integrated system of PCT testing that utilizes a single handler and a single tester. The integrated PCT test system conducts sequential BS tests on semiconductor devices concurrently with DFT tests utilizing a single DM handler. In this configuration, untested semiconductor devices are input into the integrated PCT test system, which performs all of the required BS testing and DFT testing on the semiconductor devices, after which the semiconductor devices are output from the integrated PCT test system. The integrated PCT test system is generally characterized by operating at a high speed, utilizing a high pin count, and having a relatively high cost. The integrated PCT test system includes a three socket DUT board, and a tri-temperature handler having dual manipulators. The operational advantages include a higher throughput, a lower overall cost, a lower complexity, and a smaller physical footprint, which results in greater efficiencies than conventional test systems.

Figure 6:
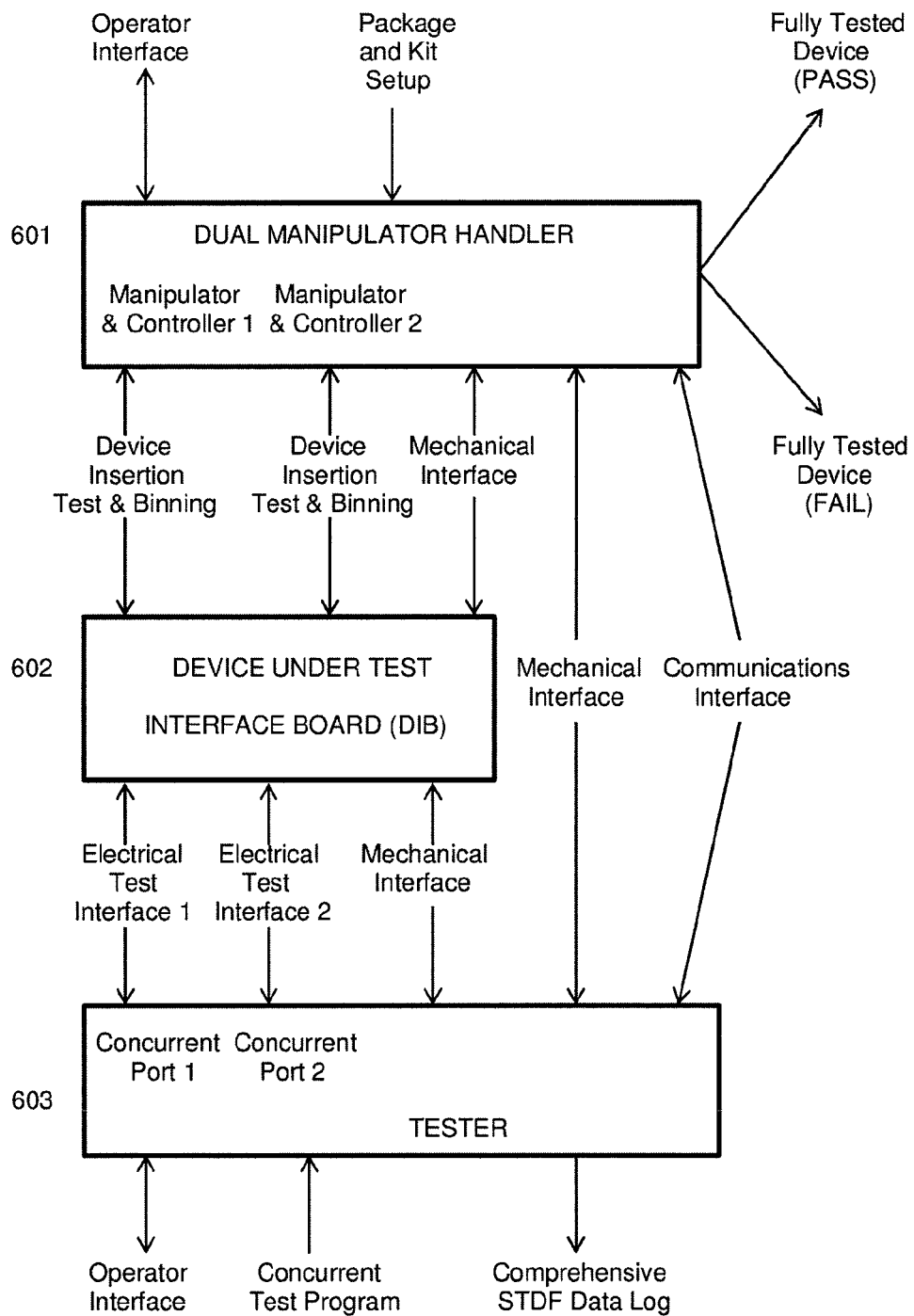
FIG. 6 show an exemplary configuration of an integrated PCT two-pass test cell.

An exemplary configuration of an integrated PCT two-pass test cell is illustrated in FIG. 6. The integrated PCT test cell includes a dual manipulator (DM) handler 601, which includes a first manipulator and controller and a second manipulator and controller. The DM handler 601 includes an operator interface and an interface for package and kit setup. The DM handler 601 interfaces with the device under test interface board (DIB) 602 by device insertion, testing, and binning for semiconductor devices being handled by each of the first and second manipulator and controllers.

The integrated PCT two-pass test cell also includes a mechanical interface between the DM handler 601, the DIB 602, and the tester 603. The tester interfaces with the DIB electrically via concurrent port 1 and concurrent port 2. Additionally, the tester 603 also includes an operator interface and an input for the concurrent test program. The tester further includes a test management control system that tracks a location and testing status for each semiconductor device moving through the parallel concurrent test system, correlates all of the broadside testing results and DFT testing results for each semiconductor device, and stores composite test results in a composite test results database. The stored composite test results database is accessible locally at a location of the parallel concurrent test system, and is accessible remotely through a network from a location other than the location of the parallel concurrent test system.

Further the integrated PCT two-pass test cell includes both a mechanical interface and a communications interface directly between the DM handler 601 and the tester 603. At the completion of the parallel concurrent BS testing and DFT testing, the DM handler 601 outputs the fully tested semiconductor devices into two different locations, depending upon whether the tested semiconductor devices have passed, or have failed all or some designated portion of the testing.

As discussed above, the integrated PCT two-pass test cell utilizing a single DM handler is characterized by having a short test time, high ATE utilization, high throughput, and high output per unit area of test floor space. The integrated PCT two-pass test cell reduces the test floor area required for the supporting test cell hardware, because only one tester and one handler are required instead of two. The integrated test cell also reduces the product handling and handling time by eliminating the need to manually transfer partially tested devices from the output of the first handler to the input of the second handler. This characteristic provides an efficient way of sending all devices tested at the first handler (pass or fail) into test at the second handler. Additionally, a single and complete composite data log is generated that correlates the first pass data results with the second pass data results. Thus, test floor management of the lot testing is easier, more efficient, and less error prone. Further, operator intervention is reduced.

Figure 7A:
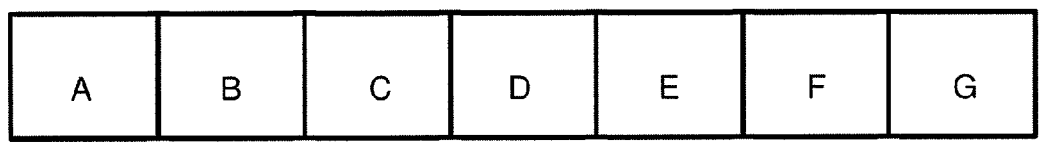
FIG. 7A illustrates an exemplary semiconductor test program sequence without DFT.
Figure 7B:
FIG. 7B illustrates an exemplary semiconductor test program sequence with DFT.

Before discussing the operational flow of PCT testing using an STD handler and PCT testing using a DM handler, a discussion of how the implementation of DFT reduces testing time is provided. Without DMT, an exemplary test program might have the structure illustrated in FIG. 7A, wherein each block A through G is a broadside test. However, with the application of DFT techniques, the testing time for this same exemplary test program can be reduced as illustrated in FIG. 7B. In FIG. 7B, broadside tests A and C are still performed. However, a DFT scan test has replaced the previous broadside tests B, D, E, F, and G. As a result, the overall test time in FIG. 7B is shorter than the previous overall test time illustrated in FIG. 7A where only broadside tests are conducted. DFT testing is particularly effective in reducing test complexity.

Figure 8A:
FIGS. 8A, 8B, and 8C illustrate three scenarios for changing for a standard sequential test flow to a concurrent test flow.
Figure 8A:
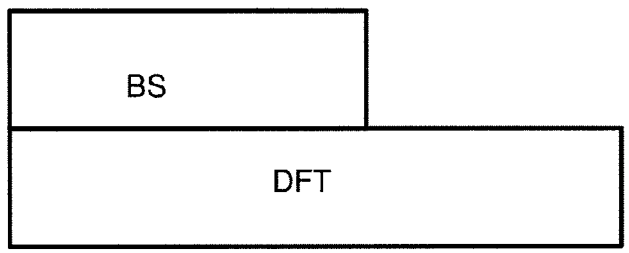
Figure 8B:
Figure 8B:
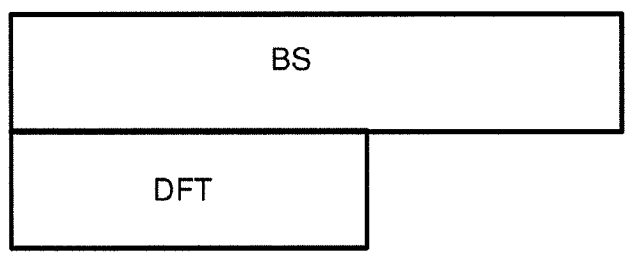
Figure 8C:
Figure 8C:
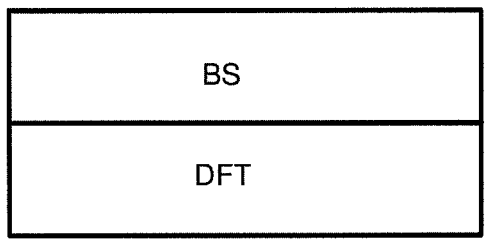

The overall test time utilizing DFT testing can be further reduced by conducting DFT testing concurrently with broadside testing. Using PCT testing with an STD handler, three possible scenarios for changing from a standard DFT/BS test to a concurrent DFT/BS test are illustrated in FIGS. 8A, 8B, and 8C. In FIG. 8A, the DFT test is longer than the BS test. When the DFT test and the BS test are performed concurrently, the overall test time is the duration of the longer DFT test. In FIG. 8B, the BS test is longer than the DFT test. When the BS test and the DFT test are performed concurrently in this situation, the overall test time is the duration of the longer BS test. In FIG. 8C, the BS test the DFT test require the same amount of time. Thus, the overall test time is the duration of either the BS test or the DFT test. When the BS test and the DFT test are of the same duration, the greatest overall reduction in the overall test time is achieved, which would be 50%.

Figure 8D:
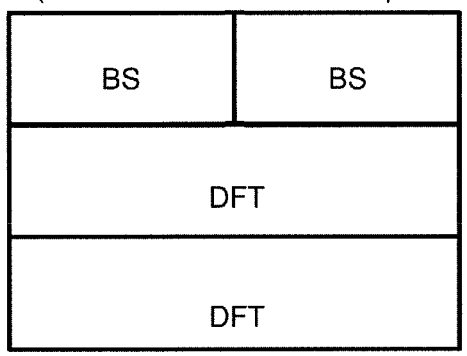
FIG. 8D illustrates an efficient scenario for conducting PCT testing utilizing a DM handler with two manipulators.

FIG. 8D provides an illustration of a fully optimized integrated PCT two-pass test cell that utilized a DM handler having two manipulators. As illustrated therein, BS testing is performed sequentially on semiconductor devices, and is performed concurrently with two forms of DFT testing. In the fully optimized configuration, as illustrated in FIG. 8D, the fully optimized integrated PCT two-pass test cell can test two semiconductor devices in as little as two-thirds of the time that a conventional test system can test one semiconductor device. As a result, a reduction in test time of up to 66.6% can be achieved compared to that of a conventional test system. Additionally, the DFT tests are executed on separate semiconductor devices inserted into two different DFT test sockets. A substantial benefit of this configuration is that there are no significant thermal management issues associated with the concurrent DFT testing. Further, no switching relays are required, and the connectors between the ATE and the DFT test sites are small in number and utilize the unused resources on the ATE that are typically available when testing high pin count devices. When the DFT tests are longer in duration that two of the BS tests, some portion of the DFT tests can optionally be moved to the broadside test site and executed.

Figure 9:
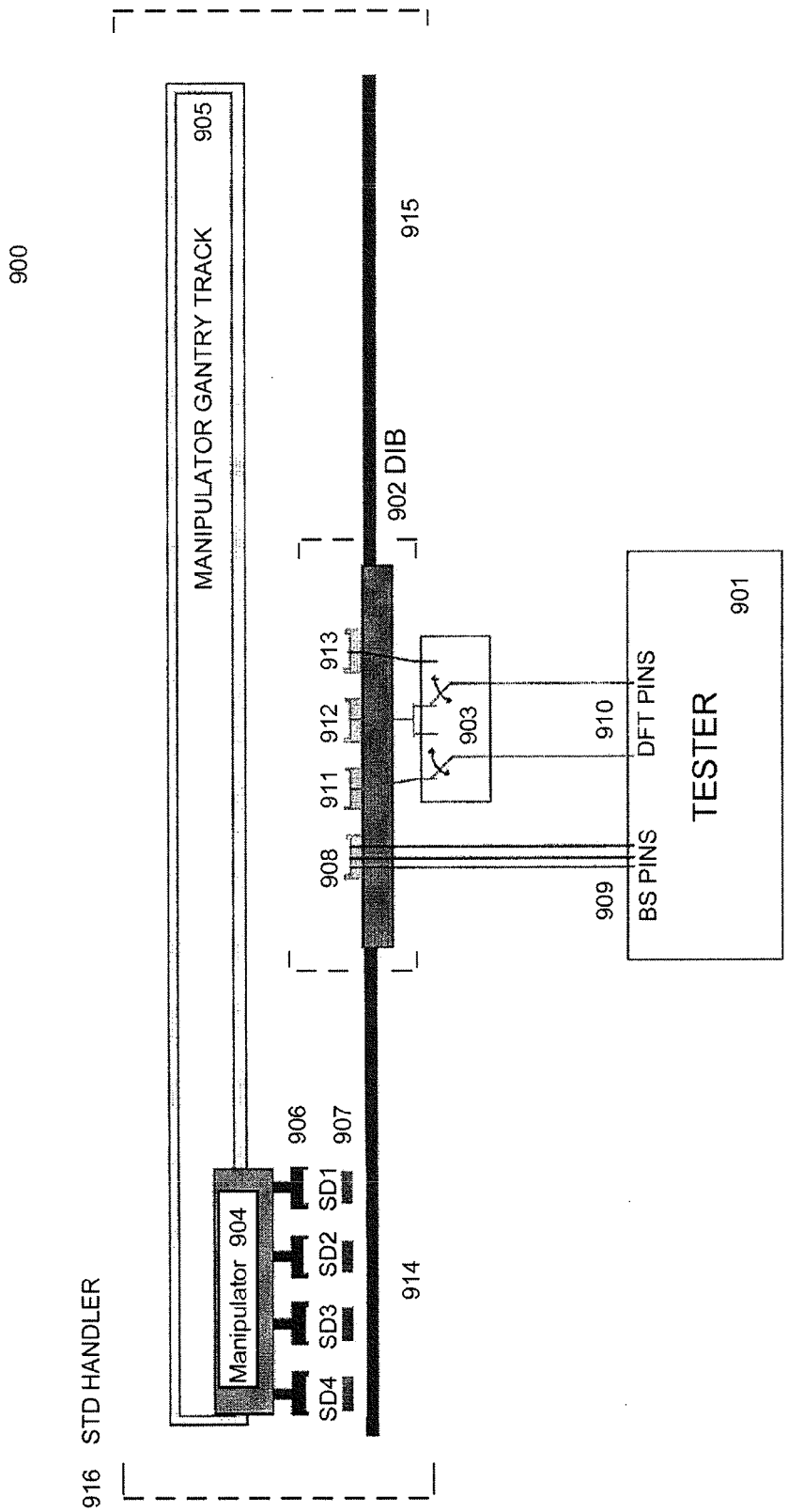
FIG. 9 provides an exemplary illustration of an ATE test cell that uses a STD gantry handler with a single manipulator.

An exemplary illustration of an ATE configured to implement a PCT stepping pattern is illustrated in FIG. 9. In FIG. 9, the test cell is characterized by having a single manipulator (one head), four (4) chucks, and an STD gantry based handler, where the input is at one end of the gantry and the output is at the other end of the gantry. In FIG. 9, the PCT test cell 900 has three primary components, which are the STD handler 916, the DUT Interface Board (DIB) 902, and the tester 901. The switching relays 903 (a DPDT with two output legs tied together) can be located either on the DIB 902 or in the tester 901. The manipulator 904 includes four manipulator chucks 906, which are used to pick up, move, insert, and drop off semiconductor devices 907, identified as SD1, SD2, SD3, and SD4, being tested. The manipulator chucks retract, extend, pickup, and drop off, dependent upon the particular task being performed at the time. The manipulator 904 moves horizontally back and forth across the manipulator gantry track 905. The STD handler's input queue, where the manipulator picks up untested semiconductor devices, is identified as 914. The STD handler's output queue, where the manipulator drops off the tested semiconductor devices, is identified as 915.

The DUT Interface Board (DIB) 902 includes four (4) test contactors (sockets). Broadside test socket 908 is configured for broadside (BS) testing, and is in electrical contact with the many BS pins 909 of tester 901. DFT Test sockets 911, 912, and 913 are configured for DFT testing and are connected to switching relays 903, which are in electrical contact with the DFT pins 910 of tester 901. There are fewer DFT pins 910 than there are BS pins 909.

An exemplary non-limiting example of a test cell's PCT stepping pattern operational flow, utilizing the STD gantry handler with a single manipulator, is illustrated in FIG. 9A through FIG. 9K.

Figure 9B:
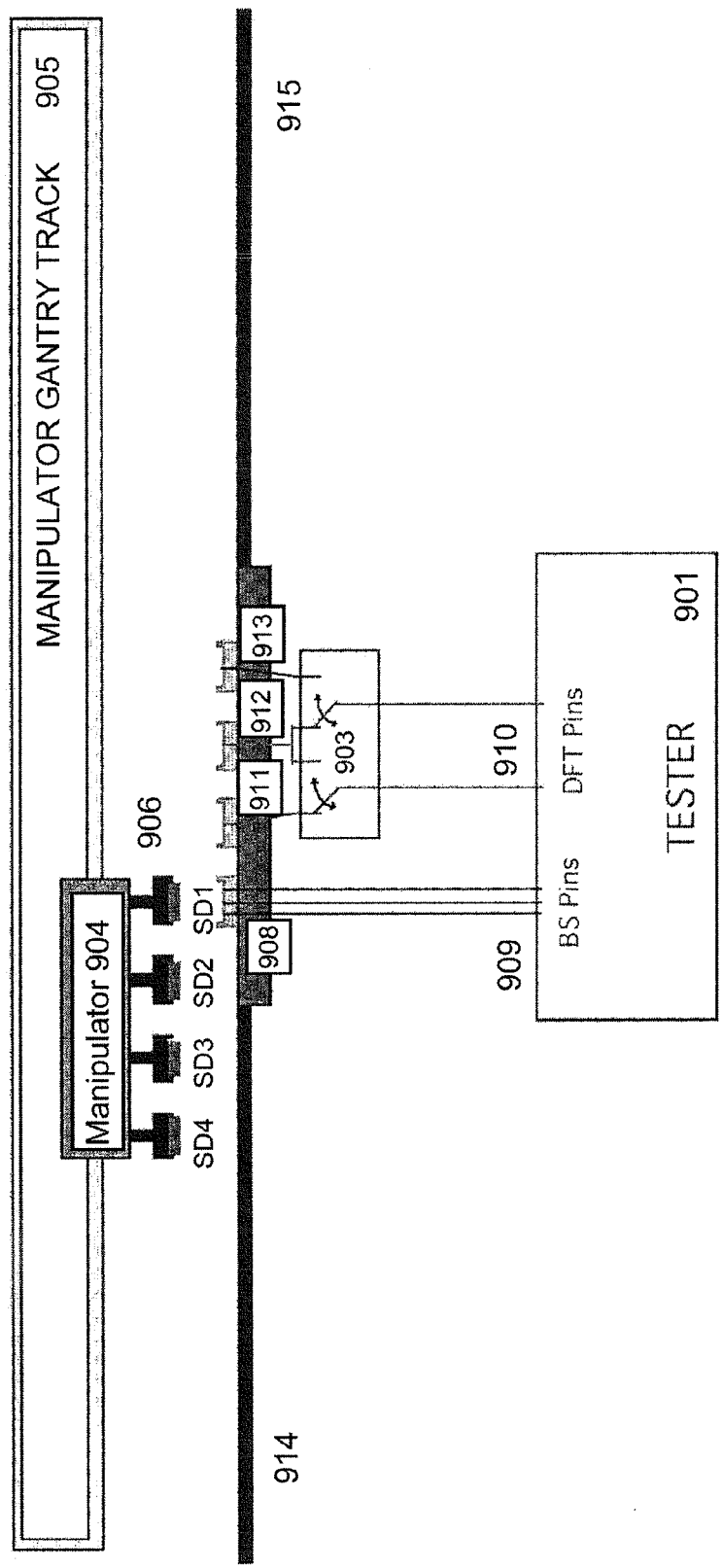
Figure 9C:
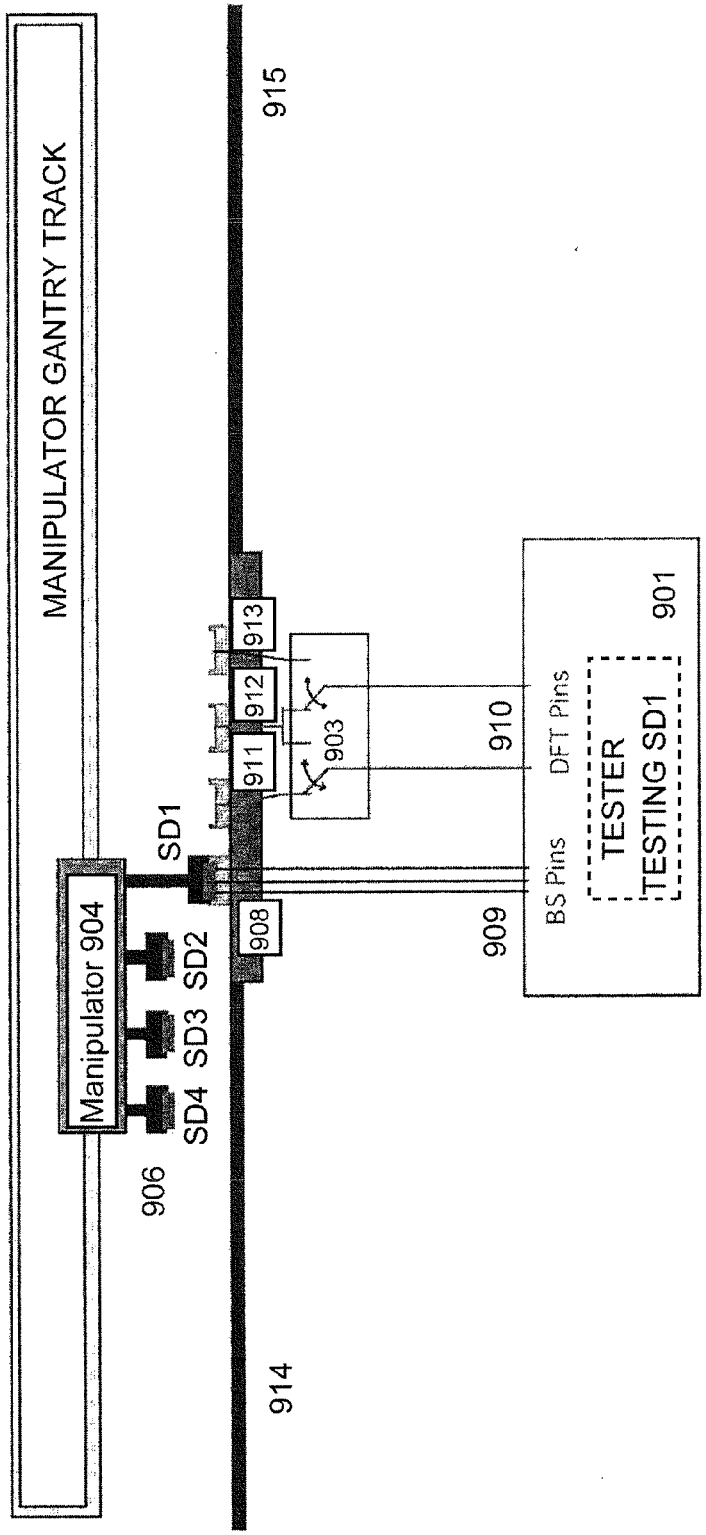
Figure 9D:
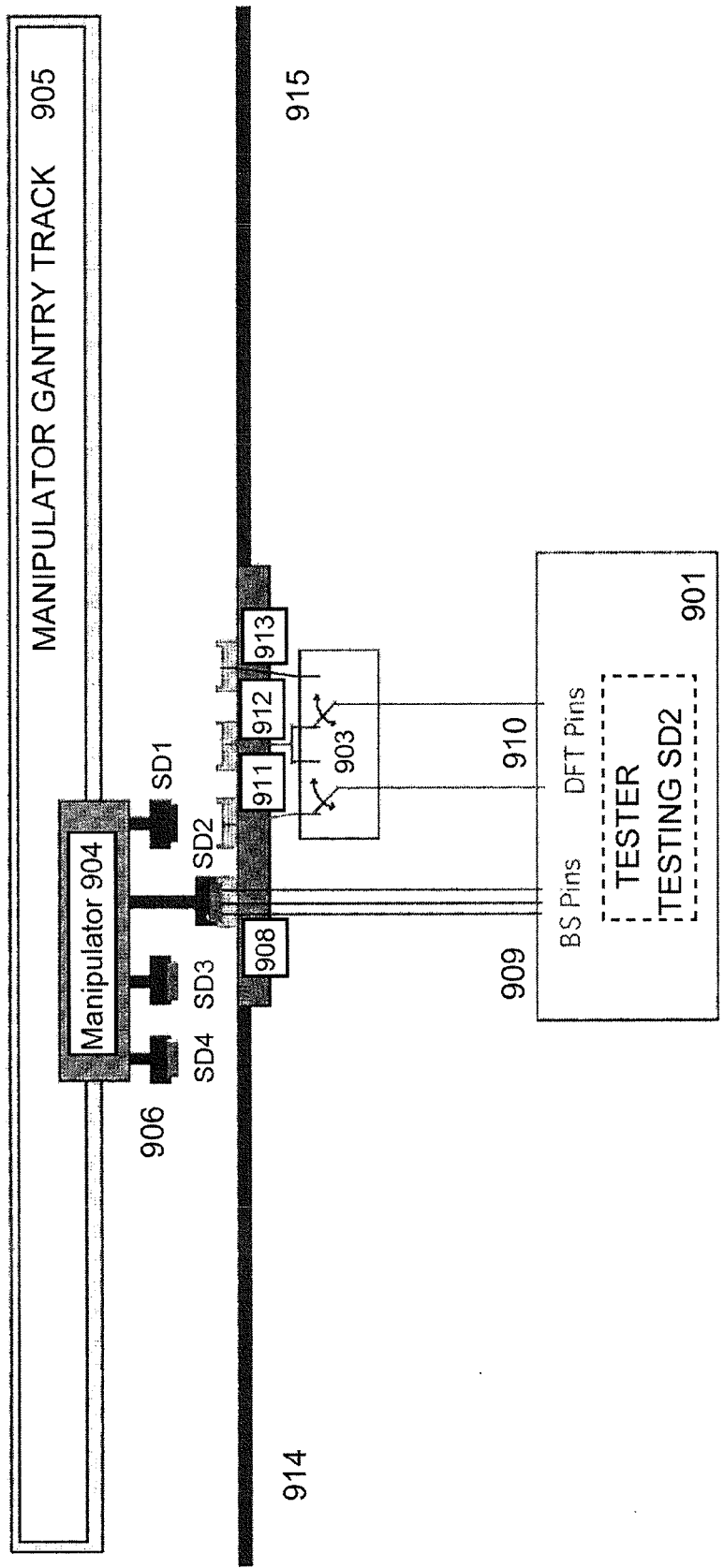
Figure 9G:
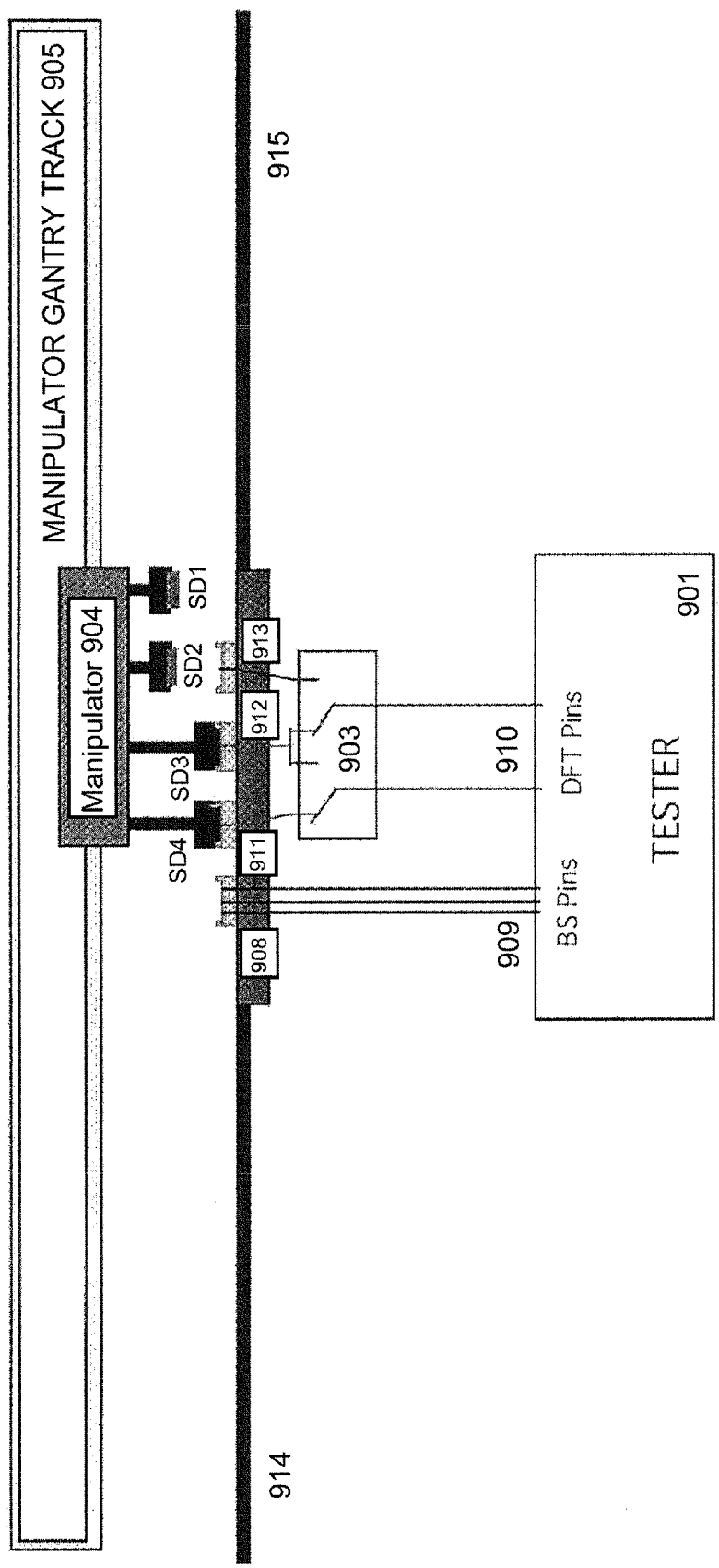

After initialization of the test cell, the PCT testing process begins with the manipulator 904 extending the four manipulator chucks 906 to engage the semiconductor devices SD1, SD2, SD3, and SD4 to be tested that are located in the area of the handler's input queue 914, as illustrated in FIG. 9A. After retracting the manipulator chucks 906, the manipulator 904 moves horizontally (from the left to right in FIG. 9A), and stops at a position where the manipulator chuck holding SD1 is directly above the BS test socket 908, as illustrated in FIG. 9B. In FIG. 9C, the manipulator chuck holding SD1 is extended to place SD1 into contact with the BS test socket 908. At this time, a BS test is performed on SD1 by tester 901 through BS pins 909.

After completion of the BS test on SD1, the manipulator 904 retracts the manipulator chuck holding SD1, and again moves horizontally to the right to a position where the manipulator chuck holding SD2 is positioned directly above the BS test socket 908. At this time, the manipulator chuck holding SD2 is extended to place SD2 into contact with the BS test socket 908, after which a BS test is performed on SD2 by tester 901. See FIG. 9D.

After completion of the BS test on SD2, the manipulator 904 retracts the manipulator chuck holding SD2, and moves horizontally to the right to a position where the manipulator chuck holding SD3 is positioned directly above the BS test socket 908. The manipulator chuck holding SD1 is extended to place SD3 into contact with the BS test socket 908 at the same time that the manipulator chucks holding SD1 and SD2 extend to place SD1 and SD2 into contact with DFT test sockets 912 and 911, respectively. See FIG. 9E. At this time, a BS test is performed on SD3, while partial DFT tests are performed on SD1 and SD2.

After completion of the BS test on SD3 and the partial DFT tests on SD1 and SD2, the manipulator 904 retracts the manipulator chucks holding SD1, SD2, and SD3, and moves to the right to a position where the manipulator chuck holding SD4 is positioned directly above the BS test socket 908. At this time, the manipulator chuck holding SD4 is extended to place SD4 in contact with BS test socket 908 at the same time that the manipulator chucks holding SD1 and SD2 extend to place SD1 and SD2 into contact with DFT test sockets 913 and 912, respectively. Additionally, switching relay 903 moves the corresponding switches so that DFT pins 910 are in contact with DFT test sockets 912 and 913. See FIG. 9F. At this time, a BS test is performed on SD4, while DFT testing is completed on SD1 and SD2.

After completion of the BS test on SD4 and the DFT tests on SD1 and SD2, the manipulator chucks holding SD1, SD2, and SD4 are retracted. The manipulator 904 then moves to the right where the manipulator chucks holding SD3 and SD4 are positioned directly above DFT test sockets 912 and 911, respectively. At this time the manipulator chucks holding SD3 and SD4 are extended to place SD3 and SD4 into contact with DFT test sockets 912 and 911, respectively, and are then retracted leaving SD3 and SD4 in DFT test sockets 912 and 911, respectively, for later testing. Additionally, switching relay 903 moves the corresponding switches so DFT pins 910 are in contact with DFT test sockets 911 and 912. See FIG. 9G.

After retraction of the manipulator chucks that dropped off SD3 and SD4 for testing, manipulator 904 moves to the right along the manipulator gantry track to the handler drop off queue area 915. At this point, fully tested SD1 and SD2 are placed in the handler drop off queue area 915. See FIG. 9H. The manipulator 904 then retracts the extended manipulator chucks and moves left to the handler input queue area 914 to a position such that the left two manipulator chucks are positioned directed above untested SD5 and SD6. See FIG. 9I. During this process, partially DFT tested SD3 and SD4 remain in contact with DFT test sockets 912 and 911, respectively.

Figure 9J:
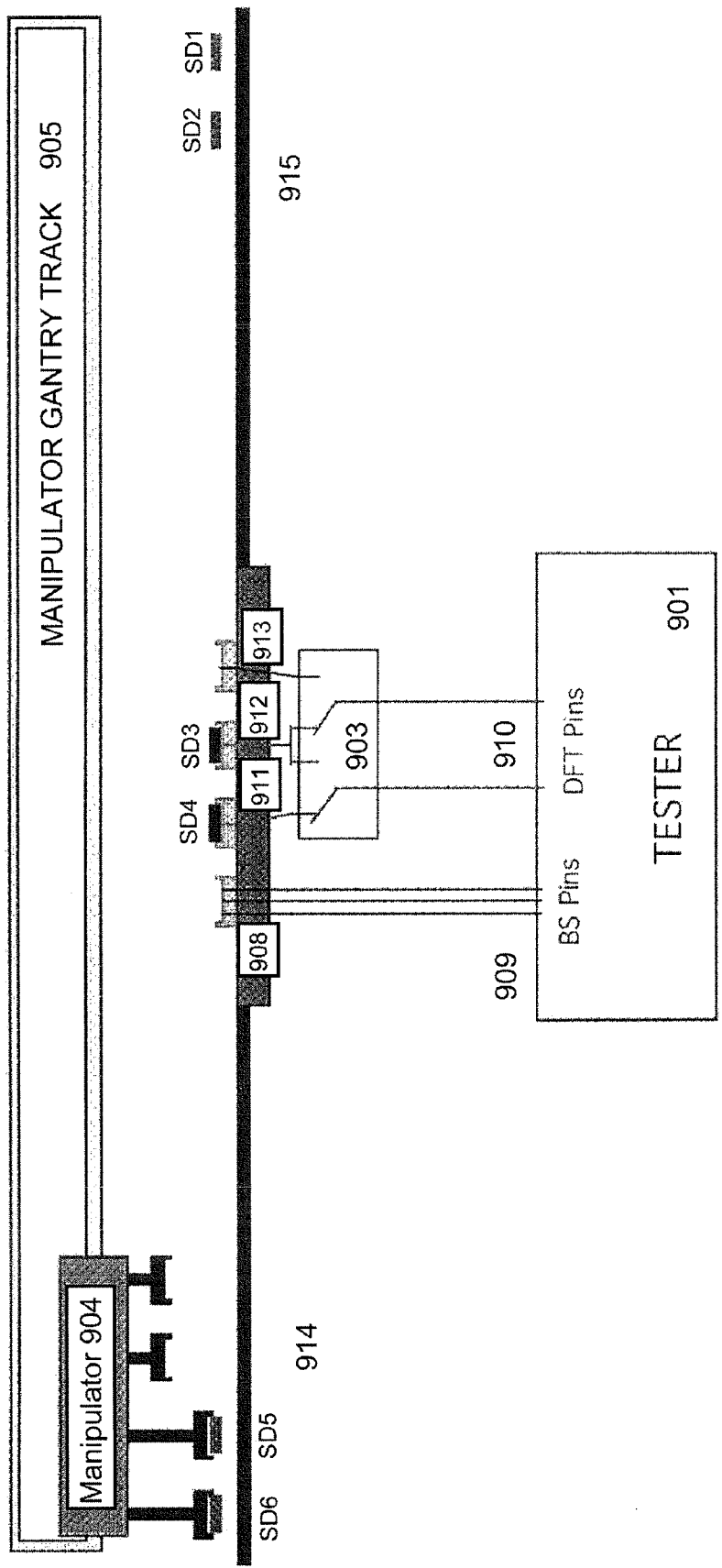
Figure 10D:
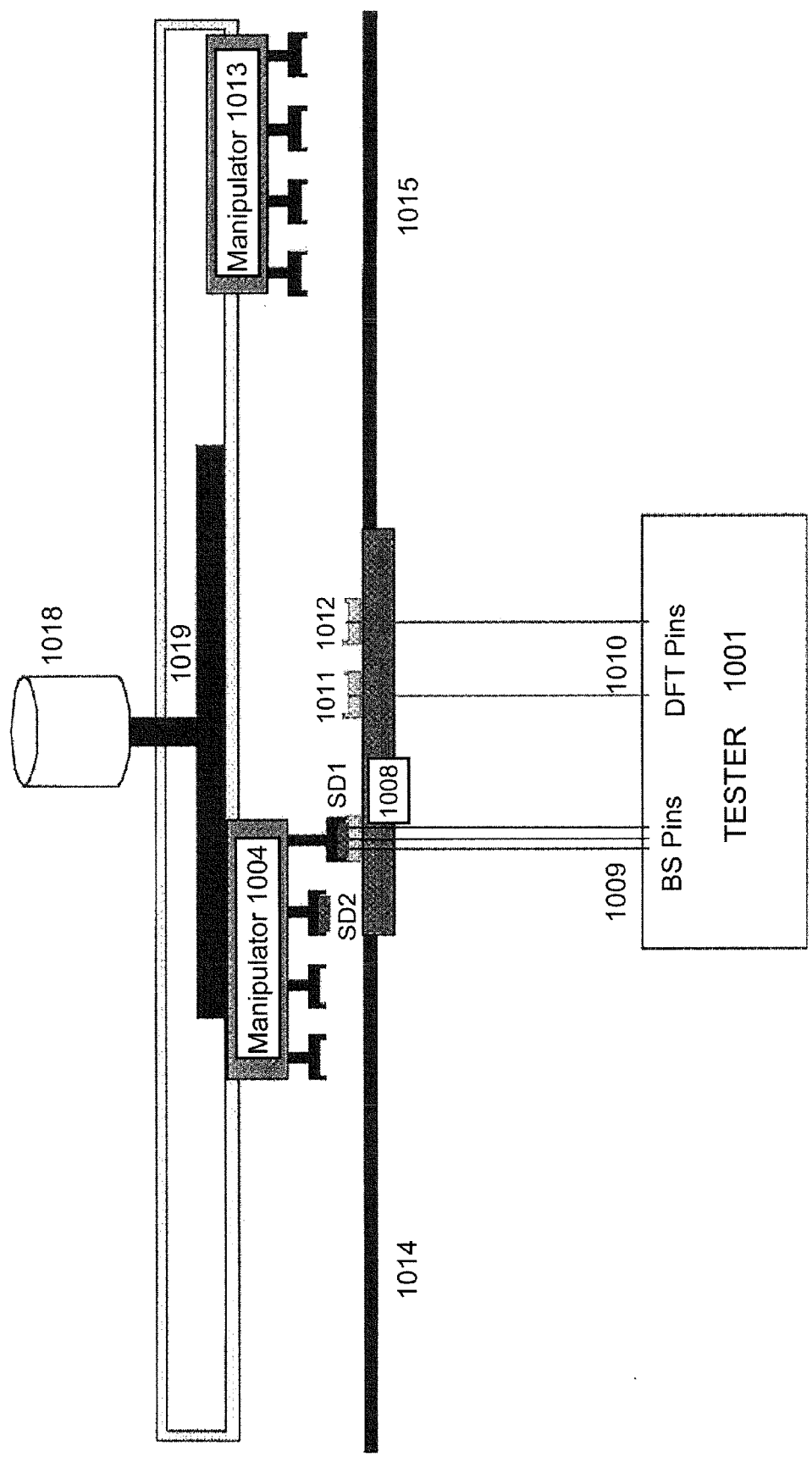
FIG. 10 and FIG. 10A provide an exemplary illustrations of an ATE test cell that uses a DM gantry handler with dual manipulators.
FIG. 10B through FIG. 10R progressively illustrate a semiconductor test cell PCT stepping pattern utilizing a DM gantry handler with dual manipulators.
Figure 10F:
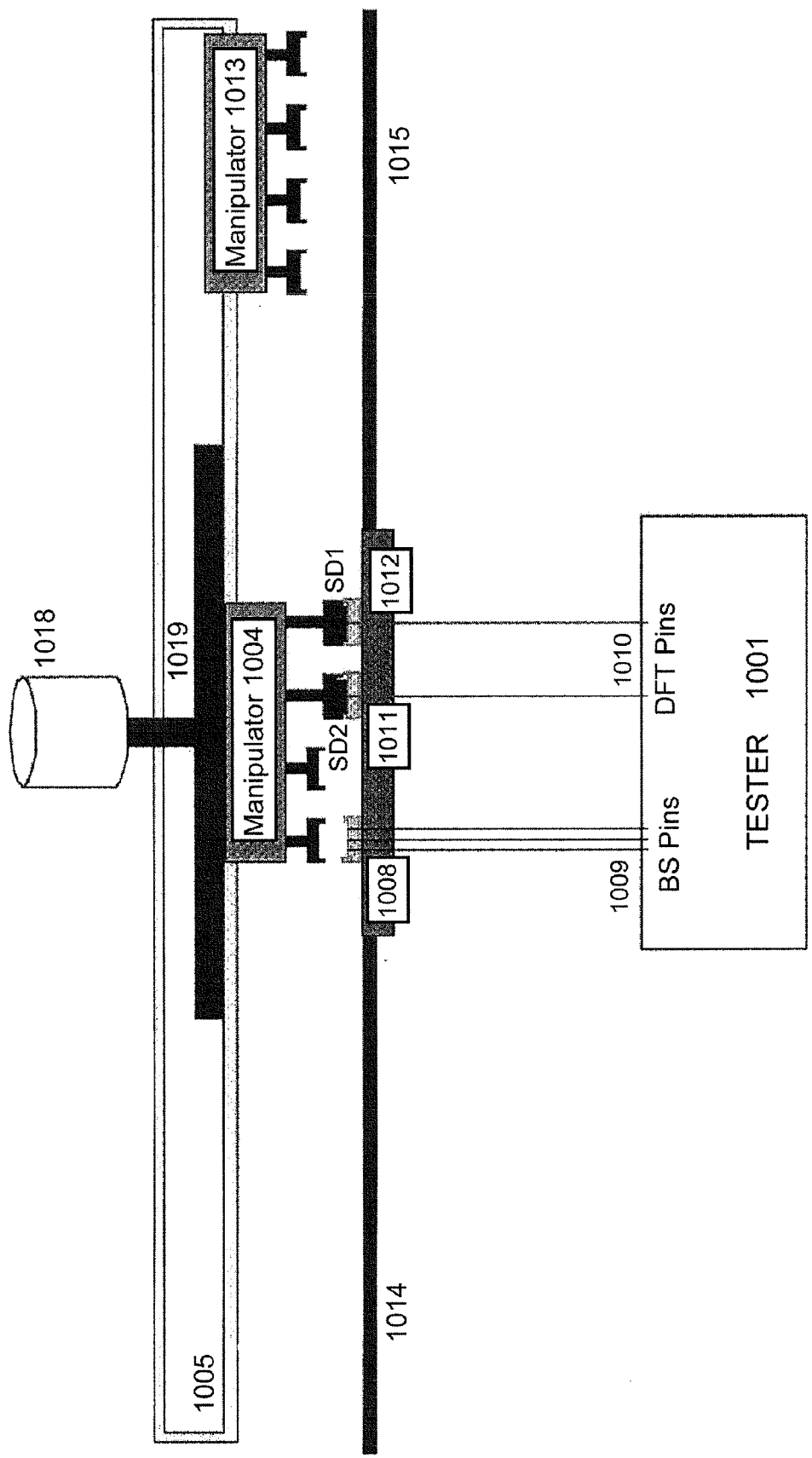
Figure 10H:
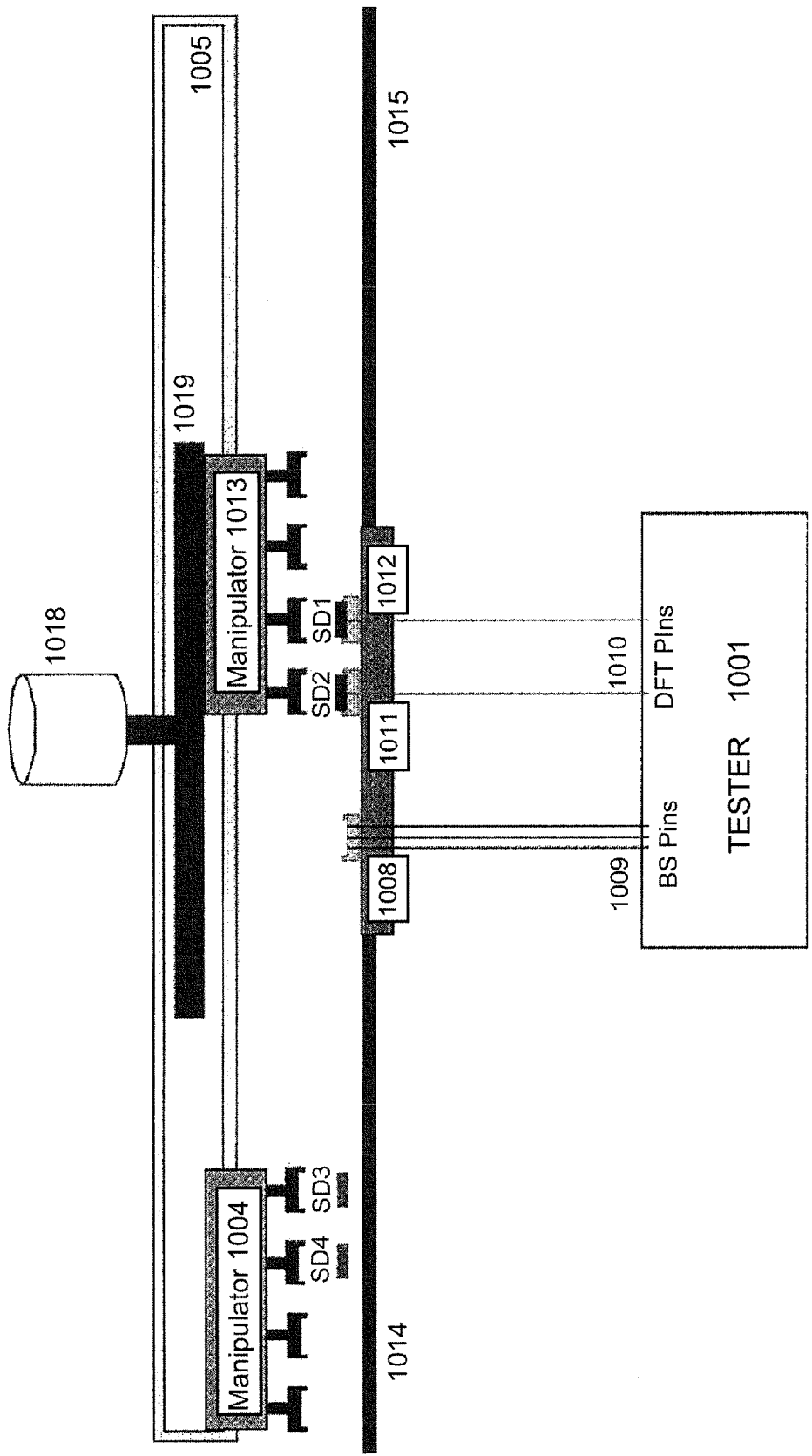
Figure 10I:
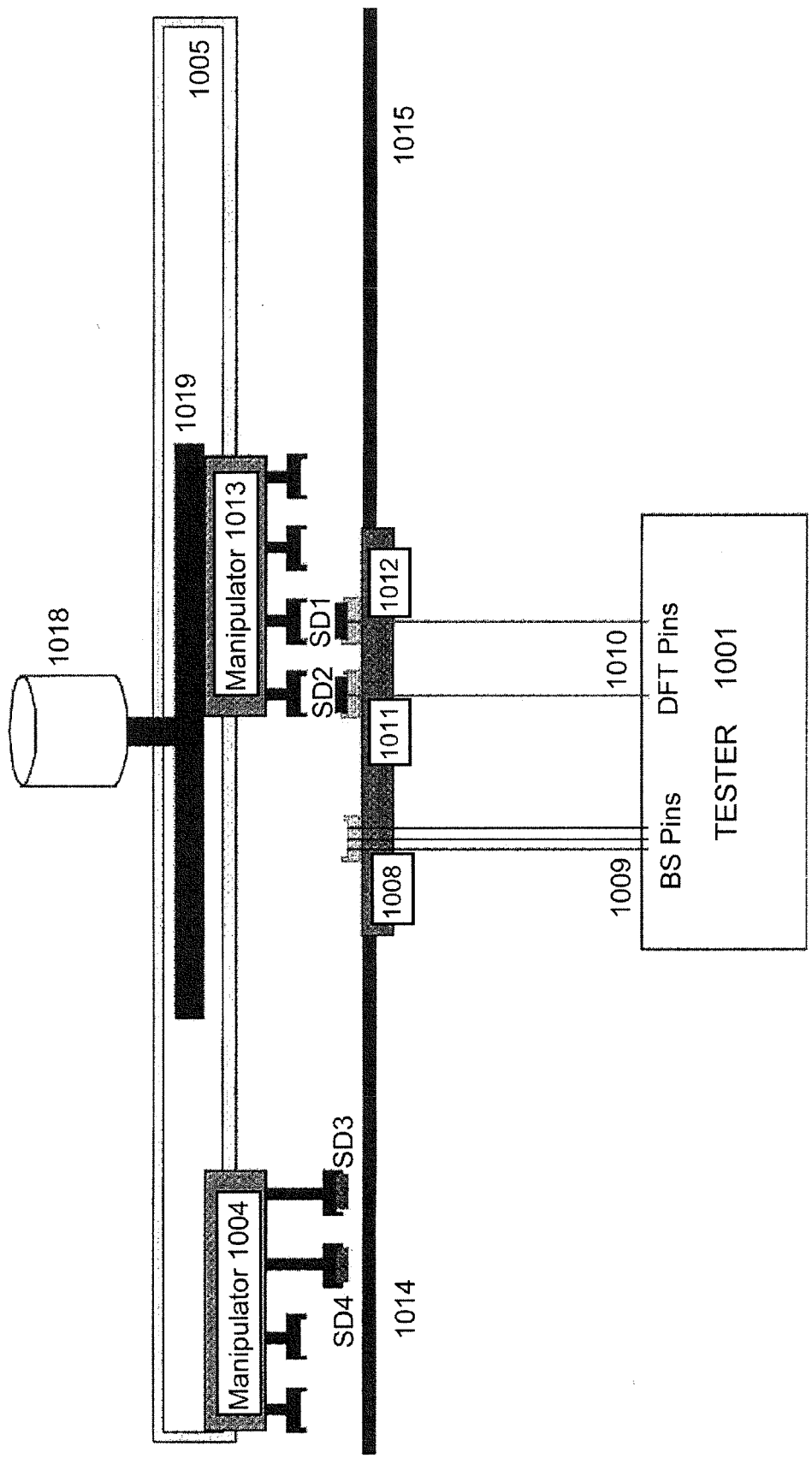
Figure 10M:
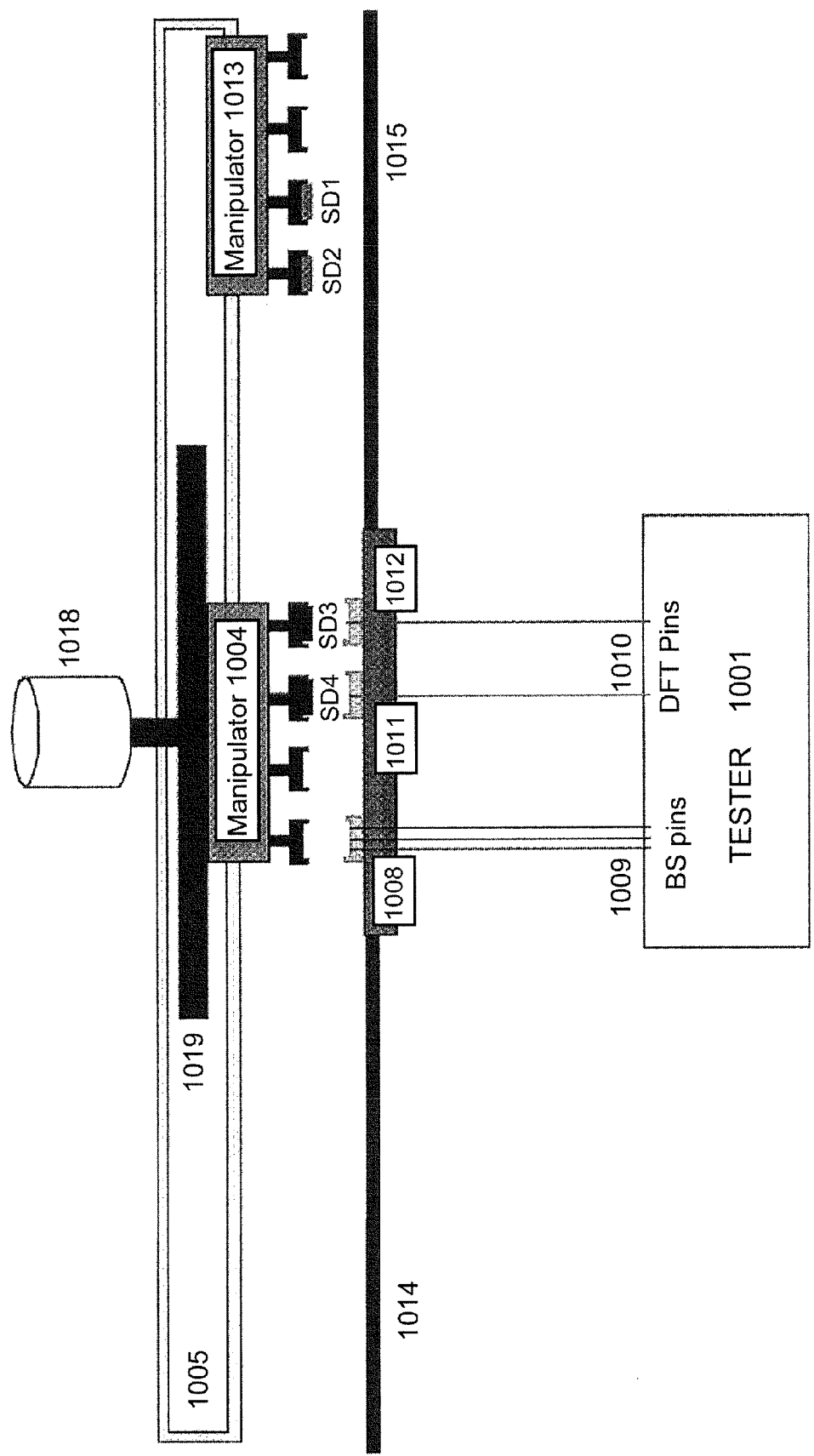
Figure 10N:
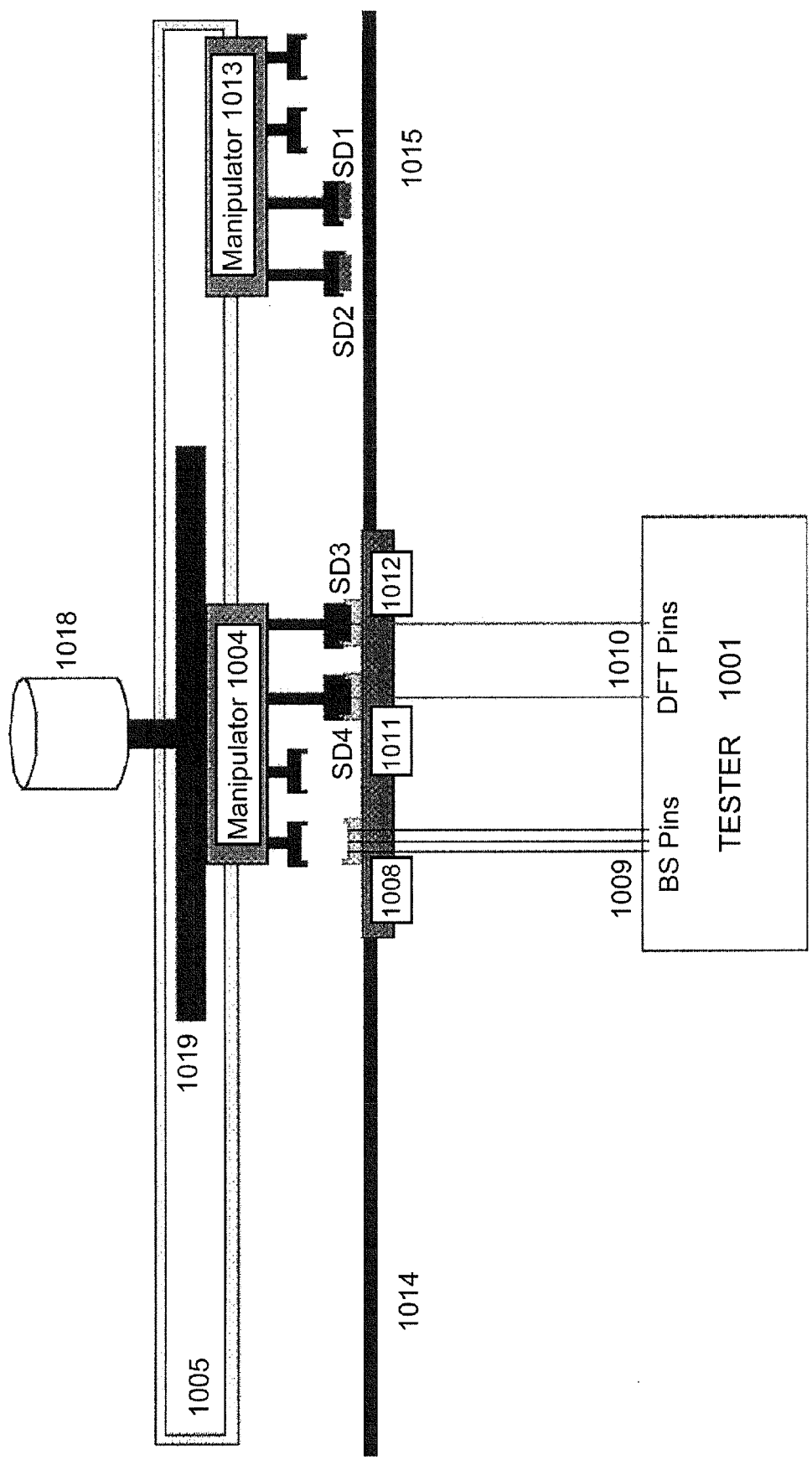
Figure 10P:
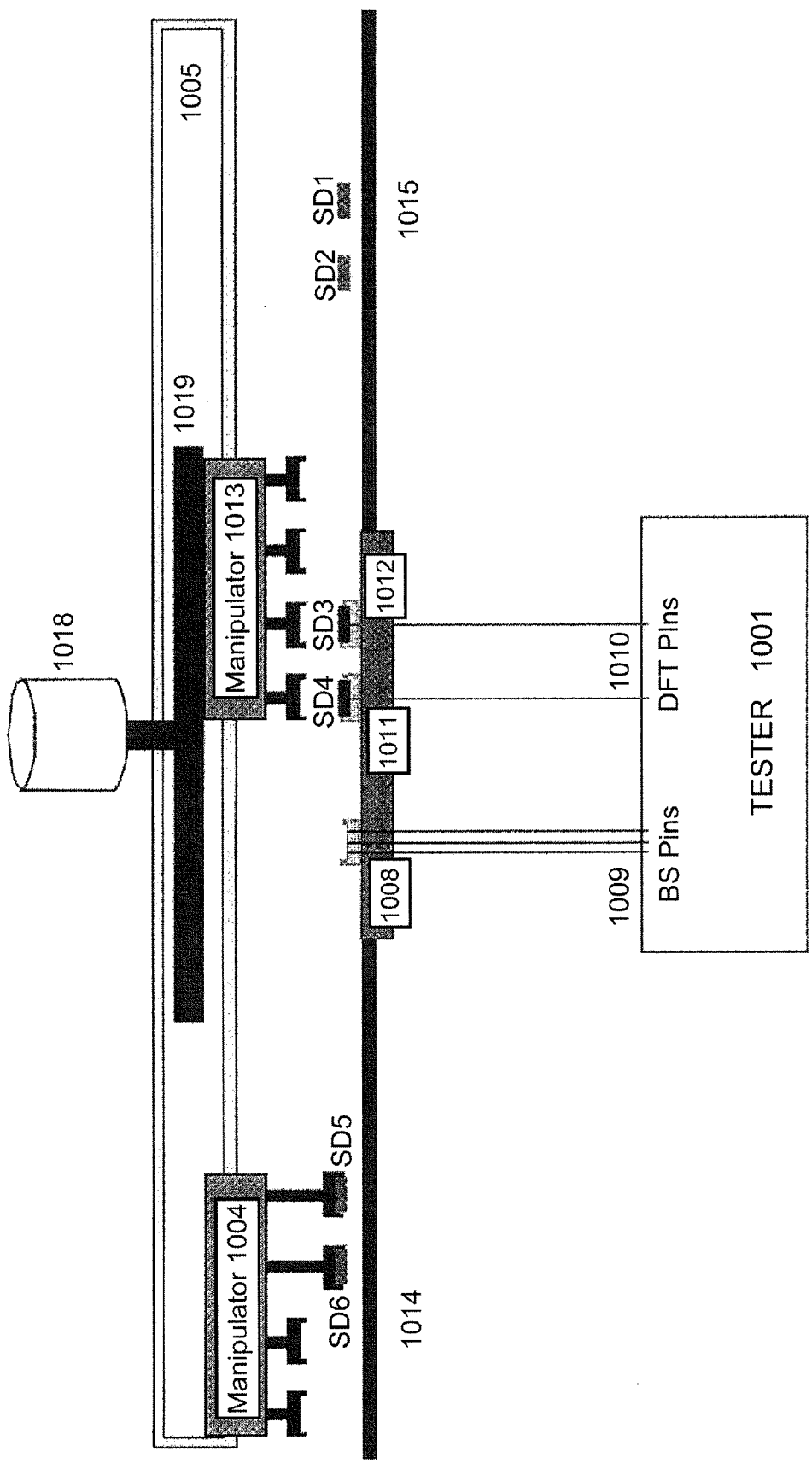
Figure 10Q:
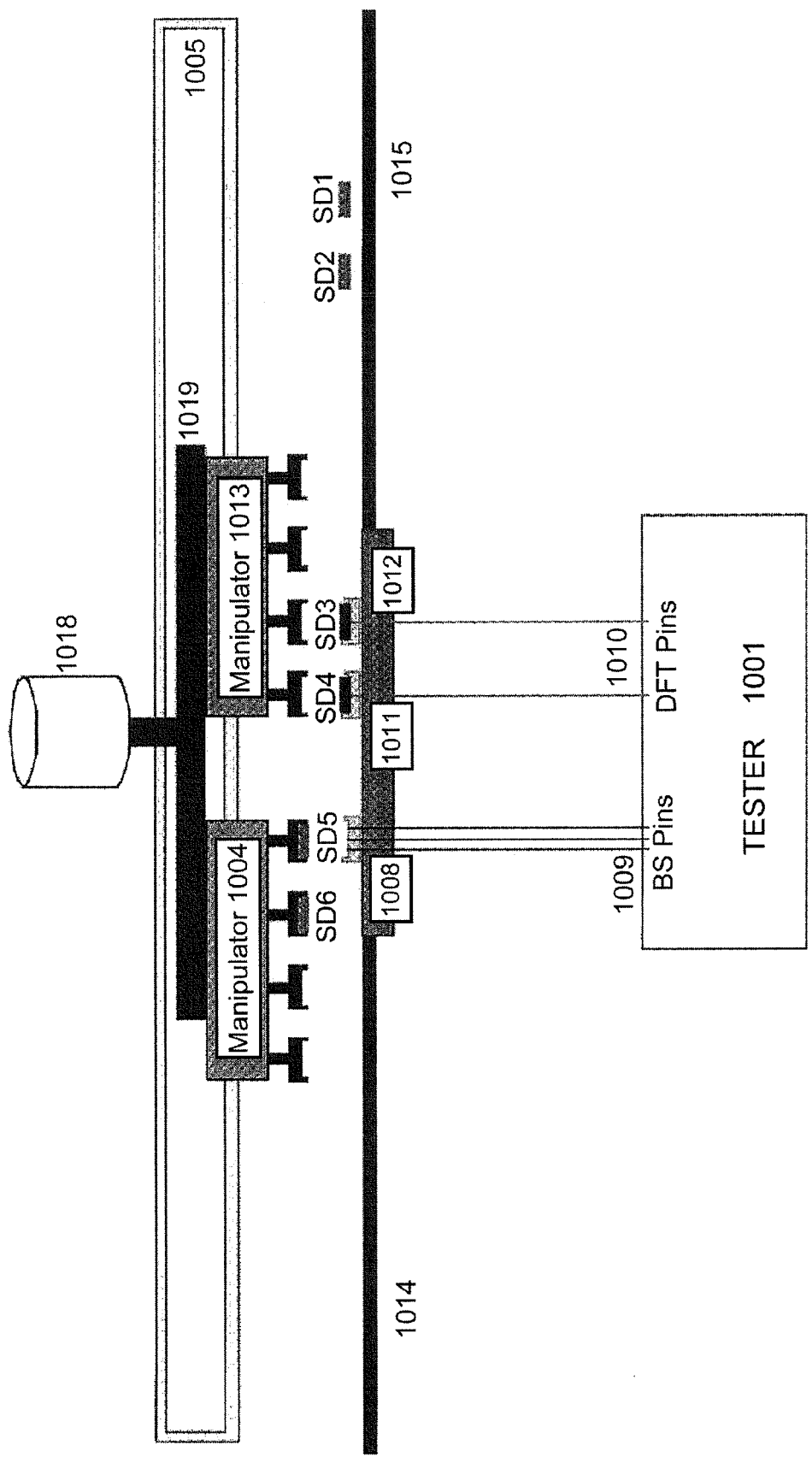

FIG. 9J illustrates the extension of the manipulator chucks positioned directly above SD5 and SD6 so that they can pick up SD5 and SD6. After picking up SD5 an SD6, the manipulator chucks holding SD5 and SD6 are retracted. The manipulator 904 then moves to the right so that the manipulator chuck holding SD5 is in a position directly above BS test socket 908, and the far right two manipulator chucks that are currently empty are located at a position directly above SD3 that is located in DFT test socket 912 and SD4 that is located in DFT test socket 911.

At this point, the manipulator chuck holding SD5 extends to place SD5 in contact with BS test socket 908, at the same time that the manipulator chucks located directly above SD3 and SD4 extend to be in contact with SD3 and SD4. See FIG. 9K. When tester 901 establishes electrical contact with SD3, SD4 and SD5, the second cycle of semiconductor device testing begins. This cyclical process continues until all of the semiconductor devices are completely tested, or until the testing process is interrupted by human intervention.

An exemplary illustration of an alternative ATE configuration designed to efficiently implement a PCT stepping pattern is illustrated in FIG. 10. In FIG. 10, the test cell is characterized by having a dual manipulators (two heads), where each manipulator has four PnP manipulator chucks, a PnP gantry based DM handler track, where the input is located at one end of the gantry track and the output is located on the other end of the gantry track. In FIG. 10, the PCT test cell 1000 has three primary components, which are the DM handler 1016, the DUT Interface Board (DIB) 1017, and tester 1001. The DM handler 1016 includes two separate manipulators. The first manipulator is identified as 1004 and includes four manipulator chucks 1006. The second manipulator is identified as 1013 and includes four manipulator chucks 1003. The manipulator chucks 1006 and 1003 are used to pick up, move, insert, and drop off semiconductor devices 1007, identified as SD1, SD2, SD3, and SD4, being tested. The manipulator chucks retract, extend, pickup and drop off, dependent upon the particular task being performed at the time. Manipulators 1006 and 1003 move horizontally back and forth the across the manipulator gantry track 1005. The input queue, where a manipulator 1006 picks upon untested semiconductor devices, is identified as 1014. The output queue, where manipulator 1003 drops off semiconductor devices is identified as 1015.

The DUT Board (DIB) 1017 includes three test contactors (sockets). This configuration is in contrast to the single manipulator configuration of the previously described test cell. Another distinction is that in the present configuration using dual manipulators; switching relays are not required. Broadside test socket 1008 is configured for broadside (BS) testing, and is in electrical contact with the many pins 1009 of tester 1001. DFT test sockets 1011 and 1012 are configured for DFT testing, and are in electrical contact with the DFT pins 1010 of tester 1001. There are fewer DFT pins 1010 than there are BS pins 1009. In FIG. 10A, the stepper plunge motor 1018 is shown, which is attached to plunge bar 1019. The manipulator chucks can plunge independently during the pneumatically controlled first stage movement, but cannot plunge independently during the plunge motor controlled second stage movement.

An exemplary non-limiting example of the test cell's PCT stepping pattern operational flow, utilizing a DM gantry handler with dual manipulators, is illustrated in FIG. 10B through FIG. 10R.

After initialization of the test cell, the PCT testing process begins. In FIG. 10B, the first manipulator 1004 is positioned above semiconductor devices SD1 and SD2. The two first manipulator chucks located on the right side of manipulator 1004 extend to engage SD1 and SD2, as illustrated in FIG. 10C.

After picking up SD1 and SD2, the manipulator chucks holding SD1 and SD2 retract. Then the first manipulator 1004 moves horizontally to the right along the manipulator gantry track 1005 to a location where the manipulator chuck holding SD1 is positioned directly above BS test socket 1008. At that time, the manipulator chuck holding SD1 is extended to place SD1 into contact with the BS test socket 1008. See FIG. 10D. Tester 1001 then performs a BS test on SD1 using BS pins 1009.

After completion of the BS test on SD1, the first manipulator 1004 retracts the manipulator chuck holding SD1, and again moves horizontally to the right to a position where the manipulator chuck holding SD2 is positioned directly above the BS test socket 1008. At this time, the manipulator chuck holding SD2 is extended to place SD2 into contact with the BS test socket 1008. See FIG. 10E. Tester 901 then performs a BS test on SD2.

After completion of the BS test on SD2, the first manipulator 1004 retracts the manipulator chuck holding SD2, and moves horizontally to the right to a position where the manipulator chucks holding SD1 and SD2 are positioned directly above DFT test sockets 1012 and 1011, respectively. The manipulator chucks holding SD1 and SD2 extend to place SD1 and SD2 into contact with DFT test sockets 1012 and 1011, respectively. See FIG. 10F. The manipulator chucks release SD1 and SD2 and are retracted, letting SD1 and SD2 remain in DFT test sockets 1012 and 1011, respectively, See FIG. 10G.

At this point the first manipulator 1004 moves horizontally to the left so that the two manipulator chucks located on the right side of the first manipulator 1004 are positioned directly above SD3 and SD4. At the same time as the first manipulator 1004 is being repositioned, the second manipulator 1013 is moved horizontally to the left to a position where the left two manipulator chucks of the second manipulator 1013 are located directly above SD1 and SD2. See FIG. 10H.

The two manipulator chucks located on the right side of the first manipulator 1004 are then extended to engage SD3 and SD4. See FIG. 10I. The two extended manipulator chucks pick up SD3 and SD4, and are then retracted. The first manipulator 1004 then moves horizontally to the right to a position where the manipulator chuck holding SD3 is located directly above BS test socket 1008. The manipulator chuck holding SD3 is extended to place SD3 into contact with SD test socket 1008, while the manipulator chucks located on the left side of manipulator 1013 extend to engage SD1 and SD2. See FIG. 10J. At this point, the tester 1001 performs a BS test on SD3 and DFT tests on SD1 and SD2, which is denoted the first pass of a testing loop.

Upon completion of the BS test on SD3, but prior to the completion of the DFT tests on SD1 and SD2, the DFT testing of SD1 and SD2 is interrupted. At this point, the manipulator chucks engaging SD1, SD2, and SD3 are retracted, and the first manipulator 1004 moves horizontally to the right to a position where SD4 is located directed above the SD test cell 1008. See FIG. 10K. The manipulator chucks of the second manipulator 1013 holding SD1, SD2 and the manipulator chuck of the first manipulator 1004 holding SD4 are then extended to place SD4 into contact with the BS test socket 1008, and to place SD1 and SD2 into contact with DFT test sockets 1012 and 1011, respectively. See FIG. 10L. At this point, tester 1001 performs a BS test on SD4, while the tester completes the DFT testing of SD1 and SD2.

After completion of the testing, the manipulator chuck of the first manipulator 1004 holding SD4 and the manipulator chucks of the second manipulator 1013 holding SD1 and SD2 are retracted. The second manipulator 1013 having manipulator chucks holding SD1 and SD2 moves horizontally to the right to a location above the output queue 1015, while the first manipulator 1004 moves horizontally to the right to a location where the manipulator chucks holding BS tested SD3 and SD4 are located directly above DFT test sockets 1012 and 1011, respectively. See FIG. 10M.

At this point, the manipulator chucks of the second manipulator 1013 holding SD1 and SD2 are extended to place completely tested SD1 and SD2 in the output queue 1015, at the same time that the manipulator chucks of the first manipulator 1004 holding SD3 and SD4 place SD3 and SD4 into contact with DFT test sockets 1012 and 1011, respectively. See FIG. 10N.

After placing SD1 and SD2 into the output queue 1015 and placing SD3 and SD4 into contact with DFT test sockets 1012 and 1011, respectively, the corresponding empty manipulator chucks are retracted. The first manipulator 1006 moves to the left to the input queue 1014, where it is positioned at a location where the right two manipulator chucks of the first manipulator 1006 are located directly above untested SD5 and SD6, while the second manipulator 1013 moves to the left to a position where the left two manipulator chucks of the second manipulator 1013 are located directly above SD3 and SD4. See FIG. 10O.

While the manipulator chucks of the second manipulator 1013 remain retracted, the manipulator chucks of the first manipulator 1006 located directly above SD5 and SD6 are extended and engage SD5 and SD6. See FIG. 10P. The manipulator chucks of the first manipulator 1006 holding SD5 and SD6 are then retracted. While the second manipulator 1013 remains stationary, the first manipulator 1006 moves to the right to a position where the manipulator chuck holding SD5 is located directly above BS test socket 1008. See FIG. 10Q.

At this point, the manipulator chuck of the first manipulator 1006 holding SD5 extends to place SD5 into contact with BS test socket 1008, while the manipulator chucks of the second manipulator 1013 holding SD3 and SD4 extend to place SD3 and SD4 into contact with DFT test sockets 1012 and 1011, respectively. See FIG. 10R. Having completed the first pass of the testing loop, the test cells then begins the second pass of the test loop in the same sequence as the first pass.

Another configuration for PCT testing relates to a semiconductor wafer. This configuration utilizes a parallel concurrent prober having a single prober and single tester. For illustration purposes, a single pin for each semiconductor device is illustrated instead of a plurality of pins. An exemplary, non-limiting illustration of a semiconductor wafer 1100 subject to PCT testing is illustrated in FIG. 11. In FIG. 11, semiconductor wafer 1100 includes 32 untested die 1108. The probe card 1101 includes four probe sites 1102. One probe sited is a broadside (BS) probe site and three probe sites 1104, 1105, and 1106 are DFT multiplexed probe sites. The DFT probe sites 1104, 1105, and 1106 are connected to a DFT DPTT relay 107 for selecting two of the three DFT probe sites at a time. In FIG. 11, die 1109 is identified as the first die to be tested. Dies 1110 through 1116 are the other dies located in the same row as die 1109 that represent the next set of dies to be tested. The entire set of untested dies are identified as 1108 on the semiconductor wafer 1100.

FIG. 11A illustrates the relative movement of the probe sites across the semiconductor wafer 1100. The movement is relative in that the probe card 1101 is stationary and does not move. Instead the semiconductor wafer 1100 is moved to cause the relative movement between the probe card 1101 and the semiconductor wafer 1100. The relative movement causes the probe sites to move from left to right starting at die 1109 in the top row of untested dies. At the end of the top row of dies, the relative movement causes the probe sites to move to the beginning of the second row and once again move from left to right along the dies on the semiconductor wafer. An alternative configuration would be a configuration where the probe card 1101 is stationary and the semiconductor wafer 1100 moves to place the untested dies 1108 in the proper positions for testing.

Figure 11B:
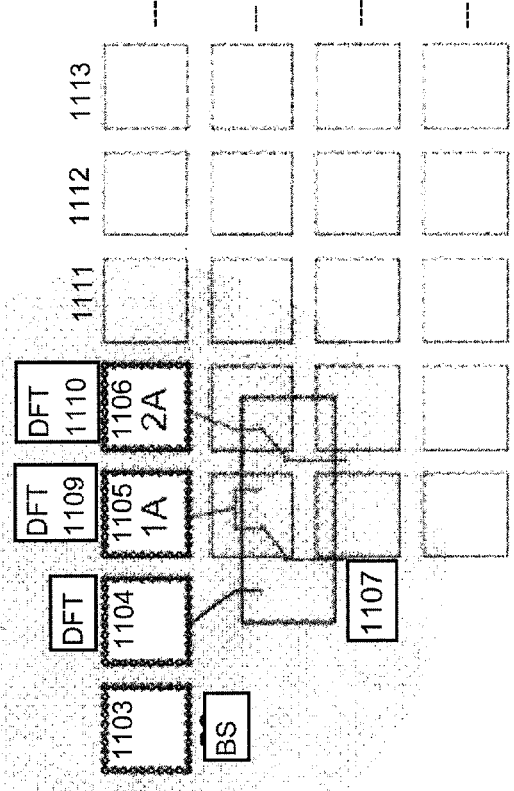
Figure 11D:
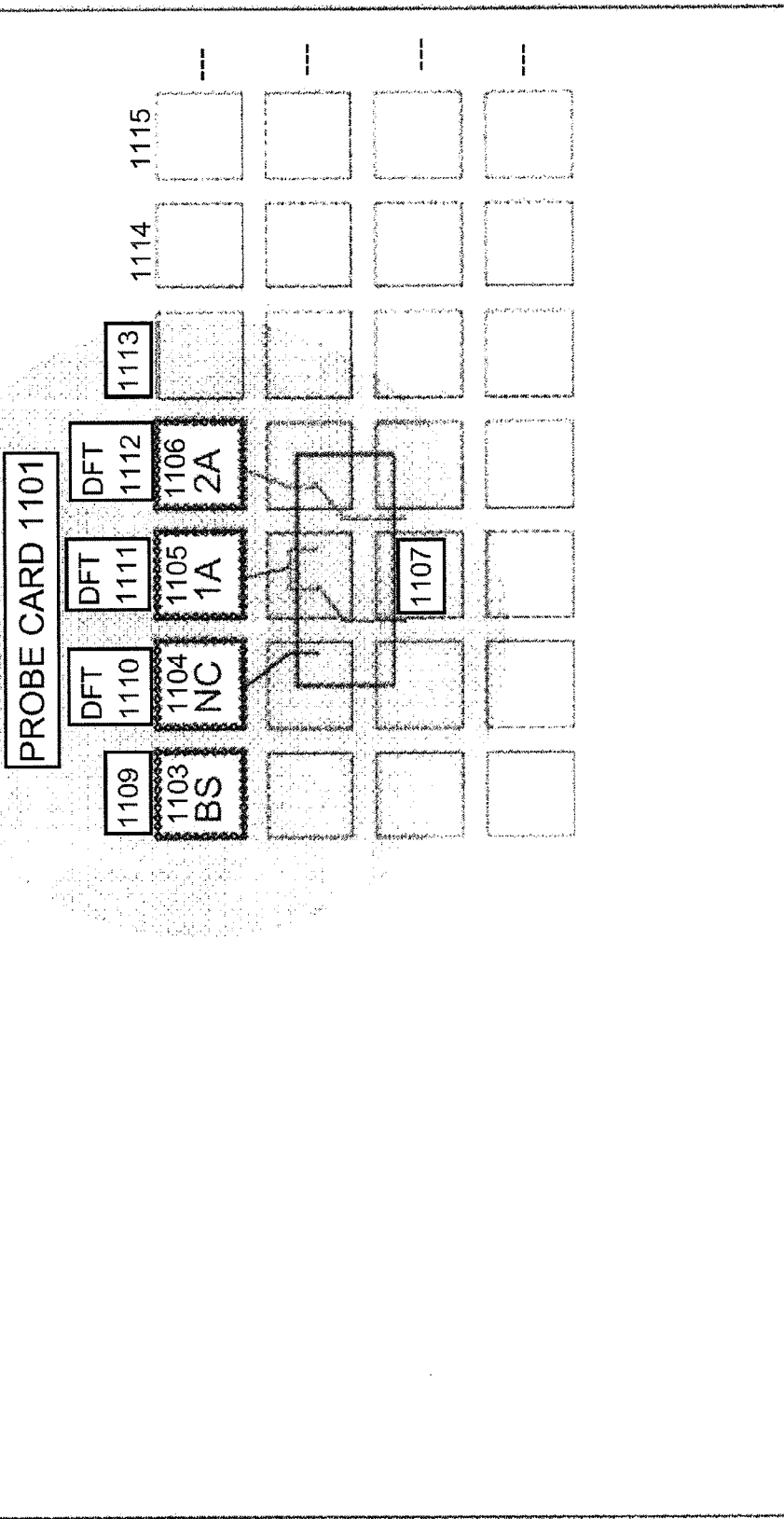
Figure 11F:
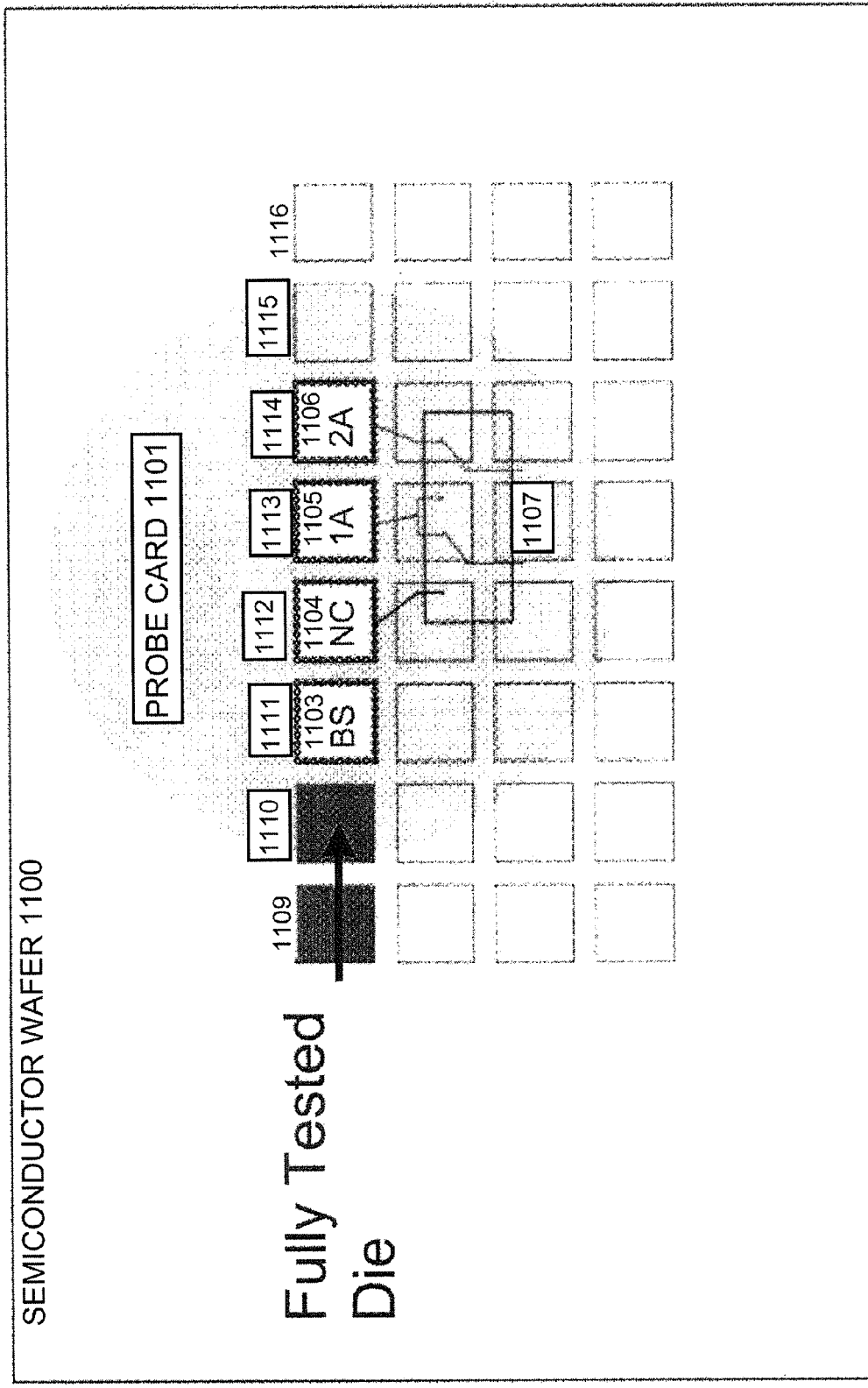
Figure 11G:
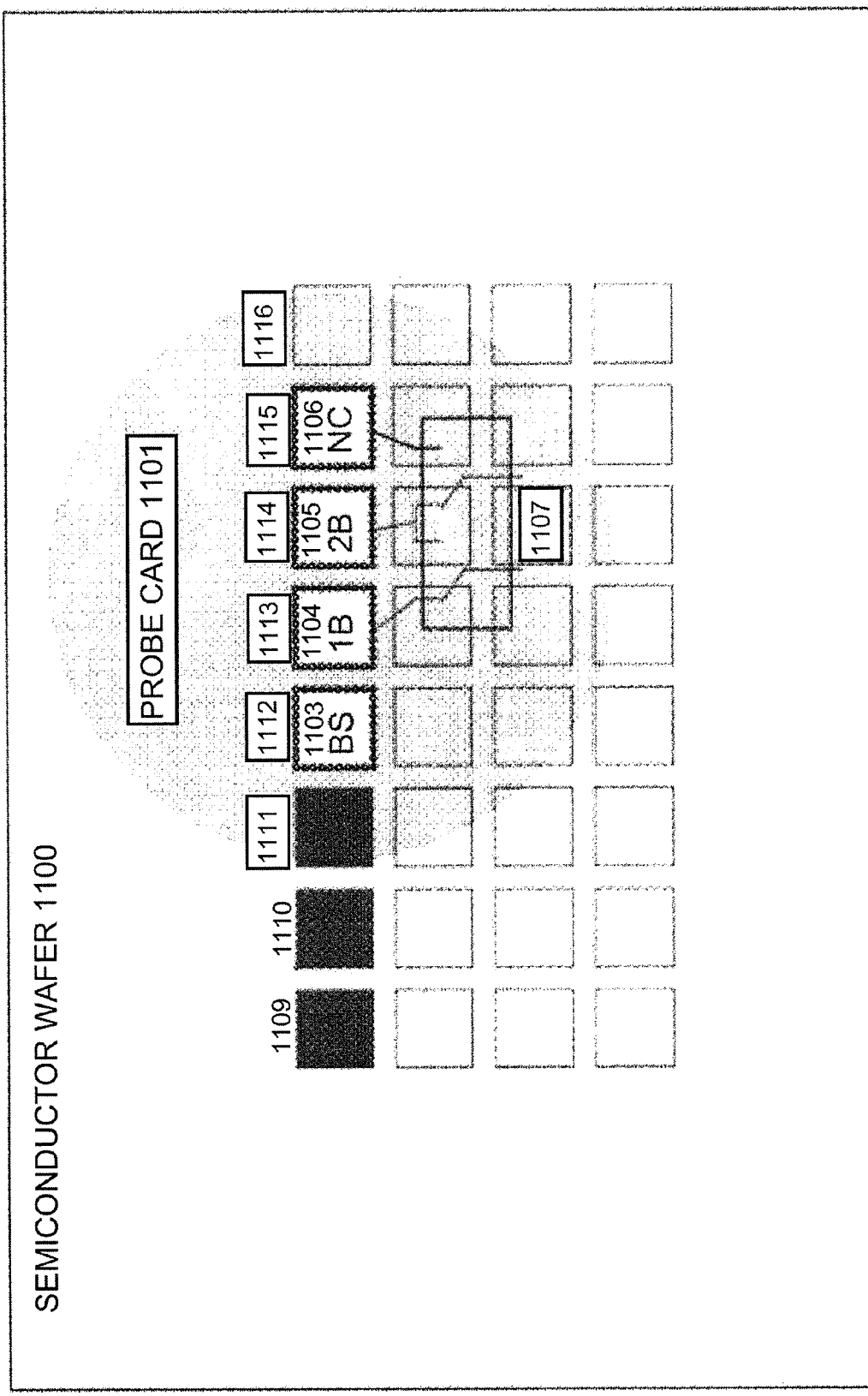

An exemplary illustration of the PCT testing stepping pattern operational flow using the probe card 1101 is illustrated in FIG. 11A through FIG. 11G. FIG. 11B illustrates the relative of the probe card 1101 so that DFT probe sites 1105 and 1106 are positioned over dies 1109 and 1110, respectively. In this position, the probe performs a partial DFT test 1A and 2A using DFT probe sites 1105 and 1106 on dies 1109 and 1110, respectively. After completion of the partial DFT test of dies 1109 and 1110, the probe card 1101 is relatively moved and the DFT relay 1107 switches so that DFT probe sites 1104 and 1105 continue the DFT tests 1B and 2B of dies 1109 and 1110, respectively. See FIG. 11C.

After completion of the DFT testing of dies 1109 and 1110, the probe card 1101 is relatively positioned and the DFT relay 1107 switched so that BS probe site 1103 performs BS testing of die 1109, probe sites 1105 and 1106 perform DFT testing 1A and 1B on dies 1111 and 1112, respectively. See FIG. 11D. During this time, die 1110 has no contact (NC) with the probe card 1101.

After completion of this portion of the testing die 1109 is completely tested. The probe card 1101 is again relatively positioned and the DFT relay 1107 switched such that BS probe site 1103 performs BS testing on die 1110, while DFT probe sites 1104 and 1105 perform DFT testing 1B and 2B on dies 1111 and 1112, respectively. See FIG. 11E. During this portion of the testing, probe card 1101 has no contact with die 1113.

After completion of this portion of the testing, dies 1109 and 1110 are completely tested. The probe card is again relatively positioned and the DFT relay 1107 switched such that BS probe site 1103 performs BS testing on die 1111, while DFT probe sites 1105 and 1106 perform DFT testing 1A and 2A on 1113 and 1114, respectively. See FIG. 11F. During this portion of testing, probe card 1101 has no contact with die 1112.

After completion of this portion of testing, dies 1109, 1110, and 1111 are completely tested. The probe card is again relatively positioned and the DFT relay 1107 switched such that BS probe site 1103 performs BS testing on die 1112, while DFT probe sites 1104 and 1105 perform DFT testing on die 1113 and 1114, respectively. See FIG. 11G. During this portion of testing, probe card 1101 has no contact with die 1115. This testing continues in the sequence and manner discussed above until all of the dies 1108 are completely tested, or until the tested is interrupted by operator intervention.

Figure 12:
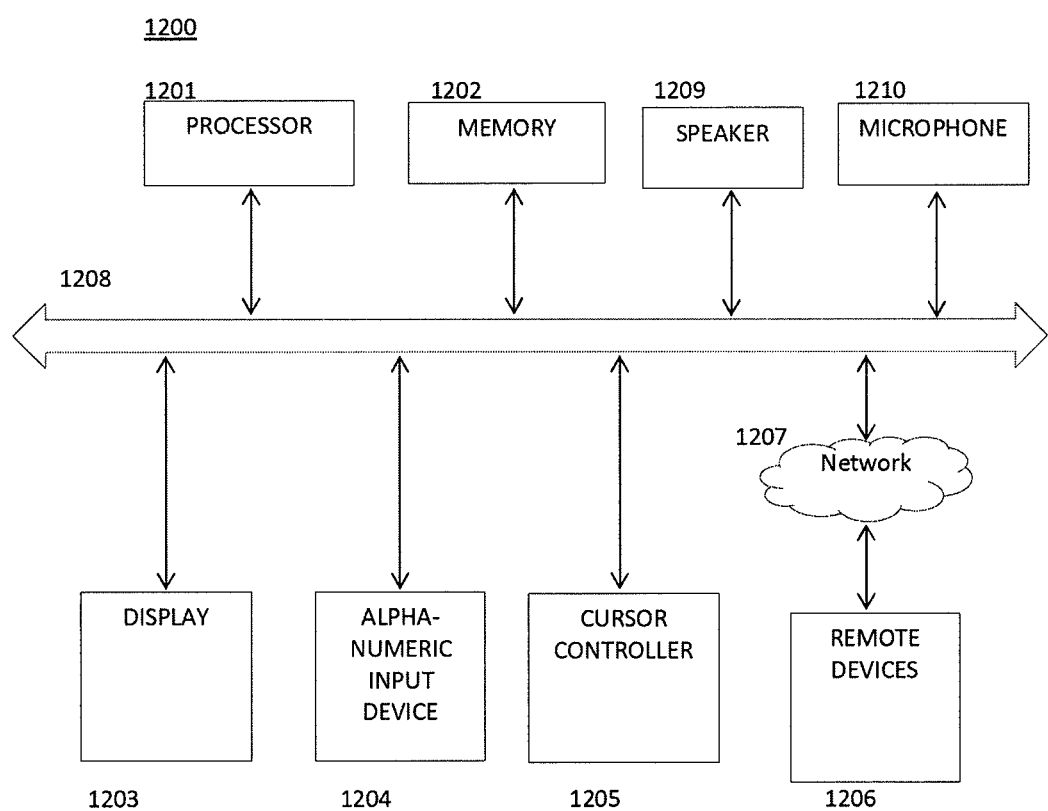
FIG. 12 illustrates an example of a computer system that may be utilized in implementing the herein described semiconductor testing.

FIG. 12 illustrates an example of a computer 1200 on which the processes described above may be implemented. The computer 1200 includes one or more sets of computer programming instructions that are stored in memory 1202 and that can be executed by processor 1201 in computer 1200 to perform the process described above. Computer 1200, which when properly programmed with specific testing software, becomes a special purpose computer that is configured for a specialized set of testing operations and functions.

The computer 1200 may be present in one of many physical configurations, including being configured as a server or as a client terminal. The computer 1200 may also be included in various devices, such as a desk-top computer, a laptop computer, a personal digital assistant, a mobile device, an electronic tablet, a smart phone, etc.

As illustrated in FIG. 12, the computer 1200 includes a processor 1201 and memory 1202, which is representative of one or more various memories that may be used by the computer 1200. These memories may include one or more random access memories, read only memories, and programmable read only memories, etc. Computer 1200 also includes at least one display 1203, which may be provided in any form, including a cathode ray tube, a LED display, an LCD display, and a plasma display, etc. The display may include provisions for data entry, such as by a touch-sensitive screen. Additional output devices may include an audio output device, such as a speaker 1209.

Computer 1200 further includes one or more input devices. Input devices may include one or more of an alpha-numeric input device 1204, such as a keyboard; a cursor controller 1205, such as a mouse, touch-pad, or joy-stick; and a microphone 1210. Computer 1200 also enables processor 1201 to communicate with one or more remote devices 1206 over a network 1207 external to computer 1200. Communications internal to computer 1200 primarily uses bus 1208.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed; rather the invention extends to all functionally equivalent structures, methods, and uses such as are within the scope of the appended claims.

While the non-transitory computer-readable medium may be shown to be a single medium, the term "computer-readable medium" includes a single medium or multiple media, such as a centralized or distributed database, and/or associated caches and servers that store one or more sets of instructions. The term "non-transitory computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. Accordingly, the disclosure is considered to include any computer-readable medium or other equivalents and successor media, in which data or instructions may be stored.

Although the present specification describes components and functions that may be implemented in particular embodiments with reference to particular standards and protocols, the disclosure is not limited to such standards and protocols. For example, standards for Internet and other packet switched network transmission represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A parallel concurrent test system for testing semiconductor devices, comprising:
    a pick and place (PnP) handler that engages and transports the semiconductor devices along a testing plane, the PnP handler including at least one manipulator that moves along a track located parallel to the testing plane, the manipulator having a plurality of manipulator chucks for selectively picking up, holding, and dropping off designated semiconductor devices at specified locations on the testing plane;
    a device under test interface board (DIB), the DIB including a broadside test socket for broadside (BS) testing of the semiconductor devices, the broadside testing using at least half of a total number of semiconductor device pins, and a plurality of design-for-test (DFT) test sockets for DFT testing, the DFT testing using less than half of the total number of the semiconductor device pins; and
    a tester in electrical contact with the DIB for testing the semiconductor devices in accordance with a stepping pattern test protocol,
    wherein the stepping pattern test protocol selectively permits parallel concurrent testing using the broadside test socket and only one to the plurality of DFT test sockets, and also selectively permits parallel concurrent testing using the broadside test socket and more than one of the plurality of DFT test sockets, and
    wherein each semiconductor device is subjected to broadside testing after being placed in the broadside test socket and to DFT testing after being placed in at least one of the plurality of DFT test sockets.

2. The parallel concurrent test system according to claim 1,
    wherein the stepping pattern test protocol selectively causes the tester to execute parallel concurrent broadside testing of a semiconductor device placed into the broadside test socket and DFT testing of a semiconductor device placed into one of the plurality of DFT test sockets.

3. The parallel concurrent test system according to claim 1,
    wherein the stepping pattern test protocol selectively causes the tester to execute parallel concurrent broadside testing of a semiconductor device placed into the broadside test socket and DFT testing of a semiconductor device placed into at least one of the plurality of DFT test sockets and of a semiconductor device placed into another one of the plurality of DFT test sockets.

4. The parallel concurrent test system according to claim 3,
    wherein the stepping pattern test protocol selectively causes the tester to execute the DFT testing in at least two different DFT tests, with the tester executing a first DFT test on a designated semiconductor device when a designated semiconductor device is placed into one of the plurality of DFT test sockets and performing a second DFT test on the designated semiconductor device when the designated semiconductor device is placed into another one of the plurality of DFT test sockets.

5. The parallel concurrent test system according to claim 4,
    wherein the PnP handler is configured as a Standard Test Data (STD) handler with a single manipulator.

6. The parallel concurrent test system according to claim 5,
    wherein device under test interface board (DIB) comprises the broadside test socket and three DFT test sockets.

7. The parallel concurrent test system according to claim 6, further comprising:

a switch located between the tester and the DIB,
wherein the tester controls the switch such that only two of the three DFT test sockets are in electrical contact with the tester at any time during execution of the stepping pattern test protocol.

8. The parallel concurrent test system according to claim 5,
wherein the STD handler manipulator picks up untested semiconductor devices at a designated first location on the testing plane, transports the untested semiconductor devices to the DIB for testing by the tester, and drops off semiconductor devices that have completed the parallel concurrent broadside testing and DFT testing at a designated second location on the testing plane.

9. The parallel concurrent test system according to claim 4,
wherein the PnP handler is configured as a Dual Manipulator (DM) handler having two manipulators with the tester enabled to operate the two manipulators asynchronously.

10. The parallel concurrent test system according to claim 9,
wherein device under test interface board (DIB) comprises the broadside test socket and two DFT test sockets.

11. The parallel concurrent test system according to claim 10,
wherein a first DM handler manipulator picks up untested semiconductor devices at a designated first location on the testing plane and transports the untested semiconductor devices to the DIB for testing by the tester, and a second DM handler manipulator transports the semiconductor devices that have completed the parallel concurrent broadside testing and DFT testing to a designated second location on the testing plane where they are dropped off.

12. The parallel concurrent test system according to claim 9, further comprising:
a test management control system that tracks a location and testing status for each semiconductor device moving through the parallel concurrent test system, correlates all of the broadside testing results and DFT testing results for each semiconductor device, and stores composite test results in a composite test results database.

13. The parallel concurrent test system according to claim 12,
wherein the stored composite test results database is accessible locally at a location of the parallel concurrent test system, and is accessible remotely through a network from a location other than the location of the parallel concurrent test system.

14. A method of conducting parallel concurrent testing on semiconductor devices using a test cell that includes a handler, a device under test interface board (DIB), and a tester, the method comprising:
picking up an untested semiconductor device at a designated pick-up location by a manipulator of the handler;
transporting the untested semiconductor device along a test plane to the DIB;
performing, by the tester, concurrent parallel testing of the untested semiconductor device and at least one other semiconductor device based on a stepping pattern test protocol, the concurrent parallel testing including broadside testing using at least half of a total number of semiconductor device pins of the untested semiconductor device, and design-for-test (DFT) testing of the at least one other semiconductor device using less than half of a total number of semiconductor pins of the at least one other semiconductor device; and
transporting a semiconductor device that has completed both broadside testing and DFT testing to a designated drop-off location along the test plane.

15. The method of conducting parallel concurrent testing on semiconductor devices according to claim 14,
wherein the performing of concurrent parallel testing includes the broadside testing of the untested semiconductor device, a first partial DFT testing of a first other semiconductor device, and a second partial DFT testing of a second other semiconductor device, the first partial DFT testing and the second partial DFT testing comprising different tests.

16. The method of conducting parallel concurrent testing on semiconductor devices according to claim 15,
wherein the performing of concurrent parallel testing includes performing all of the broadside testing using a single broadside test socket provided on the DIB, and performing the first partial DFT testing and the second partial DFT testing using only two of three DFT test sockets provided on the DIB at any time during the concurrent parallel testing.

17. The method of conducting parallel concurrent testing on semiconductor devices according to claim 15,
wherein the performing of concurrent parallel testing includes performing all of the broadside testing using a single broadside test socket provided on the DIB, and performing the first partial DFT testing and the second partial DFT testing using both of only two DFT test sockets provided on the DIB at any time during the concurrent parallel testing.

18. A method of conducting parallel concurrent testing of semiconductor dies located on a semiconductor wafer using a stationary probe card, the method comprising:
positioning the semiconductor wafer relative to the stationary probe card, such that a first die is in contact with a broadside probe site provided on the probe card, a second die is in contact with one of three design-for-test (DFT) probe sites provided on the probe card, and a third die is in contact with another one of the three DFT probe sites provided on the probe card;
switching a switch on the probe card so that a semiconductor tester is connected to two of the three DFT probe sites that are in contact with the second die and the third die;
performing concurrent parallel testing of the first die, the second die, and the third die in accordance with a stepping pattern protocol being executed by a tester, the concurrent parallel testing including performing broadside testing on the first die, the broadside testing using at least half of a total number of first die pins, performing a first DFT testing on the second die, and performing a second DFT testing on the third die, each of the first DFT testing and the second DFT testing using less than half of a total number of semiconductor pins of the second die and the third die; and
repositioning the semiconductor wafer relative to the stationary probe card upon completion of the concurrent parallel testing.

19. The method of conducting parallel concurrent testing according to claim 18,
wherein the first DFT testing and the second DFT testing comprise different tests.

20. The method of conducting parallel concurrent testing according to claim 19, further comprising:

testing of all the semiconductor dies located on a semiconductor wafer by the probe card in a predetermined order until all of the semiconductor dies located on the semiconductor wafer have been subjected to the broadside testing, the first DFT testing, and the second DFT testing.

* * * * *